United States Patent [19]
Taniguchi et al.

[11] Patent Number: 6,078,380
[45] Date of Patent: Jun. 20, 2000

[54] PROJECTION EXPOSURE APPARATUS AND METHOD INVOLVING VARIATION AND CORRECTION OF LIGHT INTENSITY DISTRIBUTIONS, DETECTION AND CONTROL OF IMAGING CHARACTERISTICS, AND CONTROL OF EXPOSURE

[75] Inventors: Tetsuo Taniguchi, Yokohama; Nobutaka Magome; Naomasa Shiraishi, both of Kawasaki, all of Japan

[73] Assignee: Nikon Corporation, Tokyo, Japan

[21] Appl. No.: 09/338,535

[22] Filed: Jun. 23, 1999

Related U.S. Application Data

[63] Continuation of application No. 08/872,385, Jun. 10, 1997, abandoned, which is a continuation of application No. 08/418,125, Apr. 6, 1995, abandoned, which is a continuation of application No. 08/207,723, Mar. 9, 1994, abandoned, which is a continuation-in-part of application No. 08/086,913, Jul. 7, 1993, abandoned, which is a continuation-in-part of application No. 07/956,908, Oct. 5, 1992, abandoned.

[30] Foreign Application Priority Data

| Oct. 8, 1991 | [JP] | Japan | 3-260766 |
| Oct. 8, 1991 | [JP] | Japan | 3-260767 |
| Dec. 19, 1991 | [JP] | Japan | 3-354682 |
| Feb. 14, 1992 | [JP] | Japan | 4-27107 |
| Mar. 4, 1992 | [JP] | Japan | 4-46905 |
| Jul. 7, 1992 | [JP] | Japan | 4-203075 |
| Mar. 11, 1993 | [JP] | Japan | 5-050842 |

[51] Int. Cl.$^7$ .................................................. G03B 27/68
[52] U.S. Cl. .......................... 355/52; 355/53; 356/400
[58] Field of Search .................. 355/52, 53, 67, 355/71; 353/97, 101; 356/400, 401

[56] References Cited

U.S. PATENT DOCUMENTS

| 4,558,949 | 12/1985 | Uehara et al. | 356/152 |
| 4,629,313 | 12/1986 | Tanimoto | 355/53 |
| 4,650,983 | 3/1987 | Suwa | 250/204 |
| 4,666,273 | 5/1987 | Shimizu et al. | 353/101 |
| 4,770,531 | 9/1988 | Tanaka | 356/358 |
| 4,780,747 | 10/1988 | Suzuki et al. | 355/53 X |
| 4,780,913 | 11/1988 | Williams | 4/217 |
| 4,801,977 | 1/1989 | Ishizaka et al. | 355/30 |
| 4,853,745 | 8/1989 | Kamiya et al. | 355/43 |
| 4,871,237 | 10/1989 | Anzai et al. | 350/419 |
| 4,931,830 | 6/1990 | Suwa et al. | 355/71 |
| 4,947,030 | 8/1990 | Takahashi | 350/469 X |
| 4,988,188 | 1/1991 | Ohta | 353/122 |
| 5,016,149 | 5/1991 | Tanaka et al. | 362/259 |
| 5,105,075 | 4/1992 | Ohta et al. | 355/53 X |
| 5,117,255 | 5/1992 | Shiraishi et al. | 355/53 |
| 5,160,962 | 11/1992 | Miura et al. | 355/53 |

(List continued on next page.)

FOREIGN PATENT DOCUMENTS

| 62-50811 | 4/1982 | Japan . |
| 2-234411 | 9/1990 | Japan . |
| WO 92/03842 | 3/1992 | WIPO . |

Primary Examiner—Fred L Braun
Attorney, Agent, or Firm—Vorys, Sater, Seymour and Pease LLP

[57] ABSTRACT

In a projection exposure apparatus and method, the intensity distribution of illumination light for detecting an imaging characteristic of a projection optical system is set substantially equal to the intensity distribution of exposure illumination light. The intensity distribution of a secondary light source in an exposure illumination optical system is changed in accordance with a pattern of a mask. Magnification and aberration of the projection optical system are adjusted in accordance with the changed intensity distribution of the secondary light source. A substrate stage is moved along an optical axis of the projection optical system to compensate movement of the image plane of the projection optical system caused by a change in the intensity distribution of the secondary light source. An exposure operation is interrupted when a light amount distribution is changed. Exposure control is also responsive to thermal accumulation in the projection optical system.

56 Claims, 32 Drawing Sheets

U.S. PATENT DOCUMENTS

| | | | |
|---|---|---|---|
| 5,243,377 | 9/1993 | Umatate et al. | 355/53 |
| 5,286,963 | 2/1994 | Torigoe | 250/201.2 |
| 5,300,967 | 4/1994 | Kamon | 353/97 |
| 5,300,971 | 4/1994 | Kudo | 355/53 X |
| 5,305,054 | 4/1994 | Suzuki et al. | 355/53 |
| 5,335,044 | 8/1994 | Shiraishi | 355/53 |
| 5,337,097 | 8/1994 | Suzuki et al. | 353/101 |
| 5,345,292 | 9/1994 | Shiozawa et al. | 355/67 |
| 5,363,172 | 11/1994 | Tokuda | 355/71 |
| 5,367,404 | 11/1994 | Hayata | 359/558 |
| 5,379,090 | 1/1995 | Shiraishi | 355/67 |

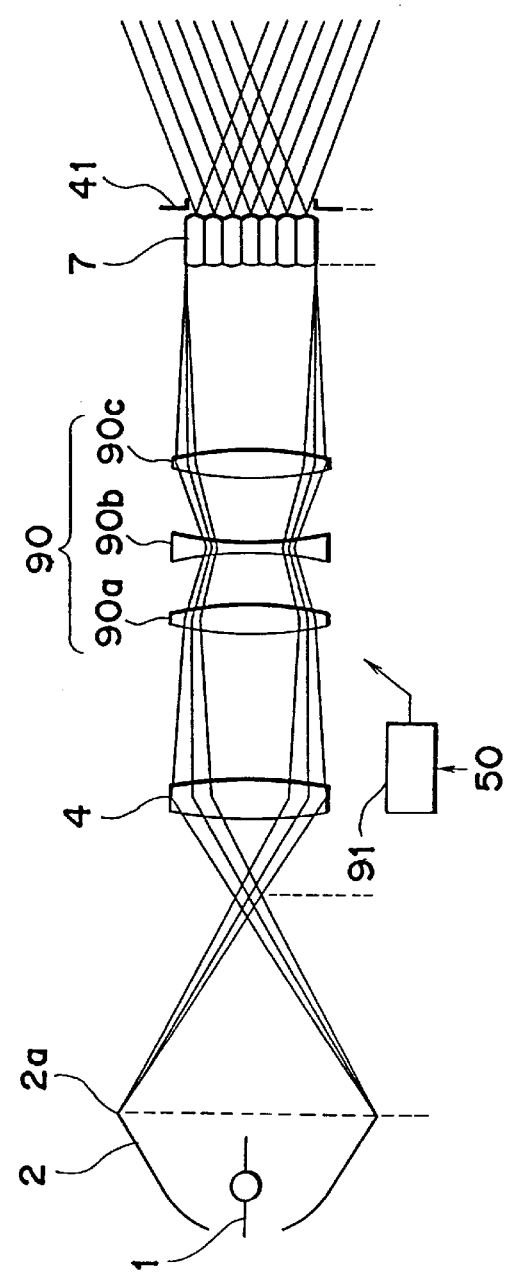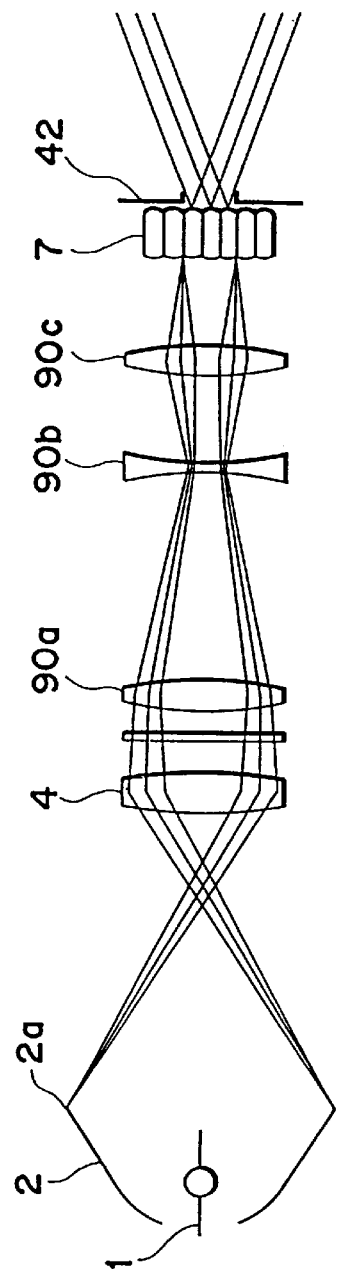
FIG. 7A
FIG. 7B

PROJECTION EXPOSURE APPARATUS AND METHOD INVOLVING VARIATION AND CORRECTION OF LIGHT INTENSITY DISTRIBUTIONS, DETECTION AND CONTROL OF IMAGING CHARACTERISTICS, AND CONTROL OF EXPOSURE

CROSS-REFERENCE TO RELATED APPLICATIONS:

This application is a continuation of application Ser. No. 08/872,385 filed Jun. 10, 1997, now abandoned, which is a continuation of application Ser. No. 08/418,125 filed Apr. 6, 1995, now abandoned, which is a continuation of application Ser. No. 08/207,723 filed Mar. 9, 1994, now abandoned, which is a continuation-in-part of application Ser. No. 08/086,913 filed Jul. 7, 1993, now abandoned, which is a continuation-in-part of application Ser. No. 07/956,908 filed Oct. 5, 1992, now abandoned.

BACKGROUND OF THE INVENTION

1. Field of the Invention

The present invention relates to projection exposure apparatus method, used in a lithographic process in the manufacture of semiconductor integrated circuits and liquid crystal devices and, more particularly, to maintenance and adjustment of imaging performance of a projection optical system.

2. Related Background Art

In a photolithographic process for forming circuit patterns as of semiconductor elements, there is employed a method of transferring a pattern formed on a reticle (mask) onto a substrate (e.g., a semiconductor wafer or glass plate). A photoresist having photosensitive properties is applied to the substrate, and a circuit pattern is transferred to the photoresist in accordance with an irradiating optical image, i.e., a pattern shape of a transparent portion of a reticle pattern. In a projection exposure apparatus (e.g., a stepper), a reticle pattern image is imaged and projected on the wafer through a projection optical system.

In an apparatus of this type, illumination light is limited to have an almost circular (rectangular) shape centered on the optical axis of the illumination optical system to illuminate the reticle on an illumination optical system plane (to be referred to as a pupil plane of an illumination optical system hereinafter) serving as a Fourier transform plane for a surface on which a reticle pattern is present or a plane near the pupil plane of the illumination optical system (this illumination scheme is called normal illumination hereinafter). For this reason, the illumination light is incident on the reticle at almost a right angle. A circuit pattern having a transparent portion (i.e., the naked surface of the substrate) having a transmittance of 100% for the illumination light and a light-shielding portion (chromium or the like) having a transmittance of almost 0% is formed on a reticle (i.e., a glass substrate as of quartz) used in this apparatus.

The illumination light radiated on the reticle, as described above, is diffracted by the reticle pattern, and 0-th-order and ±1st-order diffracted light components emerge from the pattern. These diffracted light components are focused by the projection optical system to form interference fringes, i.e., reticle pattern images on the wafer. An angle defined by the 0-th-order diffracted light component and each of the ±1st-order diffracted light components is defined as $\sin\theta = \lambda/P$ where $\lambda$ is the wavelength ($\mu$m) of the exposure light, and NA is the numerical aperture of the projection optical system on the reticle side.

When a pattern pitch is decreased, the $\sin\theta$ value is increased. When the $\sin\theta$ value is larger than the numerical aperture NA of the projection optical system on the reticle side, the ±1st-order diffracted light components are limited by the effective diameter of the projection optical system plane (to be referred to as a pupil plane of the projection optical system hereinafter) serving as the Fourier transform plane of the reticle pattern and cannot pass through the projection optical system. That is, only the 0-th-order diffracted light component can reach the wafer, and the interference fringes (pattern image) are not formed. In the conventional exposure method described above, when the reticle having only the transparent and light-shielding portions (to be referred to as a normal reticle hereinafter) is used, the degree of micropatterning of the reticle pattern (minimum pattern pitch) P which can be resolved on the wafer is given as $P \approx \lambda/NA$ since $\sin\theta = NA$. The minimum pattern size is ½ the pitch P, and the minimum pattern size is given as about $0.5 \times \lambda/NA$. In a practical photolithographic process, however, a given depth of focus is required due to warping of the wafer, influences of steps on the wafer during the process, and the thickness of the photoresist itself. For these reasons, the practical minimum resolution pattern size is represented as $k \times \lambda/NA$ where k is the process coefficient which generally falls within the range of about 0.6 to 0.8.

In order to expose and transfer a fine pattern in accordance with the conventional exposure method, an exposure light source which emits light having a shorter wavelength or a projection optical system having a larger numerical aperture must be used.

However, it is difficult to arrange an exposure light source which emits light having a shorter wavelength (e.g., 200 nm or less) than that of the existing exposure light source at present because an optical material suitably used as a light-transmitting optical member is not available and a stable light source capable of emitting a large amount of light is not available either. In addition, the numerical aperture of the state-of-the-art projection optical system is almost a theoretical limit, and the numerical aperture is assumed not to drastically increase. Even if the numerical aperture can be larger than that currently used, the depth of focus determined by $\pm\lambda/NA^2$ abruptly decreases with an increase in numerical aperture, and the depth of focus used in practice further decreases, resulting in inconvenience.

There is also proposed a phase shifting reticle having a phase shifter (e.g., a dielectric thin film) for shifting light transmitted through a specific one of transparent portions of the reticle circuit patterns from light transmitted through another transparent portion by $\pi$ (rad). A phase shifting reticle is disclosed in Japanese Patent Publication No. 62-50811. When this phase shifting reticle is used, a finer pattern can be transferred as compared with use of the normal reticle. That is, a resolving power can be increased. In order to use this phase shifting reticle, the numerical aperture (coherence factor σ) of the illumination optical system must be optimized. Various schemes are proposed for the phase shifting reticle, and typical examples are a spatial frequency modulation scheme, a shifter light-shielding scheme, and an edge emphasis scheme.

In recent years, various attempts have been made to allow transfer of micropatterns in accordance with optimization of illumination conditions (LIT CONDI) or implementations of an exposure method. As described in U.S. Pat. No. 4,931, 830, there is provided a method of increasing the resolving power and the depth of focus for patterns having specific line widths, in such a manner that a combination of an optimal numerical aperture (value σ) of the illumination optical system and an optimal numerical aperture (N.A.) of the projection optical system is selected every pattern line width. In addition, an annular illumination method is also proposed in which a light amount distribution of illumination light on or near the pupil plane of the illumination optical system is defined to have an annular shape, and a reticle pattern is irradiated with the annular illumination light. There is also proposed an oblique illumination method in which the light amount distribution of the illumination light on or near the pupil plane of the illumination optical system is set to have maximal values at a plurality of positions eccentric from the optical axis of the illumination optical system, and illumination light is inclined at a predetermined angle in correspondence with the periodicity of a reticle pattern and is incident on the reticle pattern from a specific direction, as described in PCT/JP91/01103 (Aug. 19, 1991) and Ser. No. 791,138 (Nov. 13, 1991). Any one of the methods described above is not effective for all reticle patterns, i.e., line widths and shapes of the patterns. Optimal illumination method and conditions must be selected every reticle or patterns thereof. The projection exposure apparatus must have a structure in which illumination conditions (e.g., the value a) in the illumination optical system must be set variable.

In the manufacture of semiconductor integrated circuits, although a high resolving power is required, a large depth of focus (focus margin) also serves as an important factor.

A method of increasing the depth of focus by giving a specific aberration (particularly, a spherical aberration) to a projection optical system without using the modified light source and the like described above is proposed in Japanese Laid-Open Patent Application No. 2-234411. This method utilizes the thickness (about 1 μm) of a photosensitive material (photoresist) on the wafer. The depth of focus can be increased although the contrast level is slightly decreased.

In a recent projection exposure apparatus, imaging characteristics of the projection optical system are required to be constant with high precision. Various methods of adjusting the imaging characteristics are proposed and put into practice. Among them all, a method of correcting variations in imaging characteristics which are caused by exposure light absorption in the projection optical system is disclosed in U.S. Pat. No. 4,666,273. In this method, an energy amount (heat) accumulated in the projection optical system upon incidence of exposure light on the projection optical system is sequentially calculated, an amount of change in each imaging characteristic caused by the accumulated energy amount is obtained, and each imaging characteristic is finely adjusted by a predetermined correction mechanism. This correction mechanism can be arranged in accordance with, e.g., a scheme for sealing a space defined by two of a plurality of lens elements constituting the projection optical system and adjusting the pressure of the sealed space.

The imaging characteristics corrected as described above are a projection magnification, the focal position, the distortions, and the like. In a projection optical apparatus which requires high-precision control of imaging characteristics, other imaging characteristics such as the curvature of field, which characteristics are not conventionally corrected because the correction is difficult and variations in accumulated energy amount (thermal accumulation amount) are small, are also taken into consideration as correction targets. There is proposed a method in which the limit value (reference value) of the thermal accumulation amount is determined in advance so that variations in imaging characteristics (caused by exposure light absorption) corresponding to the thermal accumulation amounts of the projection optical system do not exceed predetermined amounts. According to this method, in sequential exposure of wafer with a reticle pattern in accordance with a step-and-repeat scheme, when an actual thermal accumulation amount of the projection optical system exceeds the reference value, the exposure operation is stopped, and the exposure operation is inhibited (kept stopped) until the actual thermal accumulation amount becomes below the reference value. More specifically, in the same manner as in the technique disclosed in the prior art described above, the thermal accumulation amount of energy accumulated in a projection optical system upon incidence of exposure light thereon is sequentially calculated, and the calculated thermal accumulation amount is compared with a predetermined reference value every shot in exposure or every exchange of the wafer to determine whether the exposure operation for the next shot is performed.

Since the method disclosed in U.S. Pat. No. 4,666,273 does not directly detect the imaging characteristics of the projection optical system, it is necessary to directly detect the imaging characteristics of the projection optical system by using a focal position detection system, the patent application of which is filed as Ser. No. 830,213 (Jan. 30, 1992). This focal position detection system will be described with reference to FIGS. 30 to 33.

Referring to FIG. 30, a reticle R on which circuit patterns are drawn is held in a reticle holder 14. The reticle R is illuminated at a uniform illuminance with exposure light such as bright lines from a mercury lamp or an excimer laser beam. A wafer W is held on a wafer holder 16 placed on a wafer stage WS. In a normal exposure transfer mode, the pattern on the reticle R is imaged on the wafer W through a projection optical system PL.

The wafer stage WS is constituted by an XY stage movable within a plane (to be referred to as an XY plane hereinafter) perpendicular to the optical axis of the projection optical system PL and a Z stage movable above the XY stage in the Z direction parallel to the optical axis of the projection optical system PL. The wafer holder 16 also serves as a θ stage which can be slightly rotated within the XY plane. Coordinates of each exposure point corresponding to the optical axis of the projection optical system PL are measured by a biaxial laser interferometer (not shown). Z coordinates of the wafer W on the exposure surface upon movement of the Z stage in the Z direction can also be measured by a measuring mechanism (not shown). When the wafer stage WS is moved within the plane perpendicular to the optical axis of the projection optical system PL, the pattern on the reticle R is exposed on the wafer W in accordance with the step-and-repeat scheme. When the wafer stage WS is also slightly moved in the axial direction of the projection optical system PL, the wafer W can be matched with the focal position of the projection optical system PL.

A focal position detection pattern plate (reference member) 15 is disposed on the wafer stage WS. An aperture pattern (multislit pattern) 15A constituted by light-shielding and transparent portions is formed on the upper surface of the pattern plate 15, as shown in FIG. 31A. This aperture pattern 15A is constituted such that four amplification type diffraction gratings each consisting of lines and spaces at a predetermined pitch are rotated through every 90°. The pattern plate 15 is fixed on the wafer stage WS such that the surface (i.e., the surface on which the aperture pattern 15A is formed) of the wafer stage WS is located at almost the same level as that of the exposure surface (upper surface) of the wafer W with respect to the Z direction (i.e., the axial direction of the projection optical system PL). A detection illumination optical system is arranged below the lower surface (i.e., inside the wafer stage WS) of the pattern plate 15.

In the detection illumination optical system, illumination light EL having a wavelength range which is the same as or close to that of exposure light for illuminating the reticle R is incident on one branch end 110a of a two-split fiber bundle 110. The illumination light EL is light obtained by splitting part of exposure light IL by means of a beam splitter or the like. The illumination light EL is guided from the branch end 110a to a merged end 110c and is supplied to the inside of the wafer stage WS. The illumination light EL illuminates the aperture pattern 15A of the pattern plate 15 upward through an output lens 111, a field stop 113, a relay lens 114, a mirror 115, and a condenser lens 116. The beam passing through the pattern plate 15 forms an image of the aperture pattern 15A of the pattern plate 15 on the lower surface (pattern surface) of the reticle R through the projection optical system PL. Light reflected by the pattern surface of the reticle R returns again to the inside of the wafer stage WS through the projection optical system PL and the pattern plate 15. The light is then incident on the merged end 110c of the fiber bundle 110 along a path opposite to the incident path. This reflected light emerges from the other branch lens 110b of the fiber bundle 110 and is incident on a photoelectric sensor PD. The photoelectric sensor PD outputs a focus signal FS, i.e., a photoelectric signal corresponding to the amount of beam reflected by the pattern surface of the reticle R and passing through the aperture pattern 15A of the pattern plate 15, to an autofocus controller (AFC) 35.

According to this scheme, when the focus signal FS output from the photoelectric sensor PD has a maximum magnitude, i.e., when the amount of light obtained by limiting the light reflected by the reticle R by means of the pattern plate 15, the corresponding Z coordinates are detected as a focal position. The principle of the maximum amount of light at the focal position will be described below with reference to FIGS. 32A to 32C. FIG. 32A shows an optical path diagram in which the aperture pattern formation surface of the pattern plate 15 is conjugate (imaging relationship) with the pattern surface of the reticle R with respect to the projection optical system PL, i.e., the upper surface of the pattern plate 15 is located at the focal position of the projection optical system PL. The beam passing through the transparent portion of the pattern plate 15 toward the projection optical system PL forms the focused image of the aperture pattern 15A on the lower pattern surface of the reticle R, and its reflected light also forms a focused image on the pattern plate 15. For this reason, the aperture pattern 15A of the pattern plate 15 and the refocused aperture pattern image are perfectly superposed on each other. The image of the aperture pattern (i.e., the imaging beam) directly passes through the pattern plate 15 and is finally incident on the photoelectric sensor PD.

On the other hand, FIG. 32B shows an optical path diagram in which the aperture pattern formation surface of the pattern plate 15 is not located at the focal position of the projection optical system PL. In this case, the light reflected by the lower surface of the reticle R cannot be entirely transmitted through the aperture pattern 15A of the pattern plate 15, so that part of the reflected light is reflected by the light-shielding portion (hatched portion) of the aperture pattern 15A. The amount of light incident on the photoelectric sensor PD is reduced. In practice, since an interference phenomenon between the rays occurs, the focus signal FS corresponding to the amount of light obtained by limiting the light reflected by the reticle R by means of the pattern plate 15 has a waveform shown in FIG. 31B. Referring to FIG. 31B, an autofocus signal AFS detected by an indirect focus position detection system (30 and 31) (to be described later) is plotted along the abscissa. This signal AFS corresponds to the Z coordinates of the wafer stage WS.

Referring to FIG. 30, a beam emitted from a light-emitting optical system 30 is incident obliquely on the pattern plate 15 with respect to the optical axis of the projection optical system PL. For example, a slit-like pattern is projected on the pattern plate 15. Light reflected by this pattern plate 15 is projected on the light-receiving element of a light-receiving optical system 31, and an image of the slit pattern formed on the pattern plate 15 is refocused on the light-receiving element of the light-receiving optical system 31. When the pattern plate 15 is moved in the Z direction parallel to the optical axis of the projection optical system PL, the slit pattern image on the light-receiving element of the light-receiving optical system 31 is also moved. The position of the aperture pattern formation surface (or the exposure surface of the wafer W) in the Z direction can be detected from the slit pattern position.

The light-receiving optical system 31 outputs the signal (to be referred to as an autofocus signal) AFS corresponding to the position of the slit pattern image. The autofocus signal AFS is supplied to the autofocus controller 35. The autofocus controller 35 also receives the focus signal FS of the direct scheme from the photoelectric sensor PD. The autofocus controller 35 performs offset adjustment of the autofocus signal AFS by using the focus signal FS of the direct scheme. A Z-axis drive signal ZS is supplied to a motor 17 so that the autofocus signal AFS is set at a predetermined level, thereby driving the Z stage of the wafer stage WS. A technique for performing calibration (offset adjustment) of a focusing mechanism of an indirect scheme using the detection result of the direct scheme is disclosed in U.S. Pat. No. 4,650,983.

A method of focusing the exposure surface of the wafer W with respect to the projection optical system PL by using the focal position detection system having the pattern plate 15 will be briefly described below. As described above, the distance between the wafer W and the projection optical system PL is adjusted by a wafer position detection system comprising the light-emitting optical system 30 and the light-receiving optical system 31 during exposure of the wafer W. For this reason, the focal position obtained in the focal position detection system including the pattern plate 15 upon movement of the pattern plate 15 to the central portion of the image field of the projection optical system PL is fed back to the wafer position detection system comprising the light-emitting optical system 30 and light-receiving optical system 31. Even if variations in focal position of the projection optical system PL may be caused by variations over time, the exposure surface of the wafer W can always be focused at the varied focal position. This feedback operation, i.e., the calibration operation of the wafer position detection system comprising the light-emitting optical system 30 and the light-receiving optical system 31 is performed every unit time, every wafer, or every several wafers.

The autofocus controller 35 for controlling the focusing operation moves the wafer stage WS along the direction of the optical axis of the projection optical system PL in accordance with the Z-axis drive signal ZS. At the same time, the autofocus controller 35 receives the autofocus signal AFS representing the position of the pattern plate 15 from the light-receiving optical system 31 and the focus signal FS from the photoelectric sensor PD. As a result, the waveform shown in FIG. 31B can be obtained. A value BS of the autofocus signal AFS at the peak position of the waveform represents the focal position of the projection optical system PL. Thereafter, the wafer W is focused so that the value of the autofocus signal AFS as an output from the light-receiving optical system 31 becomes the value BS. As described above, without arranging a special pattern in the reticle R, focal position detection of an arbitrary point and particularly the central point within the image field of the projection optical system PL can be accurately performed according to this technique. According to this conventional technique, however, the aberration (particularly, the spherical aberration) of the projection optical system is fixed during the manufacture or adjustment and cannot be easily changed later.

When the annular illumination, the modified light source, and the phase shifting reticle are applied to a projection optical system having a predetermined spherical aberration for normal illumination so as to increase the depth of focus, the predetermined spherical aberration adversely affects the projection exposure. More specifically, the depth of focus is reduced in accordance with the spherical aberration, and a change in focal position occurs due to a line width (pitch) in use of the annular illumination, the modified light source, and the phase shifting reticle. For this reason, the effective depth of focus is reduced as compared with the case wherein the predetermined spherical aberration is not provided.

Even if an optical system does not have the spherical aberration, distortion or the like may occur due to a change in illumination condition.

The position and shape of a beam within the pupil plane of the projection optical system through which the beam passes are variously changed in accordance with a change in illumination light shape and use of a phase shifting mask. If the numerical aperture of the projection optical system is defined as NA and the numerical aperture of the illumination system is defined as NAi, a σ value as one of the parameters of the illumination system is defined as σ=NAi/NA. This σ value is conventionally about 0.5. When a conventional illumination method (normal illumination) or a normal reticle is used, light components diffracted from the reticle are spread on the entire aperture (pupil plane) including the optical axis of the projection optical system within the pupil plane. To the contrary, the σ value is set to be, e.g., about 0.3 in the phase shifting reticle.

Since the beam corresponding to the optical axis is lost within the pupil plane in accordance with the principle of phase shifting, a beam passes through only part of the peripheral portion within the pupil plane of the projection optical system. In addition, even if annular illumination or oblique illumination is performed, a beam corresponding to the optical axis is lost within the pupil plane in the same manner as in the phase shifting mask, and a beam passes through only the region of the peripheral portion within the pupil plane.

As described above, when the σ value is changed or the state of the beam passing within the pupil plane is changed, a slight variation occurs in the focal position of the projection optical system by the small spherical aberration remaining in the projection optical system and the slight light absorption of the projection optical system.

When the illumination condition of the illumination optical system is changed or the phase shifting reticle is used as described above, the distribution of an amount of light transmitting through the interior of the projection optical system, and particularly a portion near the pupil (of the lens element) is changed. This change in light amount distribution greatly adversely affects variations in imaging characteristics caused by illumination light absorption of the projection optical system. That is, the change characteristics (e.g., a rate of change and a time constant) of the imaging characteristics are also changed. More specifically, even if the total sum (i.e., the thermal accumulation amount) of the energy amounts of the illumination light incident on the projection optical system is kept unchanged, the change characteristics of the imaging characteristics change depending on different illumination conditions. Even if a given reference value is used, aberration amounts may be different. For this reason, when exposure is to be performed by changing the illumination condition described above, the reference value for executing the exposure operation and inhibiting it is not a constant value, and the conventional method cannot be directly applied. The imaging characteristics are degraded depending on the illumination condition. The exposure operation is inhibited even if a detected aberration amount does not exceed the predetermined amount, thereby reducing productivity (throughput), resulting in inconvenience.

As disclosed in Ser. No. 464,621 (Jan. 3, 1990), calculation parameters used for calculating change amounts of the imaging characteristics of the projection optical system upon changes caused by illumination light absorption may be corrected for each illumination condition, and the changes in imaging characteristics caused by the change in illumination condition are accurately obtained to perform correction by using the corrected parameters.

There are, however, a very large number of combinations of arrangements of illumination optical systems, illumination conditions (i.e., a σ value, annular illumination, and a modified light source), types of reticles, and numerical apertures of projection optical systems. For this reason, preparation of operation parameters for all the combinations is very complicated and requires a long period of time. In particular, as for the types of reticles, when a reticle pattern such as a degree of micropatterning (e.g., a pitch and a line width) and a periodic direction slightly changes, emergence of diffracted light from the pattern varies. For this reason, it is very difficult (practically impossible) to prepare operation parameters corresponding to the illumination conditions for all the types of reticles.

When the imaging characteristics are corrected as described above, no problem is posed on a long-term basis. However, the thermal accumulation phenomenon of the projection optical system has a past history or hysteresis. When the illumination condition is changed in correspondence with the reticle and its pattern, and calculation and correction of amounts of changes in imaging characteristics are immediately started using the corrected calculation parameters under the updated illumination condition, the imaging characteristics cannot be properly corrected while the history corresponding to the previous illumination condition is left in the projection optical system. More specifically, upon the change in illumination condition, a lens element near the pupil plane of the projection optical system is set in a state wherein the thermal distribution state of the previous illumination condition is mixed with that of the updated illumination condition, and the current state cannot be specified as one of the above states. Therefore, even if the amounts of changes in imaging characteristics are calculated in accordance with the calculation parameters under either illumination condition, the calculation result does not match with the actual amounts of changes in imaging characteristics. The imaging characteristics in this transient state (i.e., the thermal profile state of the projection optical system) cannot be simply expressed as the sum of these states. It is therefore very difficult to accurately calculate and correct the amounts of changes in imaging characteristics in the transient state. Therefore, even if pattern exposure on the wafer in this transient state is performed, a circuit pattern which satisfies the prescribed characteristics cannot be obtained.

In the apparatus shown in FIG. 30, since a new illumination system which is not an exposure illumination system is used to perform focal position detection using the pattern plate 15, the characteristics of these illumination systems do not coincide with each other, strictly speaking. When the characteristics of these two illumination systems do not coincide with each other, the focal position of the projection optical system PL, which is detected using the exposure light IL, may be offset from the focal position of the projection optical system PL, which is detected using the illumination light EL.

Values representing the characteristics of the illumination system are generally the numerical aperture NA of the projection optical system and the σ value representing the coherency of the illumination light. The numerical aperture and the σ value will be described with reference to FIG. 33. Referring to FIG. 33, since an aperture stop 32 is arranged at a pupil plane Ep of the projection optical system PL, i.e., the Fourier transform plane, a maximum angle $\theta_R$ at which a beam can pass through the projection optical system PL from the reticle R and a maximum angle $\theta_W$ of a beam incident from the projection optical system PL to the pattern plate 15 are limited to predetermined values. The numerical aperture $NA_{PL}$ of the projection optical system PL is $\sin\theta_W$. When a projection magnification is defined as 1/m, equation $\sin\theta_R = \sin\theta_W/m$ is established.

A value $\sigma_{IL}$ as the σ value on the exposure light IL side and $\sigma_{EL}$ as the σ value on the illumination exposure light EL side are defined as follows:

$$\sigma_{IL} = \sin\theta_{IL} / \sin\theta_R$$
$$= m \cdot \sin\theta_{IL} / \sin\theta_W$$
$$\sigma_{EL} = \sin\theta_{EL} / \sin\theta_W$$
$$= \sigma_{IL} \cdot \sin\theta_{EL} / (m \cdot \sin\theta_{IL})$$

where $\theta_{IL}$ is the maximum incident angle of the exposure light IL incident on the reticle R, and $\theta_{EL}$ is the maximum incident angle of the illumination light EL for focal position detection, which is incident from the lower surface of the pattern plate 15.

In general, when the numerical aperture NA is increased, the resolving power is increased, but the depth of focus is decreased. On the other hand, when the σ value is decreased, the coherency of the exposure light IL or the illumination light EL is improved. For this reason, when the σ value is decreased, the edge of a pattern is emphasized. When the σ value is large, the edge of the pattern is blurred, but the resolving power for a finer pattern can be increased. Therefore, the imaging characteristics of the pattern are determined by almost the numerical aperture NA and the σ value. When the σ value is changed, the illuminance distribution of the pupil plane Ep of the projection optical system PL is changed.

Referring back to FIG. 30, when the illumination beam of the exposure light for the reticle R is IL1, assume that $\sigma_{EL}$ as the σ value of the focal position detection system using the pattern plate 15 is equal to $\sigma_{IL}$ as the σ value of the exposure light IL1. In this state, when the illumination beam of the exposure light is changed to IL2 in accordance with the type of reticle R, $\sigma_{EL}$ of the illumination light EL is no longer equal to $\sigma_{IL}$ of the exposure light IL2.

In recent years, a method using a phase shifting reticle is assumed to increase the resolving power. In this case, a better effect can be obtained when the σ value of the illumination system on the exposure light IL side is set small (e.g., $\sigma_{IL}$=0.3). The σ value of the illumination system on the exposure light side is about 0.5 to 0.6 for the normal reticle. An exposure apparatus for selectively using the above two σ values is proposed. Since a combination of the numerical aperture NA of the projection optical system PL and the $\sigma_{IL}$ as the σ value of the illumination system on the exposure light IL side must be optimized to expose a micropattern, an exposure apparatus capable of varying the numerical aperture NA and the σ value on the exposure light IL side is also proposed. In this case, the $\sigma_{EL}$ value as the σ value of the illumination optical system for focal position detection becomes different from the $\sigma_{IL}$ value as the σ value of the illumination system for actually performing exposure. When the σ values are different, the focal positions are slightly different in accordance with the aberration distributions in the projection optical systems because the intensity distributions are different in the projection optical systems.

Similarly, when the line width of the aperture pattern of the pattern plate 15 for focus detection is different from that obtained by multiplying the line width of the reticle R subjected to actual exposure with a magnification 1/m of the projection optical system PL, the focal position is changed because the intensity distribution of the diffracted light components within the projection optical system varies. This amount is a maximum of about 0.1 to 0.2 μm, but is not small for recent finer micropatterns.

SUMMARY OF THE INVENTION

It is the first object of the present invention to provide a projection exposure apparatus and method capable of changing illumination conditions (e.g., a σ value, the numerical aperture of a projection optical system, annular illumination, and oblique illumination) in correspondence with a reticle and a reticle pattern (e.g., type, size, and periodicity), i.e., capable of maximizing the depth of focus under each condition even if the light amount distribution of exposure light near the pupil plane of the projection optical system is changed.

It is the second object of the present invention to provide a projection optical apparatus and method capable of always performing pattern exposure at an optimal focal position regardless of a change in illumination condition and use of a phase shifting reticle.

It is the third object of the present invention to provide a projection exposure apparatus and method capable of always accurately measuring imaging characteristics of a projection optical system under any illumination condition or in use of any reticle.

It is the fourth object of the present invention to provide a projection exposure apparatus and method capable performing pattern exposure on a photosensitive substrate while always maintaining imaging characteristics of the projection optical system with high precision without decreasing the throughput below an allowable range even if an illumination condition is changed.

In order to achieve the first object according to the first aspect of the present invention, as shown in FIG. 1, a projection exposure apparatus having an illumination optical system (1–13) for forming an almost uniform intensity distribution of exposure light (IL) emitted from a light source (1) and radiating the uniform exposure light (IL) on a mask (R) having a micropattern and a projection optical system (PL) for forming an image of the micropattern of the mask (R) and projecting the image on a photosensitive substrate (W), comprises illumination condition changing means (6, 54, or 8) for changing an illumination condition for the mask (R) in accordance with the micropattern on the mask (R), imaging characteristic control means (25, 27, 53, 57, 58) for controlling imaging characteristics of the projection optical system (PL), and adjusting means (50) for adjusting the imaging characteristics in synchronism with the illumination condition changing means (6, 54, or 8). According to the first aspect of the present invention, switching can be performed between normal illumination and annular illumination, between normal illumination and oblique illumination (modified light source), between normal illumination (normal reticle) and a phase shifting reticle, and between annular illumination and oblique illumination (modified light source). The lens elements of the projection optical system are changed in accordance with a switching mode to change the distortion and spherical aberration. Therefore, optimal imaging characteristics of the projection optical system are realized depending on each illumination condition, thereby obtaining the maximum depth of focus In order to achieve the second object according to the second aspect of the present invention, a projection exposure apparatus having an illumination optical system (1–4, 7, 40, 9–13) for radiating illumination light (IL) from a light source (1) on a mask (R) having a micropattern, a projection optical system (PL) for projecting and exposing an image of the micropattern of the mask (R) on a substrate (W), a stage (WSb) for holding the substrate (W) so as to be movable in a direction of optical axis (AX) of the projection optical system (PL), focus detecting means (30, $MR_1$, $MR_2$, 31a–31c) for detecting a positional difference between the substrate (W) and a predetermined imaging plane of the projection optical system (PL) along the direction of optical axis and outputting a detection signal corresponding to this difference, and control means (35, 50) for controlling movement of the stage (WSb) on the basis of the detection signal, comprises input means (51, 52) for inputting at least one information selected from a numerical aperture of the projection optical system (PL), a numerical aperture of the illumination optical system, a shape of a beam passing through a Fourier transform plane of the mask within the projection optical system, and a position of the beam passing through the Fourier transform plane, setting means (40, 32, 90, (60a, 60b), 7, Rfs) for setting a predetermined exposure condition on the basis of the information input from the input means, switching means (TA, 37, 67, 100, RL, 91) for switching the exposure condition set by the setting means, and adjusting means (35, 50) for supplying an offset to any one of the focus detecting means and the control means by a value corresponding to a change in position on the predetermined imaging plane along the direction of optical axis upon a change caused by a switching operation of the switching means.

According to the second aspect of the present invention, the predetermined offset is supplied to the focus detecting means in accordance with the change in illumination condition or the like, and focusing on the substrate is performed using the focus detecting means. For this reason, even if the focal position of the projection optical system is changed upon the above change, pattern exposure can be performed while the substrate can always be located at the optimal focal position of the projection optical system.

In order to achieve the third object according to the third aspect of the present invention, as shown in FIG. 14, the first projection exposure apparatus for projecting an image of a pattern of a mask (R) irradiated with light from an exposure illumination optical system (1–4, 40, 9–13) on a photosensitive substrate (W) through a projection optical system (PL), comprises an aperture pattern (FP) formed on a reference surface (117) adjacent to the photosensitive substrate (W), a detection illumination optical system (110, 115, 116) for guiding illumination light (EL) to the aperture pattern, a detector (PD) for generating a signal corresponding to an amount of light obtained such that light is radiated on a pattern formation surface of the mask (R) through the aperture pattern and the projection optical system (PL), the light is reflected by the pattern formation surface, and the light returning through the projection optical system (PL) is limited by the aperture pattern, and illuminance distribution setting means (111, 112, 114, or 121) for arbitrarily setting an illuminance distribution of the illumination light (EL) from the detection illumination optical system (110, 115, 116) on a pupil plane (Ep) of the projection optical system (PL).

In this case, the illuminance distribution setting means (e.g., a zoom lens system (111, 112, 114)) preferably sets the illuminance distribution of the illumination light (EL) from the detection illumination optical system (110, 115, 116) on the pupil plane (Ep) of the projection optical system (PL) to be equal to the illumination distribution of the exposure light (IL) from the exposure illumination optical system (1–4, 7, 40, 9–13) on the pupil plane (Ep) of the projection optical system (PL). This indicates that the $\sigma_{IL}$ as the σ value on the exposure light (IL) side is set almost equal to $\sigma_{EL}$ as the σ value on the illumination light (EL) side when the principal ray of the exposure light (IL) is parallel to the optical axis (AX) of the projection optical system (PL).

As shown in FIG. 14, the second projection exposure apparatus according to the third aspect of the present invention comprises an aperture pattern formed on a reference surface (117) adjacent to the photosensitive substrate (W), a detection illumination optical system (110, 115, 116) for guiding illumination light (EL) to the aperture pattern, a detector (PD) for generating a signal corresponding to an amount of light obtained such that light is radiated on a pattern formation surface of the mask (R) through the aperture pattern and the projection optical system (PL), the light is reflected by the pattern formation surface, and the light returning through the projection optical system (PL) is limited by the aperture pattern, and pattern shape setting means (e.g., FIG. 18A) for arbitrarily setting the shape of the aperture pattern.

In this case, the pattern shape setting means preferably sets a line width of the aperture pattern to be almost equal to a line width obtained by multiplying a minimum line width of the pattern of the mask (R) with a magnification of the projection optical system (PL).

In the first projection exposure apparatus according to the third aspect of the present invention, in order to detect the focal position of the photosensitive substrate, when the reference surface is moved below the projection optical system and is scanned in a direction parallel to the optical axis of the projection optical system, the signal generated by the detector is maximum (or minimum) at an in-focus point.

Therefore, the position at which the focus signal is maximum (or minimum) is detected as the focal position. Since the focal position is directly detected through the projection optical system, even if the focal position is changed upon a change in imaging characteristics of the projection optical system due to changes over time, the focal position can be accurately obtained.

In order to more accurately obtain the focal position of the projection optical system, the illumination characteristics of the exposure illumination optical system for the projection optical system are preferably closer to those of the aperture pattern detection illumination optical system of the reference surface. The illumination characteristics can be almost expressed by the illuminance distribution of the pupil plane (i.e., the Fourier transform plane) of the projection optical system. When the illuminance distribution of the illumination light from the detection illumination optical system on the pupil plane of the projection optical system is set closer to the illuminance distribution in the exposure illumination optical system, a focal position closer to the actual focal position of the projection optical system can be obtained.

In this case, when the illuminance distribution of the light from the detection illumination optical system on the pupil plane of the projection optical system is almost equal to that of the light from the exposure illumination optical system on the pupil plane of the projection optical system, the actual focal position of the projection optical system can be most accurately detected.

In the second projection exposure apparatus according to the third aspect of the present invention, the focal position of the projection optical system can be detected using the aperture pattern on the reference surface. In this case, since the diffraction angle is changed in accordance with a change in line width (pitch) of the mask pattern, so that the optical path in the projection optical system is changed, the focal position may be slightly changed. In order to eliminate this drawback, the shape of the aperture pattern of the reference surface is set closer to the shape (including a degree of micropatterning (pitch and line width) and a direction of periodicity) of the mask pattern. Therefore, the accurate focal position corresponding to the mask pattern can be detected.

The illumination light passing through the aperture pattern of the reference surface may be reflected by the pattern formation surface of the mask, depending on the shape of the mask pattern portion irradiated with the illumination light, thereby varying an amount of light of the return beam. In this case, the shape of the aperture pattern of the reference surface is changed to reduce the influence of the pattern shape at the portion irradiated with the illumination light within the pattern formation surface. In addition, the shape and position of the aperture pattern of the reference surface, the direction of periodicity of the aperture pattern, and the like are changed to perform focal position detection of the projection optical system a plurality of times, and an average value is obtained to reduce the influence of the pattern shape on the mask pattern.

In addition, more specifically, if the minimum line width of the mask pattern is known, the line width of the aperture pattern is set, by the pattern shape setting means, almost equal to the line width obtained by multiplying the minimum line width of the mask pattern with the magnification of the projection optical system. The accurate focal position corresponding to the mask pattern can be most accurately detected.

When the line width of the mask pattern is reduced, and the mask is irradiated with exposure light whose principal ray is perpendicular to the surface of the mask, the depth of focus of the projection optical system becomes excessively small. An oblique illumination method may be proposed as an illumination scheme for increasing the resolving power of the mask pattern without increasing the numerical aperture of the projection optical system and for relatively increasing a defocus amount. As described in Ser. No. 791,138 (Nov. 13, 1991), according to the oblique illumination method, an illumination beam passing through the pupil plane of the illumination optical system, its conjugate plane, or a plane adjacent thereto is given as beams in at least two local regions having centers each shifted from the optical axis of the illumination optical axis by a predetermined amount, so that the illumination beam radiated on the mask is inclined at an angle corresponding to the degree of micropatterning of the pattern of the mask in a predetermined direction. If the mask pattern is a one-dimensional periodic pattern, exposure light in the oblique illumination method consists of exposure light IL3 having a principal ray crossing the optical axis AX of the projection optical system PL at an angle $\phi 1$ clockwise and exposure light IL4 crossing the optical axis AX at an angle $\phi 1$ counterclockwise. Note that either exposure light IL3 or IL4 can be omitted. The illuminance distribution of the exposure light IL3 (or the exposure light IL4) on the pupil plane Ep of the projection optical system PL becomes maximum within a predetermined range centered on points X1 and X2 equidistantly spaced apart from and symmetrical about the optical axis AX.

In this case, in order to accurately detect the focal position of the projection optical system PL using the reference surface, the illuminance distribution of the illumination line EL for the reference surface on the pupil plane Ep of the projection optical system PL is preferably set almost equal to the illuminance distribution of the exposure light IL on the pupil plane Ep of the projection optical system PL. Since the first projection exposure apparatus according to the third aspect of the present invention comprises illuminance distribution setting means (an aperture stop 121 in FIG. 17), the oblique illumination is applied to the aperture pattern to more accurately detect the focal position. In order to achieve the fourth object according to the fourth aspect of the present invention, as shown in FIG. 19, a projection exposure apparatus having an illumination optical system (1–4, 7–13) for forming an almost uniform intensity distribution of illumination light (IL) emitted from a light source (1) and radiating the uniform illumination light (IL) on a mask (R) having a micropattern, a projection optical system (PL) for forming an image of the micropattern on the mask (R) and projecting the image on a photosensitive substrate (W), and means (drive elements 25, 27, and 29, and a drive element control portion 53) for controlling imaging characteristics of the projection optical system (PL), comprises illumination condition changing means (variable aperture stops 8 and 32, a variable blind 10, or a turret plate 100, and a drive system 54) for changing an illumination condition for the mask (R) in correspondence with a type of mask (normally a mask or phase shifting mask) or a degree of micropatterning (e.g., periodicity, pitch, and direction) of the pattern, and exposure control means (a main controller 50) for stopping an exposure operation of the photosensitive substrate (W) for a predetermined period of time (i.e., a period until an amount $\Delta M$ of change in imaging characteristic reaches a predetermined level $M_{S1}$) when the illumination condition is changed. According to the fourth aspect of the present invention, even if the change characteristics of the imaging characteristics are changed by illumination light absorption of the projection optical system upon a change in illumination condition (or mask exchange), or the like, the exposure operation is kept stopped until the influence of the history under the previous illumination condition for the imaging characteristics is reduced. The exposure operation is started while the imaging characteristics are controlled under the updated illumination condition. For this reason, the exposure operation is not performed in the transient state of the illumination condition. The change characteristics of the imaging characteristics are not mixed under the two illumination conditions set before and after the change of the illumination condition, and calculations of the amounts of changes in imaging characteristics caused by the illumination light absorption can be facilitated. Therefore, the amounts of changes in imaging characteristics can be strictly calculated in pattern exposure on the photosensitive substrate, and the imaging characteristics can be corrected with high precision.

In addition, since the stop time of the exposure operation is determined in accordance with control precision of the imaging characteristics corresponding to the degree of micropatterning of the mask pattern, the decrease in productivity (throughput) caused by the stop time can be minimized. Another projection exposure apparatus according to the fourth aspect of the present invention comprises exposure control means (a main controller 50) for controlling to start or stop an exposure operation of a photosensitive substrate (W) on the basis of information corresponding to a thermal accumulation amount from detecting means (33) and a predetermined reference value, illumination condition changing means (variable aperture stops 8 and 32, a variable blind 10, or a turret plate 100, and a drive system 54) for changing an illumination condition for the mask (R) in correspondence with a type of mask (a normal mask or phase shifting mask) or a degree of micropatterning (e.g., periodicity, pitch, and direction) of the pattern, and means (the main controller 50) for setting the reference value to a value corresponding to a changed illumination condition when the illumination condition is changed. At this time, the reference value of each aberration (e.g., the coma, spherical aberration, astigmatism, or curvature of field) under each illumination condition, or the reference value of the thermal accumulation amount for one aberration which poses the most serious practical problem is set in such a manner that the imaging pattern degradation caused by each aberration is not set below the required precision, i.e., each aberration amount corresponding to the thermal accumulation amount does not exceed a predetermined value, thereby minimizing the decrease in productivity (throughput) during inhibition of the exposure operation. The reference value is changed in synchronism with a change in illumination condition.

As described above, even if the amount of change (change characteristics) in each imaging characteristic of the projection optical system caused by the illumination light absorption upon a change in illumination condition is changed, a predetermined allowable limit value (or the predetermined reference value of the thermal accumulation amount) is set in the amount of change in imaging characteristic corresponding to the thermal accumulation amount of the projection optical system under each illumination condition. If the amount of change exceeds the allowable limit value (or the thermal accumulation amount exceeds the reference value), the exposure operation is stopped (interrupted). For this reason, the degradation of the imaging pattern, caused by a change in imaging characteristic under each illumination condition, can always be suppressed within the allowable range. In addition, the imaging characteristic whose allowable limit value is set every illumination condition is determined, and the amount of change is compared with the allowable limit value for only the determined imaging characteristic, thereby controlling the start and stop of the exposure operation. Therefore, the decrease in productivity (throughput) caused by the stop time can be minimized.

BRIEF DESCRIPTION OF THE DRAWINGS

FIGS. 7A and 7B are views showing a case in which a zoom lens system is used as a means for variably changing the numerical aperture of an illumination system of the apparatus shown in FIG. 6;

DESCRIPTION OF THE PREFERRED EMBODIMENTS

Figure 1:
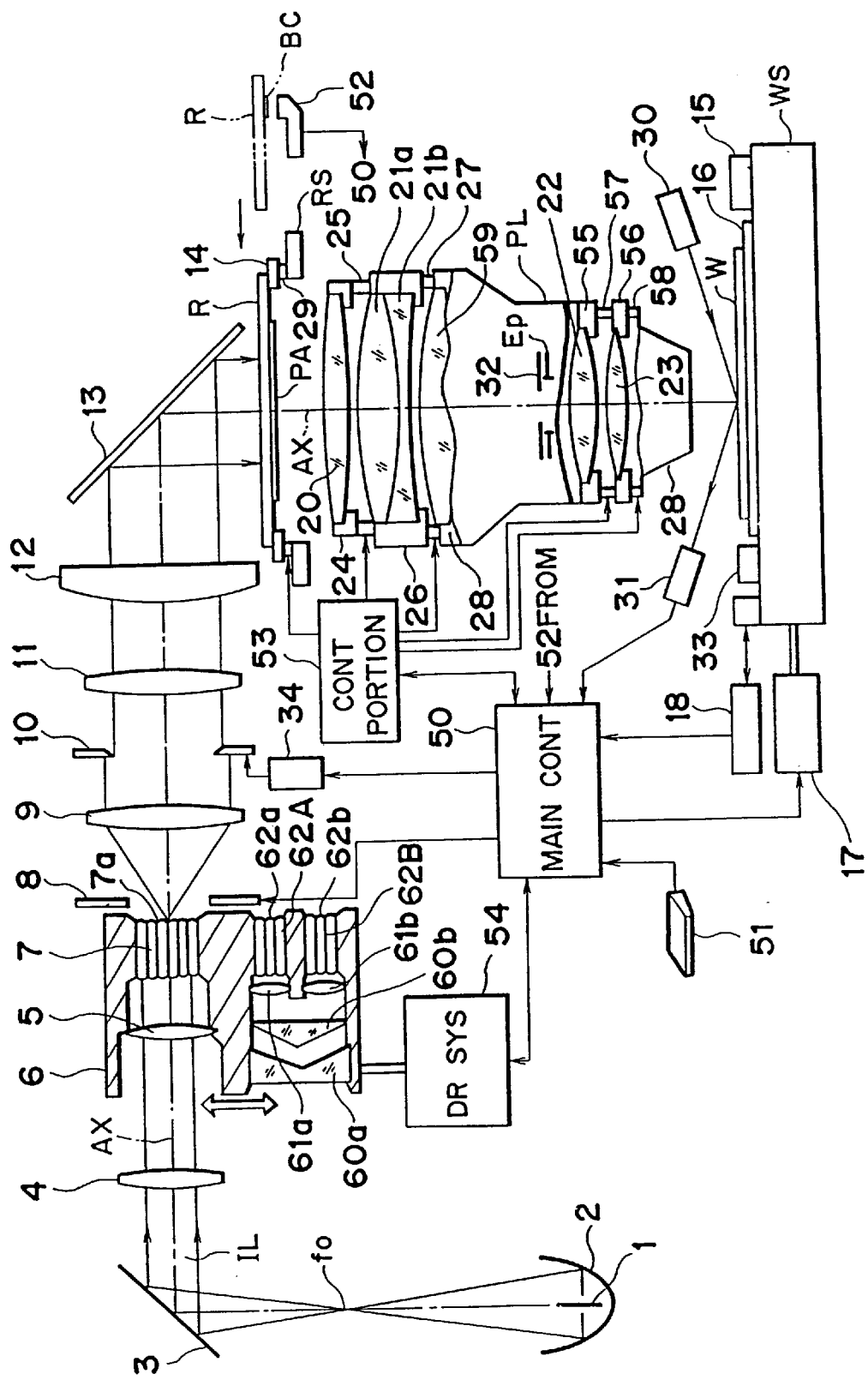
FIG. 1 is a schematic view showing the arrangement of a projection exposure apparatus according to the first embodiment of the present invention.

FIG. 1 is a plan view showing the schematic arrangement of a projection exposure apparatus according to the first embodiment of the present invention. Referring to FIG. 1, an ultra-high-voltage mercury lamp 1 generates illumination light (e.g., an i-ray) IL having a wavelength range for sensing a resist layer. The exposure illumination light source 1 may be a laser source such as a KrF or ArF excimer laser or a high-frequency source such as a metal vapor laser or YAG laser in place of the bright lines from the mercury lamp or the like. The illumination light IL is reflected by an elliptical mirror 2 and is focused at a second focal point $f_0$. The illumination light IL is then incident on an optical integrator block 6 through a mirror 3 and a relay lens 4.

The optical integrator block 6 in FIG. 1 includes two optical integrator systems. The two optical integrator systems can be exchanged by a drive system 54.

The first optical integrator system comprises an input lens 5 and a fly-eye lens 7. The light amount distribution at an exit surface 7a of the fly-eye lens 7 is almost uniform within a circular region on a plane perpendicular to an optical axis AX (normal illumination). The exit surface 7a of the fly-eye lens 7 optically serves as the Fourier transform plane for the reticle pattern on a reticle R. The light amount distribution on the exit surface 7a of the fly-eye lens 7 corresponds to the distribution of the illumination light amount within the incident angle range on the reticle pattern surface.

The second optical integrator system comprises polygonal prisms 60a and 60b, input lenses 61a and 61b, and two fly-eye lenses 62A and 62B as an input optical system. The polygonal prisms comprise the V-shaped concave prism 60a and the V-shaped convex prism 60b. The polygonal prisms split the illumination light IL from the light source 1 into two beams. The two beams from the polygonal prisms (60a and 60b) are incident on the fly-eye lenses 62A and 62B through the input lenses 61a and 61b, respectively. Exit surfaces 62a and 62b of the fly-eye lenses 62A and 62B also optically serve as Fourier transform planes for the reticle pattern on the reticle R. In this manner, the illumination light passing through the pupil plane of the illumination optical system, its conjugate plane, or a plane adjacent thereto is defined as beams in at least two local regions having centers equidistantly spaced apart from the axis AX of the illumination optical system by a predetermined amount. The illumination light to be incident on the light sour is inclined at an angle corresponding to the degree of micropatterning of the reticle pattern in a predetermined direction (to be referred to as an oblique illumination method thereinafter).

FIG. 1 shows a normal illumination state in which the first optical integrator system is located in the optical path.

An aperture stop 8 is arranged near the exit surface (reticle-side focal plane) 7a of the fly-eye lens 7 to set a numerical aperture $NA_{IL}$ of the illumination optical system variable.

The illumination light IL emerging from the fly-eye lens 7 reaches a mirror 13 through relay lenses 9 and 11, a variable blind 10, and a main condenser lens 12 and is reflected downward in an almost vertical direction. The illumination light IL illuminates a pattern area PA of the reticle R at an almost uniform illuminance. Since the surface of the variable blind 10 is conjugate with the reticle R, a plurality of blades constituting to the variable blind 10 are opened/closed by a motor 34 to change the size and shape of the opening of the blind 10, thereby variably setting the illumination field of the reticle R. The reticle R is held in a reticle holder 14, and the reticle holder 14 is placed on a reticle stage RS to be two-dimensionally movable within the horizontal plane by a plurality of extendible drive elements 29 (only two are illustrated in FIG. 1). When the extension amount of each of the drive elements 29 is controlled by a drive element control portion 53, the reticle stage RS can be moved in a direction parallel to the direction of optical axis and inclined in an arbitrary direction with respect to the plane perpendicular to the optical axis.

Although the above operation will be described in detail later, the imaging characteristics of the projection optical system and can be corrected. In particular, hourglass-shaped or barrel distortions can be corrected. Note that the light source is positioned such that the central point of the pattern area PA is aligned with the optical axis AX.

The illumination light IL passing through the pattern area PA is incident on the projection optical system PL having both telecentric surfaces. The projection optical system PL projects (imaging) a projection image of the circuit pattern of the reticle stage R on one shot area of a wafer W such that the upper surface of a resist layer formed on the wafer W almost overlaps the optimal imaging plane. Note that some lens elements (20, 21a, 21b, 22, and 23 in FIG. 1) constituting the projection optical system PL according to this embodiment can be independently driven. The imaging characteristics such as a projection magnification, spherical aberration, distortion, curvature of field, and astigmatism, of the projection optical system PL can be controlled (to be described in detail later).

A variable aperture stop 32 is arranged at a pupil plane Ep of the projection optical system PL or a plane adjacent thereto to change the numerical aperture NA of the projection optical system PL.

The wafer W is drawn by vacuum suction on a wafer holder (θ table) 16 and is held on a wafer stage WS through the holder 16. The wafer stage WS is arbitrarily inclinable with respect to the optimal imaging plane of the projection optical system PL by a motor 17 and is finely movable in the direction of optical axis (Z direction). The stage WS is arranged to be two-dimensionally movable in accordance with the step-and-repeat scheme. When transfer exposure of the reticle stage R for one shot area of the wafer W is completed, the stage WS is stepped to the next shot position. Note that the details of the arrangement and the like of the wafer stage WS are disclosed in U.S. Pat. No. 4,770,531. A movable mirror 19 for reflecting a laser beam from an interferometer 18 is fixed at the end portion of the wafer stage WS. The two-dimensional position of the wafer stage WS is always detected by the interferometer 18 at a resolving power on the order of about 0.01 $\mu$m.

An oblique incident focus detection system comprises a light-emitting optical system 30 for supplying an imaging beam for forming an image of a pinhole or slit from the oblique direction with respect to the optical axis AX toward the optimal imaging plane of the projection optical system PL, and a light-receiving optical system 31 for receiving a beam upon reflection of the imaging beam on the surface of the wafer W. The arrangement and the like of this focus detection system is disclosed in U.S. Pat. No. 4,650,983. The focus detection system detects a vertical position (Z direction) of the wafer surface with respect to the imaging plane, and then detects an in-focus state between the wafer W and the projection optical system PL.

The apparatus shown in FIG. 1 includes a main controller 50 for controlling the overall operation of the apparatus, a bar code reader 52 for reading, during conveyance of the reticle R immediately above the projection optical system PL, a bar code BC representing the name and formed near the reticle pattern, a keyboard 51 for inputting a command or data by an operator, and the drive system (e.g., a motor and a gear train) 54 for driving the optical integrator block 6 on which the plurality of fly-eye lens groups including the fly-eye lens 7 are fixed. The main controller 50 prestores the names of a plurality of reticles handled in this projection exposure apparatus (e.g., a stepper) and the stepper operation parameters corresponding to the names. When the bar code reader 52 reads the reticle bar code BC, the main controller 50 selects one of the fly-eye lens groups most suitable for a prestored illumination condition (corresponding to the type of reticle and periodicity of the reticle pattern) from the optical integrator block 6 as one of the operation parameters corresponding to the name. The main controller 50 outputs a predetermined drive command to the drive system 54. In addition, as the operation parameters corresponding to the name, optimal set conditions of the variable aperture stops 8 and 32 and the variable blind 10 in use of the selected fly-eye lens group, and calculation parameters (i.e., optimal imaging characteristics under each illumination condition, constants representing rates of changes of the lens elements of the imaging characteristic change amounts with respect to drive amounts) used for causing a correction mechanism (to be described later) to correct the imaging characteristics of the projection optical system PL are also registered in advance. These conditions are also set simultaneously when the fly-eye lens group is set. Therefore, the optimal illumination condition for the reticle R placed on the reticle stage RS is set. The above operations can be alternatively performed by directly inputting commands and data from the keyboard 51 by the operator to the main controller 50.

The correction mechanism for the optical integrator block 6 of the projection optical system PL will be described below. As shown in FIG. 1, the reticle R and the lens elements 20, 21a, 21b, 22, and 23 can be independently driven by the drive element control portion 53 to correct the optical integrator block 6 of the projection optical system PL. The imaging characteristics of the projection optical system PL include the focal position, the projection magnification, the spherical aberration, the distortion, the curvature of field, and the astigmatism. The values of these characteristics are independently adjusted. However, for the sake of descriptive simplicity, the focal position, the projection magnification, the distortion, the spherical aberration, and the curvature of field of a projection optical system having both telecentric surfaces are adjusted. Note that the barrel or hourglass-like distortion is corrected upon movement of the reticle R.

The lens element 20 is fixed on a support member 24, and the lens elements 21a and 21b are integrally fixed on a support member 26. The lens element 22 is fixed on a support member 55, and the lens element 23 is fixed on a support member 56.

Lens elements (e.g., 59) except for the lens elements 20, 21a, 21b, 22, and 23 are fixed in a lens barrel 28 of the projection optical system PL. In this embodiment. The optical axis AX of the projection optical system PL in this embodiment represents the optical axis of each lens element fixed in the lens barrel 28.

A plurality of extendible drive elements 25 (three elements in this embodiment, and two of them are illustrated in FIG. 1) are coupled to the support member 26 through a drive element 25. The support member 26 is coupled to the lens barrel 28 through a plurality of extendible drive elements 27. The support member 55 is coupled to the support member 56 through a plurality of extendible drive elements 57. The support member 56 is coupled to the lens barrel 28 through a drive element 58. The drive elements 25, 27, 29, 57, and 58 comprise, e.g., electrostrictive or magnetostrictive elements. A displacement of each drive element which corresponds to a voltage or magnetic field applied to each drive element is predetermined. Although not shown, a position detector such as a capacitive displacement sensor or differential transformer is connected to the drive element in consideration of the hysteresis of the drive element, and the position of the drive element which corresponds to the voltage or magnetic field applied thereto is monitored, thereby performing high-precision driving. With the above arrangement, the drive element control portion 53 can axially move the lens elements 20, 21a, 21b, 22, and 23 and the three to four peripheral points of the reticle R independently by amounts corresponding to the drive command supplied from the main controller 50. As a result, the lens elements 20, 21a, 21b, 22, and 23 and the reticle R are translated in the axial direction and can be inclined in an arbitrary direction with respect to the plane perpendicular to the optical axis AX. A drive element movable in the direction perpendicular to the optical axis may be arranged to move the respective lens elements and the reticle within the plane perpendicular to the optical axis.

When the lens elements 20, 21a, and 21b are moved in the direction of optical axis, a projection magnification M, a curvature C of field, and a focal position F are changed in accordance with a rate of change corresponding to the movement of each lens. When the lens elements 22 and 23 are moved in the direction of optical axis, a spherical aberration S is changed. Amounts $\Delta M$, $\Delta C$, $\Delta F$, and $\Delta S$ of changes of the projection magnification M, the curvature C of field, the focal position F, and the spherical aberration S are represented as follows:

$$\Delta M = C_{M1} \times x_1 + C_{M2} \times x_2 \tag{1}$$

$$\Delta C = C_{C1} \times x_1 + C_{C2} \times x_2 \tag{2}$$

$$\Delta F = C_{F1} \times x_1 + C_{F2} \times x_2 \tag{3}$$

$$\Delta S = C_{S1} \times x_3 + C_{S2} \times x_4 \tag{4}$$

where $x_1$ is the drive amount of the lens element 20, $x_2$ is the drive amount of the lens elements 21a and 21b, $x_3$ is the drive amount of the lens element 22, $x_4$ is the drive amount of the lens element 23, and $C_{M1}$, $C_{M2}$, $C_{C1}$, $C_{C2}$, $C_{F1}$, $C_{F2}$, $C_{S1}$, and $C_{S2}$ are constants representing rates of changes of the amounts of changes to the drive amounts of the respective lenses.

The focus detection systems or light-emitting and light-receiving optical systems 30 and 31 detect positional deviations (differences) of the wafer surface from the optimal focus position when the optimal focus position of the projection optical system is defined as a zero reference. For this reason, an electrically or optically appropriate offset amount $x_5$ is supplied to the focus detection systems 30 and 31 to position the wafer surface using the focus detection systems 30 and 31, thereby correcting the deviations of the focus position which are caused by driving the lens elements 20, 21a, 21b, 22, and 23. Equation (3) can be rewritten as follows:

$$\Delta F = C_{F1} \times x_1 + C_{F2} \times x_2 + x_5 \tag{5}$$

Similarly, when the reticle is translated in the direction of optical axis, a distortion D and a focal position F are changed with a rate of change corresponding to the movement amount. Amounts $\Delta D$ and $\Delta F$ of changes of the distortion D and the focal position F are represented as follows:

$$\Delta D = C_{D6} \times x_6 \tag{6}$$

$$\Delta F = C_{F1} \times x_1 + C_{F2} \times x_2 + x_5 + C_{F6} \times x_6 \tag{7}$$

where $x_6$ is the drive amount of the reticle R, and $C_{D6}$ and $C_{F6}$ are rates of changes of the amounts of changes to the drive amounts of the reticle R.

When the drive amounts $x_1$ to $x_6$ are set in equations (1), (2), (4), (6), and (7), the amounts $\Delta M$, $\Delta C$, $\Delta D$, $\Delta F$, and $\Delta S$ of changes can be arbitrarily adjusted. Note that the five imaging characteristics are simultaneously adjusted and corrected (predetermined imaging characteristics are set). However, if the amounts of changes in imaging characteristics, caused by the change in illumination condition, of the imaging characteristics of the projection optical system are small enough to be negligible, the imaging characteristics need not be corrected. If an imaging characteristic except for the five imaging characteristics described in this embodiment is greatly changed, it must be corrected. In this embodiment, correction is performed by the imaging characteristic adjustment mechanism upon movements of the reticle R and the lens elements. However, any scheme may be employed for the suitable adjustment mechanism. For example, a scheme for sealing a space defined by the two lens elements and adjusting the pressure of the sealed space, as disclosed in U.S. Pat. No. 4,871,237, may be employed.

In this embodiment, the reticle R, and the lens elements 20, 21a, 21b, 22, and 23 are movable by the drive element control portion 53. The lens elements 20, 21a, and 21b have influences on the curvature of field and astigmatism, which can be easily controlled as compared with other lens elements. On the other hand, the lens elements 22 and 23 have influences on the spherical aberration, which can be easily controlled as compared with other lens elements.

In this embodiment, the lens elements for controlling the distortion and the like are constituted by two lens groups (i.e., the lens element group consisting of the lens 20 and the lens group consisting of lenses 21a and 21b). However, three or more lens groups may be used. In this case, the movement range of the lens elements can be increased while variations in the respective aberrations are suppressed. In addition, various shape distortions (trapezoidal and rhombic distortions), the curvature of field, and the astigmatism can be properly suppressed. The lens elements for controlling the spherical aberration need not be limited to the two lens groups (lens element groups consisting of the lenses 22 and 23). By employing the above adjustment mechanism, the present invention can properly cope with a change in illumination condition.

In the above description, the optical integrator block 6 comprises the first optical integrator system and the second optical integrator system. However, the optical integrator block 6 need not be limited to switching between the two illumination states, but may comprise a block having three or more optical integrator systems, as shown in FIG. 2.

Figure 2:
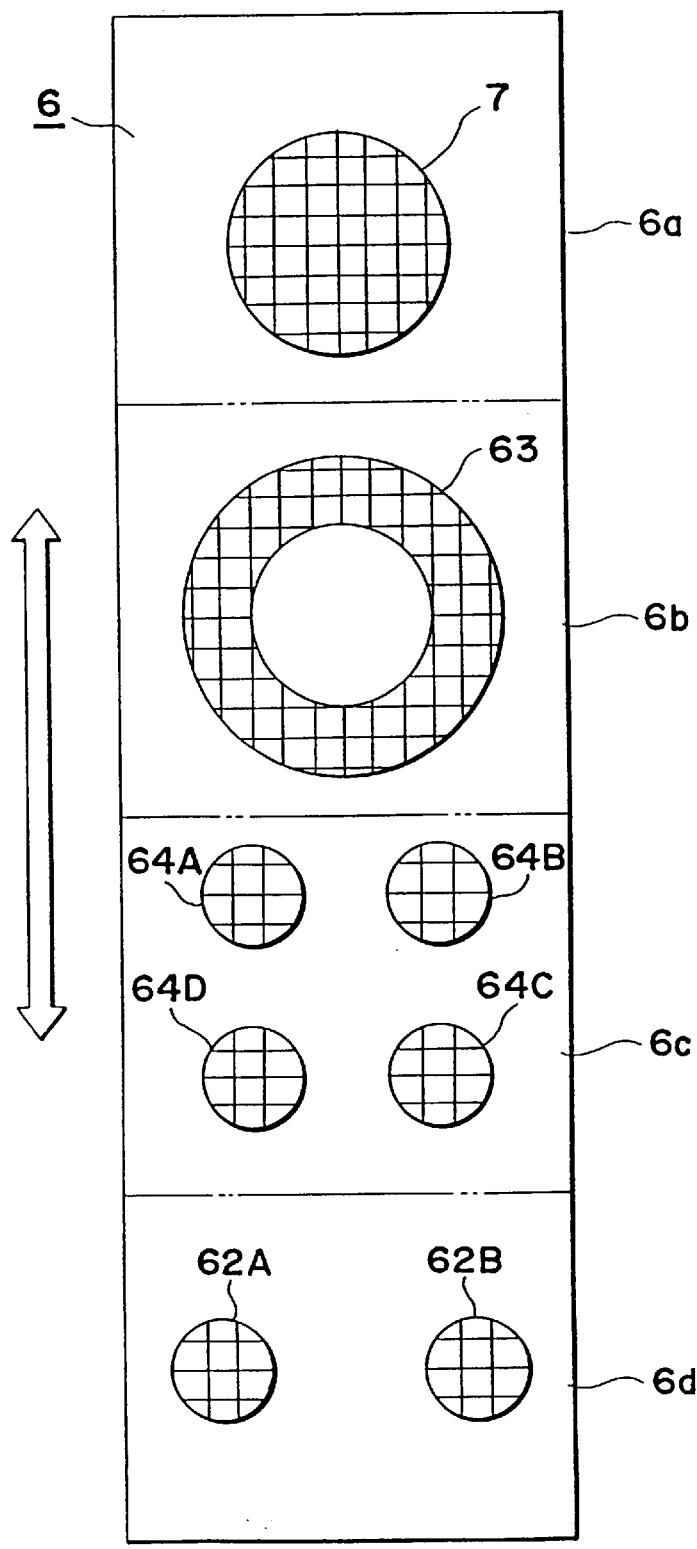
FIG. 2 is a view showing an exchange mechanism for arranging a plurality of exchangeable optical integrators according to the first embodiment of the present invention.

Referring to FIG. 2, a third optical integrator system 6b and a fourth optical integrator system 6c are arranged between a first optical integrator system 6a and a second optical integrator system 6d in the optical integrator block 6. The third optical integrator system 6b has a central light-shielding portion and comprises a fly-eye lens 63 and an input lens (not shown) to realize annular illumination. The fourth optical integrator system 6c comprises four fly-eye lenses 64A, 64B, 64C, and 64D, four input lenses (not shown), and a polygonal prism. A secondary source is split into four portions to realize a modified light source (i.e., realize the oblique illumination). The polygonal prism comprises a pyramid-like concave prism and a convex prism. Note that the exit surfaces of the fly-eye lenses of the third and fourth optical integrator systems 6b and 6c also optically serve as Fourier transform planes for the reticle pattern surface.

When the optical integrator block 6 having the above optical integrator systems described above is moved, the illumination condition can be changed.

The change in illumination condition is performed by the change in optical integrator system, but is not limited to this. For example, a light-shielding plate having an annular aperture or a plurality of apertures may be exchangeably arranged near the exit surface of the fly-eye lens 7.

The optical systems for guiding the beams to the fly-eye lenses in the second and fourth optical integrator systems are not limited to the polygonal prisms. These prisms may be replaced with mirrors, fibers, or diffraction gratings.

In the oblique illumination method, the position (illumination beam passing position) of the fly-eye lens is changed in accordance with the periodicity (pitch) of the reticle pattern. A plurality of optical integrator systems having different fly-eye lens positions may be arranged in the optical integrator block 6. In addition, in annular illumination, a plurality of optical integrator systems including the fly-eye elements 63 having different sizes and light-shielding portions having different sizes may be arranged in the optical integrator block 6.

Figure 30:
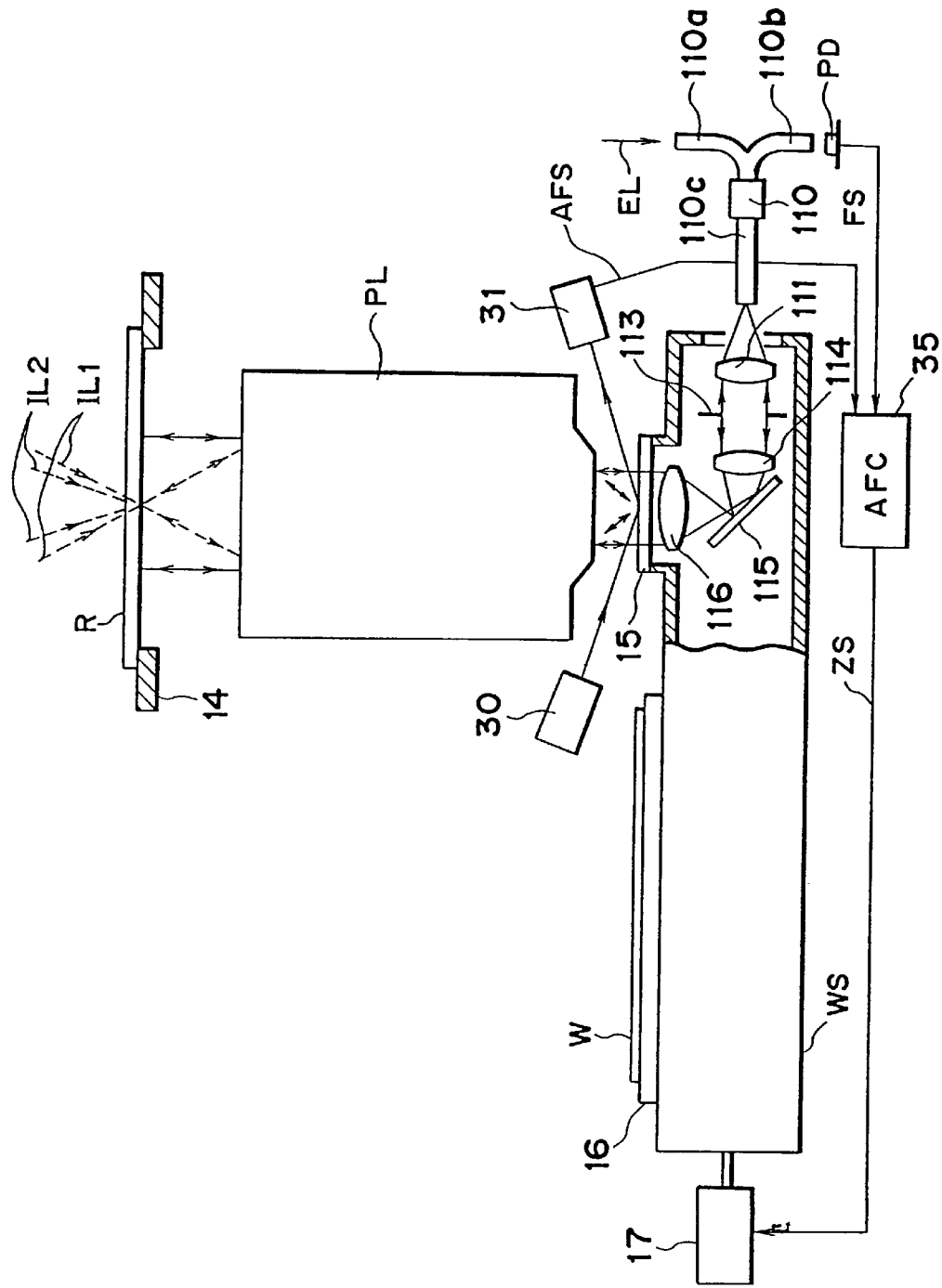
FIG. 30 is a view showing the arrangement of a conventional projection exposure apparatus.
Figure 31A:
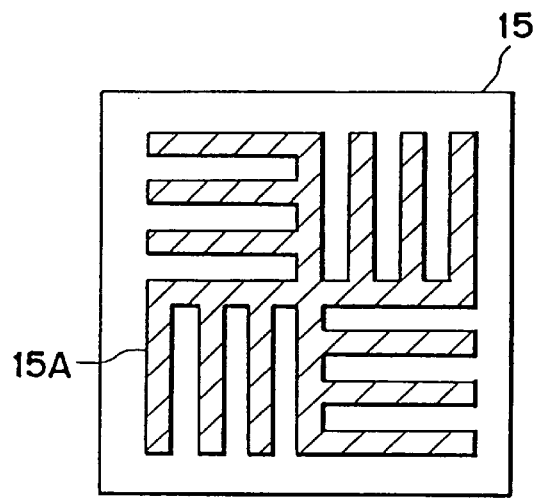
FIG. 31A is a view showing an aperture pattern of a pattern plate in FIG. 30.
Figure 31B:
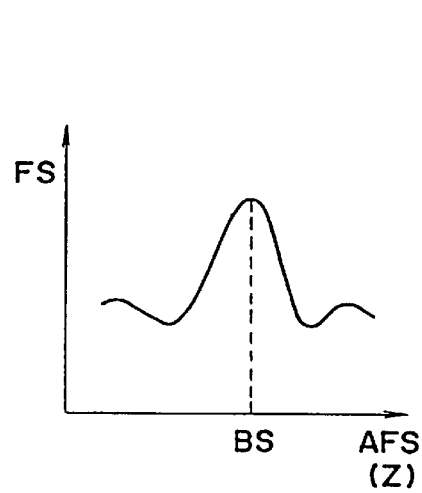
FIG. 31B is a waveform chart showing a signal output from a focus detection system.

A pattern plate 15 shown in FIG. 31A is arranged on the wafer stage WS shown in FIG. 1. Although not shown, a focus position detection system shown in FIG. 30 is also arranged in this embodiment, so that the focal position at an arbitrary position within the image field of the projection optical system PL can be detected as needed. For this reason, when the pattern plate 15 is moved within the image field to repeat focus detection at the respective positions, thereby obtaining the curvature of field, astigmatism, and the like as the imaging characteristics of the projection optical system PL. In the arrangement shown in FIG. 30, since the projection magnification and the distortion cannot be measured, it is preferable that marks formed at a plurality of positions on the reticle R are photoelectrically detected through a reference mark formed on a wafer stage, as disclosed in U.S. Pat. No. 4,853,745.

In this embodiment, the angle of the plane parallel glass (not shown) arranged inside the light-receiving optical system 31 is adjusted using the measurement result from the focal position detection system shown in FIG. 30 in such a manner that the imaging plane of the projection optical system PL is set to be the zero reference, and calibration of the focus detection system is performed. A horizontal position detection system disclosed in U.S. Pat. No. 4,558,949 is used or a focus detection system (e.g., a plurality of slit images are formed within the image field) is arranged to allow detection of focal positions at a plurality of arbitrary positions within the image field of the projection optical system PL to allow detection of an inclination angle of the predetermined area of the wafer W with respect to the imaging plane.

An oblique illumination method (modified light source) and its principle will be described with reference to FIGS. 3 and 4A to 4D.

Figure 3:
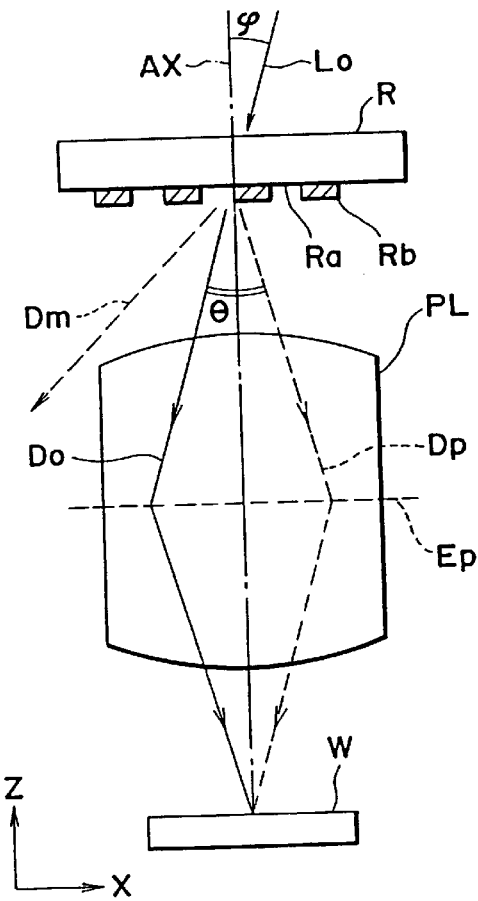
FIG. 3 is a view for explaining the principle of an oblique illumination method employed in the first embodiment of the present invention.

FIG. 3 is a view showing generation of diffracted light components emerging from a circuit pattern and an imaging state when a reticle is irradiated using the oblique illumination method. A one-dimensional line-and-space pattern consisting of transparent portions Ra and light-shielding portions Rb as a circuit pattern is drawn on the lower surface (i.e., on the projection optical system PL side) of the reticle R.

In the projection exposure apparatus (FIG. 1) used in this embodiment, local areas through which the illumination beams pass have centers deviated from the optical axis within the pupil of the illumination optical system (to be described later). For this reason, illumination light L0 for illuminating the reticle R is incident on the reticle R at a predetermined incident angle $\phi$ with respect to the direction (X direction) almost perpendicular to the direction (periodic direction) in which the circuit pattern of the reticle R is drawn. Note that the incident angle $\phi$ and the incident direction are solely determined in accordance with positions of the diffracted light components from the pattern of the reticle within the pupil plane of the projection optical system.

A 0-th-order diffracted light component $D_O$, a +1st-order diffracted light component $D_P$, and a −1st-order diffracted light component $D_m$ are generated from the pattern on the reticle in a direction of diffraction angle corresponding to the degree of micropatterning (width and pitch) of the pattern. The pattern resolving limit according to the conventional illumination method is determined whether the ±1st-order diffracted light components pass through the projection optical system PL. The light components passing through the projection optical system PL and reaching the wafer W are the 0-th-order diffracted light component $D_O$ and the +1st-order diffracted light component $D_P$ of the three light components. These two light components passing through the projection optical system PL form interference fringes on the wafer W, i.e., form an image of the circuit pattern. That is, an apparent numerical aperture NA is increased. Although the pattern size given by P>about $\lambda$/NA (where P is the pattern pitch) becomes the resolving limit, the oblique illumination method of this embodiment has a resolving limit P>about $\lambda$/2NA.

In FIG. 3, the 0-th-order diffracted light component $D_O$ and +1st-order diffracted light component $D_P$ are set to pass through optical paths almost symmetrical about the optical axis AX. This can be achieved such that the incident angle $\phi$ of the illumination light L0 is set to be $\sin\phi=\sin\theta/2=\lambda/2P$. At this time, in the defocus state of the wafer W, the 0-th-order diffracted light component $D_O$ and the +1st-order diffracted light component $D_P$ have almost the same wavefront aberration (caused by the defocus state). A wavefront aberration for a defocus amount $\Delta F$ is $\frac{1}{2}\times\Delta F\sin^2 t$ (where t is the incident angle of each diffracted light component on the wafer) because the incident angle t of the 0-th-order diffracted light component $D_O$ is almost equal to that of the +1st-order diffracted light component $D_P$. The cause for deforming (blurring) a pattern image on the wafer is a difference between the wavefront aberrations of the light components. However, in the apparatus (e.g., the second or fourth optical integrator system in FIG. 2) used in this embodiment, since the wavefront aberration of the 0-thorder diffracted light component $D_O$ radiated on the wafer is set almost equal to that of the +1st-order diffracted light component $D_P$, a degree of blurring can be reduced as compared with that in the conventional exposure apparatus even if the same defocus amount $\Delta F$ is given. That is, the depth of focus can be increased.

In FIG. 3, the 0-th-order diffracted light component $D_O$ is set to be almost symmetrical with the +1st-order diffracted light component $D_P$ about the optical axis AX. However, in order to increase the depth of focus, these two diffracted light components need not be symmetrical about the optical axis AX within the pupil plane Ep but may pass through positions equidistantly spaced apart from the optical axis AX.

The degree of micropatterning (line width and pitch) of the reticle or the directivity used in the exposure apparatus is not limited to one type. The central positions of the local areas through which the illumination beams pass on the pupil plane of the illumination optical system of the projection exposure apparatus used in the present invention, i.e., the positions of the illumination optical system of the two fly-eye lens groups 62A and 62B (FIG. 1), are preferably variable (exchangeable) in accordance with types of patterns.

The optical position of each fly-eye lens will be briefly described below.

Figure 4A:
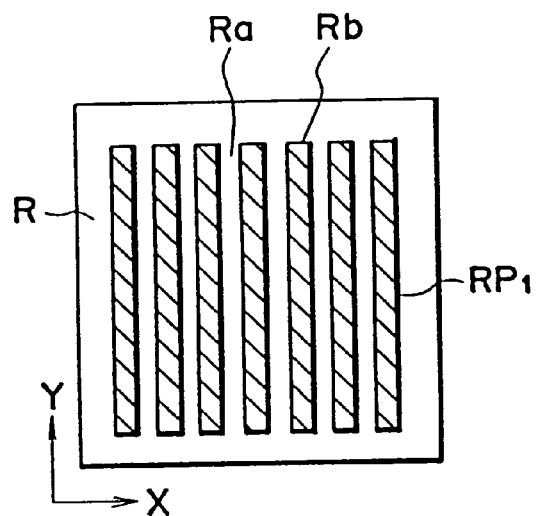
FIGS. 4A, 4B, 4C, and 4D are views for explaining the layout of fly-eye groups in the oblique illumination method employed in the first embodiment of the present invention.

FIG. 4A shows a so-called one-dimensional line-and-space pattern consisting of transparent portions Ra and light-shielding portions Rb extending in the Y direction and regularly aligned at a pitch P in the X direction. In this case, the optimal positions of the respective fly-eye lens groups 62A and 62B (FIG. 1) (i.e., positions of secondary source groups) are located at arbitrary positions on line segments L$\alpha$ and L$\beta$ in the Y direction within a pupil plane 70 of the illumination optical system, as shown in FIG. 4B. FIG. 4B is a view obtained when the pupil plane 70 of the illumination optical system which corresponds to a reticle pattern $RP_1$ is viewed from the direction of the optical axis AX. The X–Y coordinate system defined within the pupil plane 70 is the same as that of FIG. 4A when the reticle pattern $RP_1$ is viewed from the same direction.

As shown in FIG. 4B, distances $\alpha$ and $\beta$ from the optical axis AX (the center of pupil) to the line segments L$\alpha$ and L$\beta$ on the pupil plane 70 satisfy condition $\alpha=\beta$. Each of the distances $\alpha$ and $\beta$ corresponds to the X-direction incident angle $\phi_x$ of the illumination light for the reticle and is defined as a distance satisfying condition $\sin\phi_x=\lambda/2P_x$ where $\lambda$ is the exposure wavelength. If the centers (i.e., centers of gravity of the light amount distributions of the secondary source groups) of the fly-eye lens groups 62A and 62B are located on the line segments L$\alpha$ and L$\beta$, the two diffracted light components of the 0-th-order diffracted light component and one of the ±1st-order diffracted light components derived from the illumination beams from the fly-eye lens groups 62A and 62B pass through the positions equidistantly spaced apart from the optical axis AX on the pupil plane Ep of the projection optical system PL with respect to the line-and-space pattern shown in FIG. 4A. Therefore, the depth of focus for the line-and-space pattern (FIG. 4A) can be maximized and a high resolving power can be obtained.

Figure 4C:
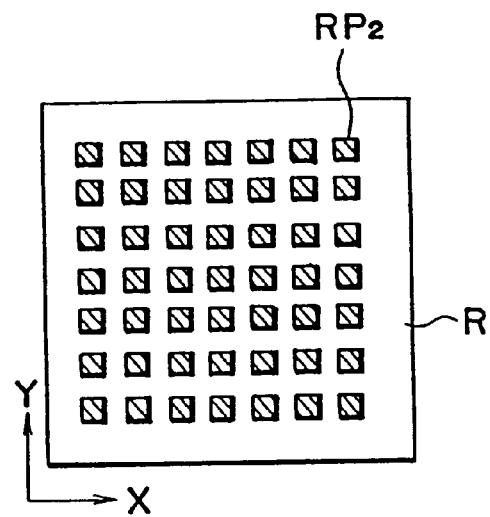
Figure 4B:
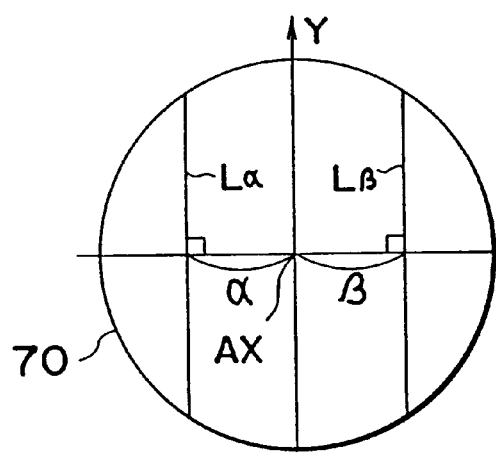
Figure 4D:
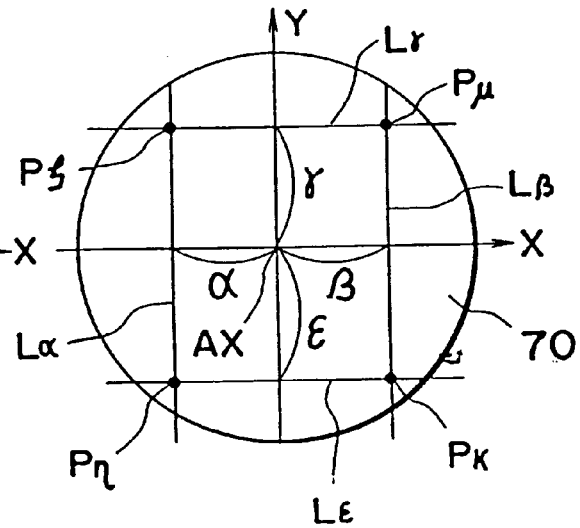

On the other hand, FIG. 4C shows reticle patterns as so-called isolated space patterns. The X-direction (lateral direction) pitch of patterns $RP_2$ is Px, and the Y-direction (longitudinal direction) pitch of the patterns $RP_2$ is Py. FIG. 4D is a view showing the optimal position of each fly-eye lens group. The positional relationship in FIG. 4D is the same as that in FIG. 4C, and the rotational relationship in FIG. 4D is the same as those in FIGS. 4A and 4B. It is preferable that the four local areas (illumination beams) are formed in the pupil plane 70 of the illumination optical system when the two-dimensional pattern $RP_2$ is used. In the apparatus (FIG. 1) having the above arrangement, four fly-eye lens groups are arranged as in the fourth optical integrator system (FIG. 2).

When the two-dimensional pattern $RP_2$ as shown in FIG. 4C is irradiated with the illumination light, diffracted light components are generated in the two-dimensional direction corresponding to the two-dimensional periodicity (pitch X: Px, pitch Y: Py) of the pattern $RP_2$. Even in the two-dimensional pattern $RP_2$ shown in FIG. 4C, if the 0-th-order diffracted light component and one of the ±1st-order diffracted light components pass through positions equidistantly spaced apart from the optical axis AX on the pupil plane Ep of the projection optical system PL, the maximum depth of focus can be obtained.

If the centers of the fly-eye lens groups (secondary source groups) are located on the line segments L$\alpha$ and L$\beta$, as shown in FIG. 4D, the maximum depth of focus of the X-direction component of the two-dimensional pattern $RP_2$ can be obtained. Similarly, when the Y-direction incident angle of the illumination light incident on the reticle is defined as $\phi_y$, and $\gamma$ and $\epsilon$ are defined as distances satisfying $\sin\phi_y=\lambda/2Py$, the centers of the two fly-eye lens groups (secondary source groups) are set to be located on line segments L$\gamma$ and L$\epsilon$, so that the depth of focus of the Y-direction component of the two-dimensional pattern $RP_2$ can be maximized.

When the illumination beams from the fly-eye lens groups (secondary source groups) located at the corresponding positions within the pupil plane 70 shown in FIG. 4B or 4D are incident on the reticle pattern $RP_1$ or $RP_2$, the 0-th-order diffracted light component $D_0$ and one of the +1st-order diffracted light component $D_P$ and −1st-order diffracted light component $D_m$ from the reticle pattern pass through positions equidistantly spaced apart from the optical axis AX on the pupil plane Ep of the projection optical system PL. There is therefore provided a projection exposure apparatus having a high resolving power and a large depth of focus.

The reticle patterns are exemplified by the two patterns shown in FIGS. 4A and 4C. Even if other patterns are used, the central positions of the fly-eye lens groups (secondary light source groups) on the pupil plane 70 of the illumination optical system are set so that two light components consisting of one of the +1st-order diffracted light component and the −1st-order diffracted light component and the 0-th-order diffracted light component are set to pass positions equidistantly spaced apart from the optical axis AX on the pupil plane Ep of the projection optical system PL. Note that the 0-th-order diffracted light component $D_0$ and one of diffracted light components of other orders, e.g., the ±2nd-order diffracted light components may be set to pass positions equidistantly spaced apart from the optical axis AX on the pupil plane of the projection optical system.

When the reticle pattern includes a two-dimensional periodic pattern, as shown in FIG. 4D, and one 0-th-order diffracted light component is taken into consideration, diffracted light components of the first order or more distributed in the X direction (first direction) and diffracted light components of the first order or more distributed in the Y direction (second direction) are present, centered on this one 0-th-order diffracted light component. If a two-dimensional pattern is properly imaged with respect to one specific 0-th-order diffracted light component, the position of the specific 0-th-order diffracted light component (the fly-eye lens group as one secondary source group) is adjusted so that one of the diffracted light components distributed in the first direction, one of the diffracted light components distributed in the second direction, and the specific 0-th-order diffracted light component are distributed equidistantly from the optical axis AX on the pupil plane Ep. For example, the central position of each fly-eye lens group (secondary source group) is aligned with one of points Pξ, Pη, Pκ, and Pμ. Each of the points Pξ, Pη, Pκ, and Pμ is an intersection between the line segment Lα or Lβ (the optimal position with respect to the X-direction periodicity, i.e., the positions at which the 0-th-order diffracted light component and one of the ±1st-order diffracted light components are almost equidistantly spaced apart from the optical axis on the pupil plane Ep of the projection optical system) and the line segment Lγ and Lε (the optimal position with respect to the Y-direction periodicity). This point represents an optimal light source position in each of the X and Y directions.

In the above description, the patterns having two-dimensional periodicity at identical positions on the reticles are assumed as the two-dimensional patterns. However, the above method is equally applied to a plurality of patterns having directivities at different positions on a single reticle pattern. When patterns on a reticle have a plurality of directivities or degrees of micropatterning, the optimal positions of the fly-eye lens groups correspond to these directivities and degrees of micropatterning of the patterns described above. Alternatively, each fly-eye lens group may be located at an average position of the respective optimal positions. This average position may be a weighted average obtained by weighting the position in accordance with the degree of micropatterning and a degree of importance.

Each beam emerging from each fly-eye lens group is obliquely incident on the reticle. At this time, if the centers of gravity of the amounts of inclined incident beams are not perpendicular to the reticle surface, the position of the transfer image is shifted within the plane of the wafer in a slight defocus state of the wafer W. In order to prevent this, the directions of the centers of gravity of the illumination beams from the respective fly-eye lens groups are set to be perpendicular to the reticle pattern, i.e., parallel to the optical axis AX. That is, if the optical axis (central line) is assumed for each fly-eye lens group, the vector sum of the position vector of the optical axis (central line) within the Fourier transform plane with reference to the optical axis AX of the projection optical system PL and the product of the amounts of light emerging from each fly-eye lens group is set to be almost zero. As a simpler method, the number of secondary sources is defined as 2 m (m is a natural number), the positions of m secondary sources are determined in accordance with the optimization method (FIGS. 4A to 4D), and the remaining m secondary sources are located at positions almost symmetrical about the optical axis AX.

The operation of the projection exposure apparatus according to this embodiment will be described below. A switching operation between the first optical integrator system and the second optical integrator system will be exemplified. An operation for arranging the first optical integrator system will be described below. A reticle R suitable for normal illumination is set on the reticle stage RS. The first optical integrator system (5 and 7) is located in the optical path of the illumination optical system in accordance with information from the bar code BC formed on the reticle R. Focus calibration is performed by the apparatus shown in FIG. 30. When the wafer W is located at the imaging position, outputs from the focus sensors (light-emitting and light-receiving optical systems) 30 and 31 are adjusted to be zero.

Figure 5:
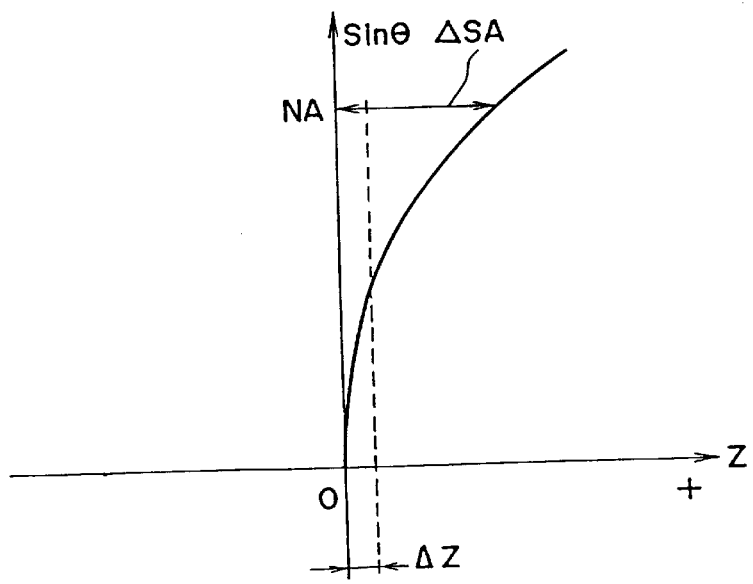
FIG. 5 is a graph showing spherical aberration characteristics in normal illumination employed in the first embodiment of the present invention.

As described above, in normal illumination, the depth of focus is increased with a predetermined spherical aberration amount. For this reason, information associated with the spherical aberration amount to be adjusted is recorded in the bar code BC. The main controller 50 calculates a lens drive amount (i.e., a drive amount of the lens from the reference position) in accordance with a constant $C_s$ associated with the spherical aberration amount and the spherical aberration amount. The lenses 22 and 23 are moved so that the spherical aberration on the wafer W side has a spherical aberration curve shown in FIG. 5. FIG. 5 is a graph showing spherical aberration characteristics. The optical sign is plotted along the Z-axis so that a direction away from the lens is defined as plus (+). ΔSA represents the spherical aberration amount at a predetermined numerical aperture NA. If a lens has a numerical aperture of about 0.6, ΔSA falls within the range of about 2 to 5 μm. When the spherical aberration is given to the lens, the best focus position is a Z-direction position slightly shifted from Z=0 (i.e., the position free from the spherical aberration). This defocus amount ΔZ is added as an offset to the focus sensors 30 and 31. The wafer stage WS is moved to locate the surface of the wafer W at the axial position shifted by the offset amount ΔZ. Note that the defocus amount may be corrected by lens driving, and that the lens drive amount may be directly recorded in the bar code BC.

An operation for switching the first optical integrator system to the second optical integrator system will be described below. A reticle R suitable for oblique illumination is set on the reticle stage RS, and the main controller 50 controls the drive system 54 on the basis of the information from the bar code BC of the reticle R. The drive system 54 switches the optical integrator block to locate the second optical integrator system (60, 61, and 62) in the optical path of the illumination optical system. The main controller 50 sets the σ value of the illumination optical system to be an appropriate value. In this case, the σ value is set to fall within the range of 0.1 to 0.3.

When the second optical integrator system (60, 61, and 62) is used, since the depth of focus is large in the absence of the spherical aberration, thereby returning the lenses 22 and 23 to the reference position. At this time, the offset amount for the focus sensors 30 and 31 are set zero. Note that focus calibration of the focus sensors 30 and 31 is performed in the absence of the spherical aberration. When calibration is performed with the spherical aberration, the offset amount with the spherical aberration is zero, while the offset amount without the spherical aberration is a predetermined offset amount.

Similarly, the spherical aberration can be adjusted by switching between the first fly-eye lens system and the third and fourth fly-eye lens systems. Even if a phase shifting reticle is used in the first fly-eye lens system, the lenses 22 and 23 are moved by the same operation as described above so as to nullify the spherical aberration.

Upon switching between the illumination conditions (i.e., switching between the first optical integrator system and the second, third, and fourth optical integrator systems, between the second, third, and fourth optical integrators, between the normal reticle and the phase shifting reticle, or between optical integrator systems having different fly-eye lens positions), the position of a beam passing within the projection optical system is changed, thereby varying the distortion. In each switching operation between the illumination conditions, an amount of change in imaging characteristic is registered in the bar code BC, and the main controller 50 calculates a lens drive amount in the same operation as described above. On the basis of the calculated lens drive amount, the reticle R (or lens elements 20, 21a, and 21b) is moved. When a focal position is changed upon a change in illumination condition, the offset amount is supplied to the focus sensors 30 and 31 to move the wafer stage WS, thereby moving the wafer W to the position shifted from the in-focus reference position by a predetermined amount, as described above. In addition, the focus offset may also be adjusted upon lens movement, as described above.

The above description exemplifies the operation associated with the distortion. However, the positions of the lenses 20, 21a, 21b, and 22, and the reticle are moved upon changes in other optical characteristics such as the curvature of field and the magnification in accordance with the change in illumination condition described above.

Every time the illumination condition is changed, focus calibration may be performed, or the distortion or the like may be measured to perform correction.

In the above embodiment, the reticle R or the lens elements 20, 21a, 21b, 22, and 23 of the projection optical system are moved. However, the aberration state may be changed by moving the projection optical system as a whole. The present invention can be achieved even if the projection optical system is vertically moved as a whole by a drive member. In addition, the movement of the reticle R and the projection optical system as a whole may be combined with movement of some lenses.

The present invention exemplifies the projection exposure apparatus, but can equally be applied to a reflection or reflection/refraction exposure apparatus. When the present invention is applied to a reflection/refraction exposure apparatus having a projection optical system including a reflecting mirror, the same effect as described above can be obtained even if the reflecting mirror is moved in place of the lens.

Figure 6:
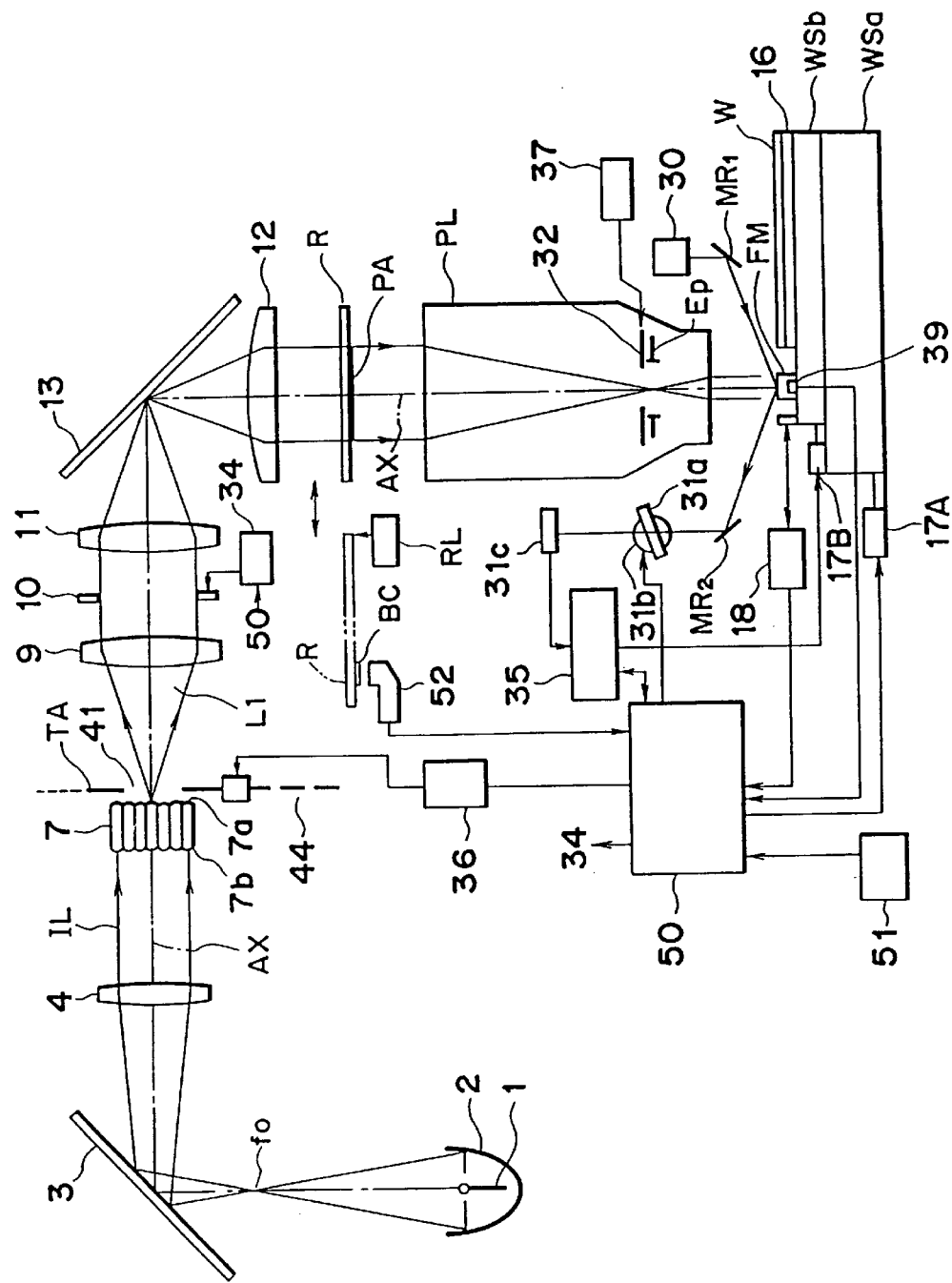
FIG. 6 is a schematic view showing the arrangement of a projection exposure apparatus according to the second embodiment of the present invention.

The second embodiment of the present invention will be described with reference to FIGS. 6 to 10B. FIG. 6 is a schematic view showing the arrangement of a projection exposure apparatus according to the second embodiment. The same reference numerals as in FIG. 1 denote the same parts in FIG. 6, and only differences between the first and second embodiments will be described below. Referring to FIG. 6, a stop 41 having a circular aperture (a rectangular aperture may be used in place of the circular aperture) having as its center an optical axis AX of an illumination optical system is arranged near an exit surface 7a of a fly-eye lens 7. This stop 41 is selected from a plurality of aperture stops formed on a rotary plate TA. The numerical aperture of the illumination optical system is determined in accordance with the size of the aperture of the aperture stop 41, and the numerical aperture determines a σ value.

Although not shown in FIG. 1, the rotary plate TA has the plurality of aperture stops whose apertures have different sizes. The rotary plate TA is driven by a driver 36 to change the aperture size. The rotary plate TA also includes other aperture stops such as an aperture stop 44 having an annular transparent portion having the optical axis as its center, so that the aperture size can be arbitrarily selected by driving the rotary plate TA. The aperture size may also be changed by arranging a variable aperture stop. On the other hand, the exit surface 7a of the fly-eye lens 7 is located on the plane perpendicular to the optical axis AX so that it coincides with a Fourier transform plane (pupil conjugate plane) of the pattern surface of a reticle R. An incident surface (light source side) 7b of the fly-eye lens 7 has a Fourier transform relationship with the exit surface (reticle-side focal plane) 7a. In the arrangement of FIG. 6, the light-source surface 7b of the fly-eye lens 7 has an imaging relationship (conjugate) with the pattern surface of the reticle R.

A method of variably setting the σ value is not limited to use of an aperture stop. As shown in FIG. 7, an afocal variable magnification optical system 90 may be arranged in a parallel optical path between an input lens 4 and the fly-eye lens 7 to change the secondary source image formed on the exit surface 7a of the 7 in accordance with the variable magnification operation of the afocal variable magnification optical system 90. This adjustment is performed by a driver 91.

FIGS. 7A and 7B show the states of the optical arrangement closer to the light source than the fly-eye lens 7 shown in FIG. 6. Referring to FIGS. 7A and 7B, the afocal variable magnification optical system 90 comprises a positive first lens group 90a, a negative second lens group 90b, and a positive third lens group 90c. As shown in FIGS. 7A and 7B, the variable magnification can be achieved by moving the lenses (90a to 90c) to variably form an image on the exit side of the fly-eye lens without reducing the size of the secondary source. Even if the variable magnification is performed by the afocal variable magnification optical system 90, the incident surface 7b of the fly-eye lens 7 is almost conjugate with an aperture 2a of an elliptical mirror 2 with respect to the input lens 4 and the afocal variable magnification optical system 90. Therefore, the σ value can be efficiently set variable while the double conjugate relationship between the object plane and the pupil plane (Fourier plane) is maintained.

A driver 37 drives a variable aperture stop (NA stop) 32 to variably change the size of a pupil plane Ep of the projection optical system. A numerical aperture NA of a projection optical system PL is changed to a desired value.

A wafer W is drawn by vacuum suction on a wafer holder 16, and the wafer holder 16 is arranged on a Z stage WSb movable in the Z direction (direction of optical axis) by a motor 17B. The Z stage WSb is arranged on an XY stage WSa two-dimensionally movable by a motor 17A.

A reference member (glass substrate) FM having fiducial marks used for detecting a focal position (imaging position) is arranged on the Z stage WSb so that the surface of the reference member is almost aligned with the upper surface of the wafer W. Although not shown in this embodiment, two sets of light-transmitting slit patterns (bar patterns) extend as the fiducial marks in the X and Y directions. A photoelectric detector 39 comprising a PIN diode or the like is arranged adjacent to the reference member FM inside the Z stage WSb. In this embodiment, the photoelectric detector 39 is arranged to receive, through the slit patterns on the reference member FM, illumination light passing through a focus detection measurement pattern (e.g., a light-transmitting cross slit). The projection image of a circuit pattern is not formed on the wafer W but on the reference member FM in FIG. 6. An amount of light passing through the reference member FM and reaching the photoelectric detector 39 is detected while the Z stage WSb is driven, thereby detecting the imaging position (focal position) of the focal position measurement pattern by the projection optical system PL. Note that this focus detection method is disclosed in U.S. Pat. No. 4,629,313.

A gap sensor AF (the same as the focus sensors 30 and 31 in FIG. 1) for detecting a distance between the projection optical system PL and the wafer W is arranged in the projection exposure apparatus shown in FIG. 6. A beam from the light-emitting optical system 30 inclined with respect to the optical axis AX is obliquely incident toward a predetermined imaging plane of the projection optical system PL through a mirror $MR_1$. A detector 31c receives the light reflected by the wafer W (or the reference member FM) through a mirror $MR_2$ and plane parallel glass 31a. The detector 31c is a one-dimensional position-detector comprising, e.g., a CCD, and detects a change in Z-direction position as a change in position on the position detector. An autofocus controller 35 outputs a drive signal to the motor 17B so that the reflected light is received by the center of the position detector, thereby driving the Z stage WSb. The upper surface of the wafer W can always be aligned with the predetermined imaging plane by the gap sensor AF.

In order to give an offset value to the gap sensor AF, the angle of the plane parallel glass 31a is changed by a driver 31b to shift the reflected light incident position from the center of the position detector, thereby providing an offset to the output from the position detector.

The gap sensor AF is not limited to this arrangement. An arrangement using a synchronous detection method as in the focus sensors 30 and 31 in FIG. 1, as disclosed in U.S. Pat. No. 4,650,983, can be used as the gap sensor AF. Alternatively, a gap sensor for detecting reflected light on a plurality of divided detectors thereof upon emission of slit-like light to cover the entire area of the image field of the projection optical system may be used.

In this embodiment, in particular, a focus offset value for giving an offset value to the gap sensor AF as one of the parameters in accordance with the σ value and the numerical aperture is stored in a main controller 50 in correspondence with the reticle name (bar code information). An offset value corresponding to a change in axial position of the predetermined imaging plane upon at least one of a change in illumination condition such as the σ value and a change in NA is selected as a parameter.

The focus offset value is obtained in accordance with the illumination condition (e.g., the σ value), the numerical aperture NA, and the like and serves as information corresponding to the change in the predetermined imaging plane. This offset value may be recorded on the reticle as the bar code information.

Preliminary printing may be performed to obtain an optimal imaging plane under each illumination condition, and this optimal imaging plane may be recorded on the reticle as the bar code information or may be stored in a memory in the main controller 50 in correspondence with the reticle name (bar code information).

The above operations may be made such that the operator directly input commands and data to the main controller 50 with a keyboard 51.

Every time at least one of the σ value, the numerical aperture NA, and the illumination light shape is selected/set, the reference member FM (or the pattern plate 15 in FIGS. 1 and 30) is used to obtain an optimal imaging plane, and the optimal imaging plane information may be stored in the memory of the main controller 50.

Figure 8A:
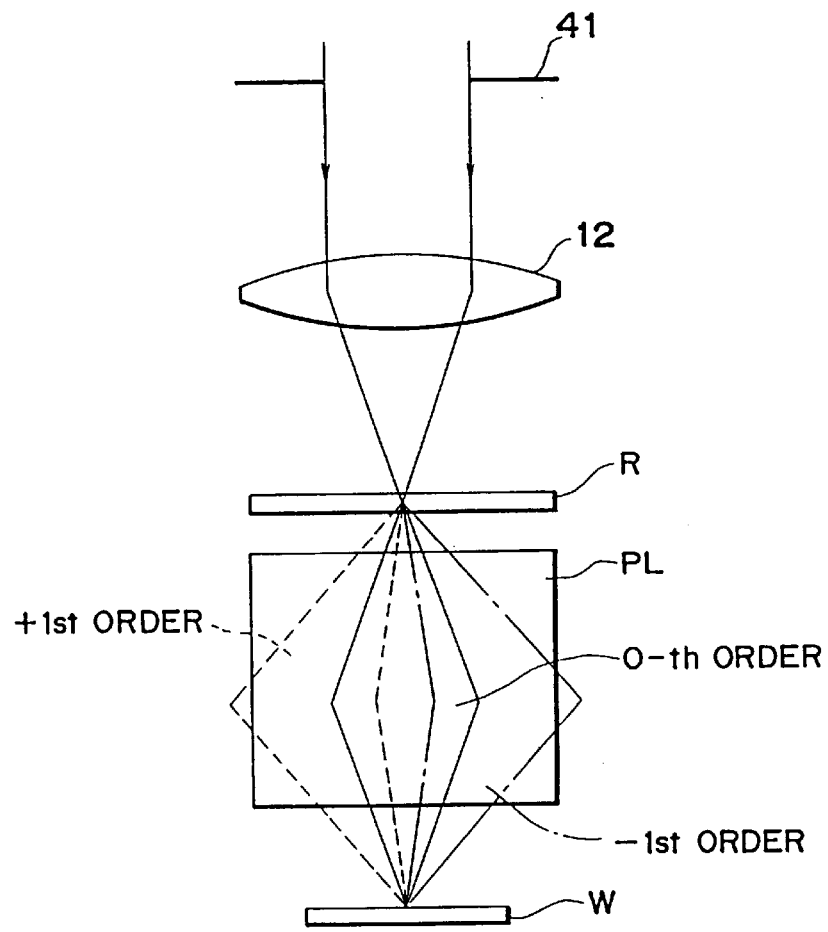
FIG. 8A is a view showing an optical path of illumination light at a relatively large σ value in the apparatus shown in FIG. 6.
Figure 8B:
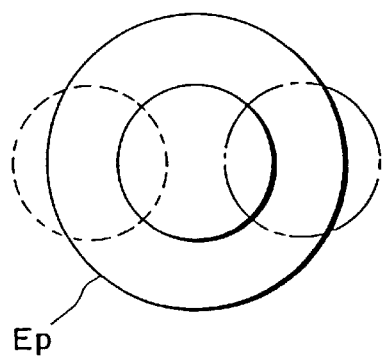
FIG. 8B is a view showing diffracted light components on a pupil plane of a projection optical system in FIG. 8A.
Figure 9A:
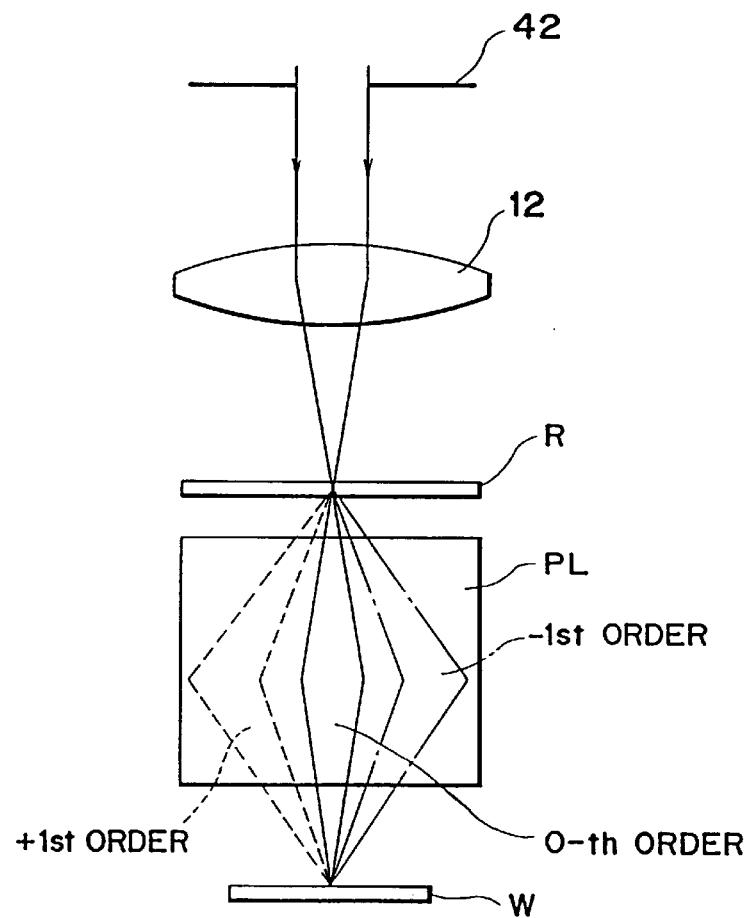
FIG. 9A is a view showing an optical path of illumination light at a relatively small σ value in the apparatus shown in FIG. 6.
Figure 9B:
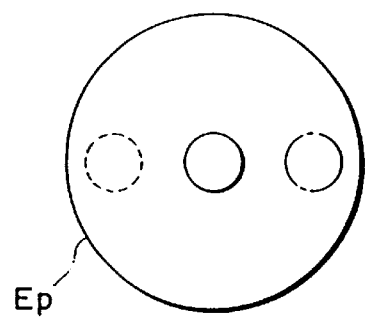
FIG. 9B is a view showing diffracted light components on a pupil plane of a projection optical system in FIG. 9A.
Figure 10A:
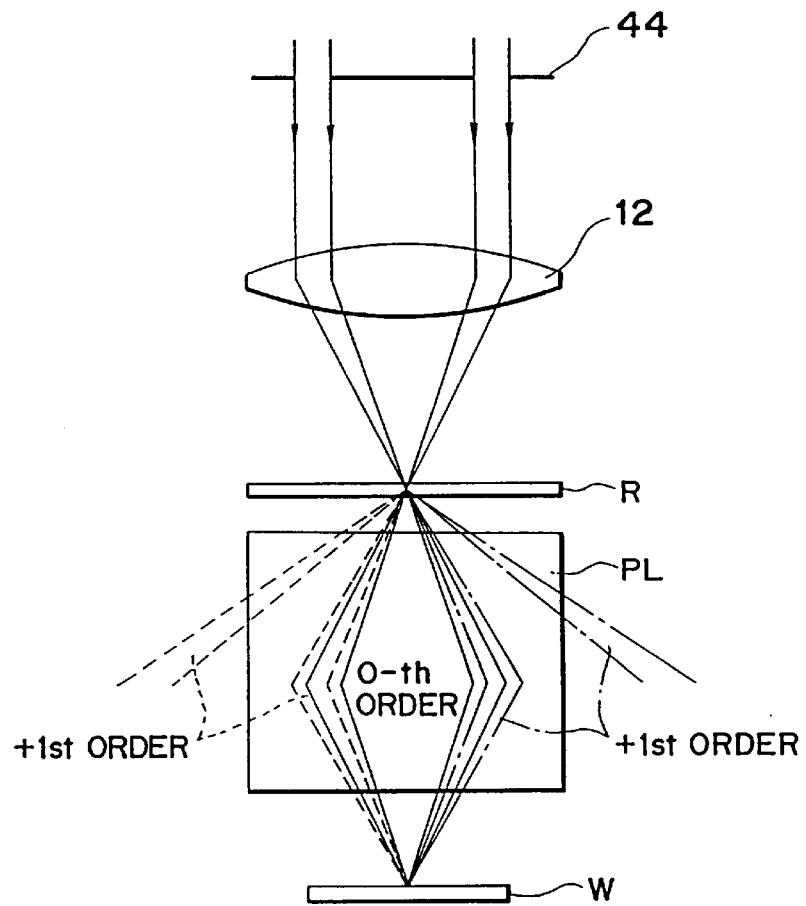
FIG. 10A is a view showing an optical path of illumination light when an annular aperture stop is arranged in the apparatus shown in FIG. 6.
Figure 10B:
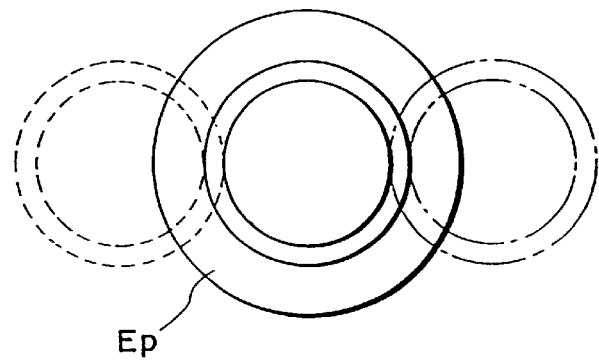
FIG. 10B is a view showing diffracted light components on a pupil plane of a projection optical system in FIG. 10A.

The position of the beam passing through the pupil plane Ep of the projection optical system PL varies in accordance with the shape of the aperture stop selected by the reticle. This state is shown in FIGS. 8A, 8B, 9A, 9B, 10A, and 10B. The solid line in each of FIGS. 8A, 9A, and 10A represents a 0-th-order diffracted light component, the alternate long and short dashed line represents a −1st-order diffracted light component, and the dotted line represents a +1st-order diffracted light component. Only a lens 12 is illustrated while the relay lenses 9 and 11 in FIG. 6 are omitted. FIG. 8A shows the basic optical path when the size of the aperture is set to correspond to the σ value of about 0.5 (i.e., an aperture stop 41). FIG. 8B shows the spread of the 0-th- and ±1st-order diffracted light components on the pupil plane Ep of the projection optical system PL of FIG. 8A. FIG. 9A shows the basic optical path when the size of the aperture is set to correspond to the σ value of about 0.3 (i.e., an aperture stop 42). FIG. 9B shows the spread of the 0-th- and ±1st-order diffracted light components on the pupil plane Ep of the projection optical system PL of FIG. 9A. FIG. 10A shows the basic optical path when an annular stop 44 having the annular transparent portion is used, and FIG. 10B shows the spread of the 0-th- and ±1st-order diffracted light components on the pupil plane Ep of the projection optical system PL of FIG. 10A. The beams passing through the pupil plane Ep have different positions depending on the shapes of the apertures and have different spherical aberration values and different absorption amounts, as shown in FIGS. 8B, 9B, and 10B.

In annular illumination shown in FIG. 10B, no beam including the component along the optical axis AX within the pupil plane Ep is absent. The Z-direction position of the optimal imaging plane is changed in the presence of the spherical aberration. Referring to FIGS. 8B and 9B, the positions (or shapes) of the beams passing through the pupil plane Ep and the sizes of the aperture stops are different. For this reason, the absorption amounts and the spherical aberration amounts are different in FIGS. 8B and 9B, so that the positions of the optimal imaging planes are changed. In addition, when a lens inside the projection optical system is heated by light absorption, a change in refractive index and expansion occur. The focal position of the projection optical system may be changed in accordance with these changes of the lens. For this reason, an offset must be supplied to the gap sensor AF for each illumination light shape, depending on the light absorption amount and the residual spherical aberration.

The typical operation of this embodiment will be described below.

A bar code BC formed on the reticle R is read by a bar code reader 52 to select an optimal illumination condition (e.g., an illumination light shape and a σ value) and the numerical aperture, both of which correspond to the reticle. The aperture stop 41 for obtaining the illumination condition shown in FIG. 8A is selected by the driver 36 on the basis of the information of the bar code BC.

Reticle exchange is performed by a reticle convey system RL. The bar code BC formed on the exchanged reticle is read by the bar code reader 52 to select an optimal illumination condition. In this case, the annular stop 44 shown in FIG. 10A is selected. The bar code information includes the illumination condition (e.g., the σ value) and the NA information. A focus offset value is obtained from the bar code information and the information stored in the main controller 50, and an electrical or optical offset amount is given to the gap sensor AF. Therefore, even if the illumination condition (e.g., the σ value) and the NA are changed, exposure can be performed while the surface of the wafer W can be kept aligned with the optimal imaging plane.

The Z stage WSb may be vertically moved by an amount corresponding to the focal difference, and the plane parallel glass 31a may be driven so that the reflected light is incident on the center of the position detector 31c to perform the focus calibration. Alternatively, the Z stage WSb may be moved so that the surface of the reference member FM is located at this focal position, and focus calibration may be performed at this focal position.

Alternatively, an offset value may be added to the axial position of the reticle or the Z stage WSb.

When the projection exposure apparatus of this embodiment has a control system for controlling the pressure between a plurality of lens elements, imaging variations occur due to the accumulation of the irradiation amount of light on the projection optical system, so that the plane parallel glass is subjected to tracking control to sequentially offset the focus position. As in this embodiment, the offset value for the variation in the imaging plane position which is caused by a change in at least one of the illumination condition (e.g., the σ value) and the numerical aperture NA can be applied as a correction value (predetermined value) to the tracking control signal. The control system for controlling the pressure between the plurality of lens elements and tracking control is disclosed in U.S. Pat. No. 4,801,977.

Figure 11:
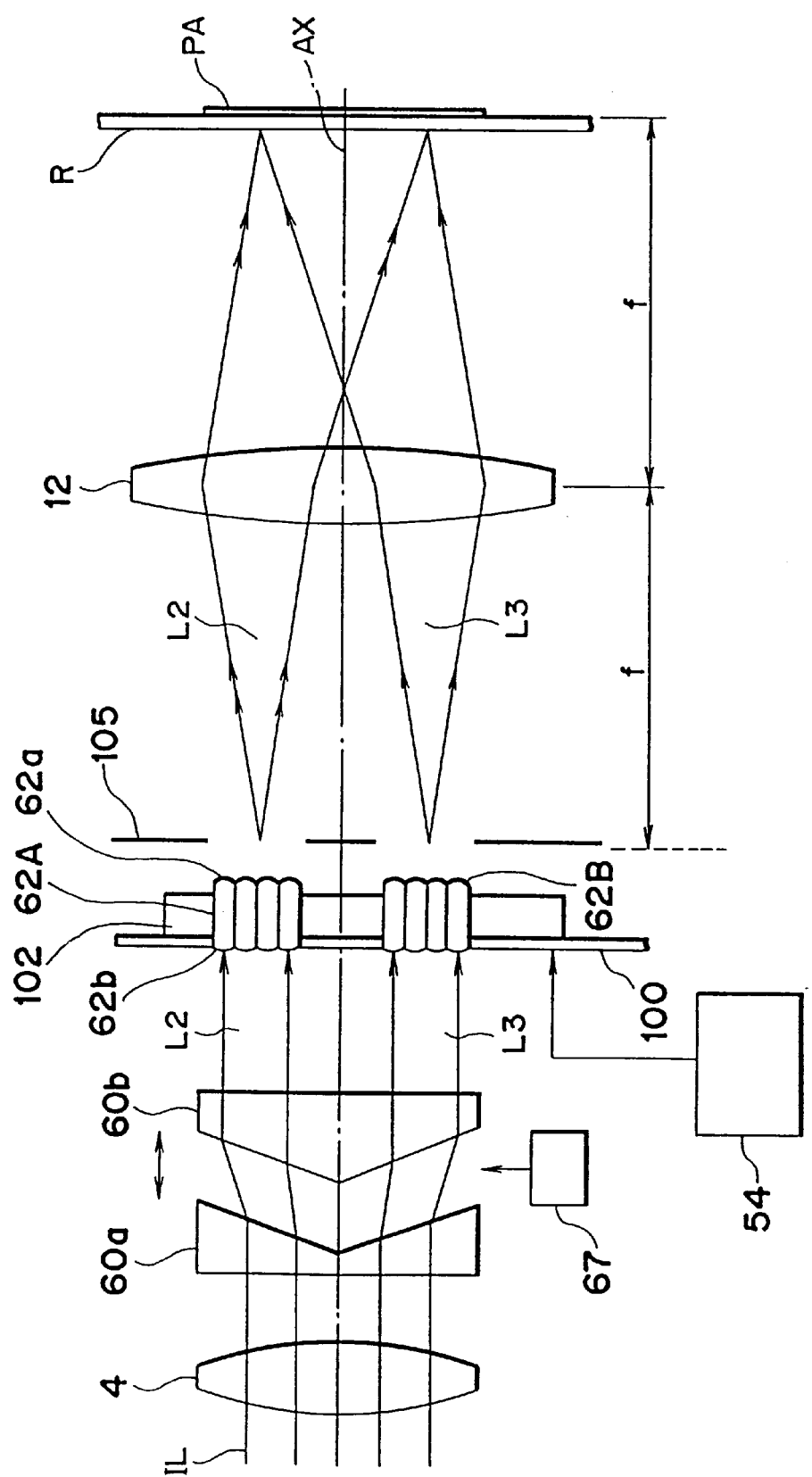
FIG. 11 is a view showing part of a projection exposure apparatus according to the third embodiment of the present invention.

The third embodiment of the present invention will be described with reference to FIGS. 11, 12, 13A, and 13B. The third embodiment employs the oblique illumination method (i.e., the modified light source method) described with reference to the first embodiment. Since the arrangement of the illumination optical system of the third embodiment is partially different from that of the first embodiment, only different parts will be described below. FIG. 11 shows a portion corresponding to the lens 4 to the reticle R in FIG. 6. In this case, the relay lenses 9 and 11, the variable blind 10, and the mirror 13 are not illustrated. Other arrangements in the third embodiment are the same as those of the first embodiment, and a detailed description thereof will be omitted. The same reference numerals as in FIGS. 1 and 6 denote the same parts in FIG. 12.

Exposure light IL from a light source in FIG. 11 is incident on beam splitting members 60a and 60b through a lens 4. The beam splitting members are a first polygonal prism 60a having a V-shaped concave portion and a second polygonal prism 60b having a V-shaped convex portion. The illumination light EL is split into two beams by the refractive behaviors of these two prisms. The split beams are incident on fly-eye lenses 62A and 62B, respectively.

Beams L2 and L3 emerging from the fly-eye lenses 62A and 62B inclined from an optical axis AX are incident on a reticle R at a predetermined inclination angle through a lens 12. Reticle-side focal planes 62a of the fly-eye lenses 62A and 62B are located at a position coinciding with a Fourier transform plane with respect to the pattern surface of the reticle R. A spatial filter 105 having apertures having sizes corresponding to the sizes of the fly-eye lenses 62A and 62B is arranged near the reticle-side focal planes 62a of the fly-eye lenses 62A and 62B to shield the unnecessary rays.

A holding member 102 integrally holds the fly-eye lenses 62A and 62B so that the centers (in other words, the centers of gravity of the light amount distributions of the secondary sources of the fly-eye lenses 62A and 62B) of the fly-eye lenses 62A and 62B are located at discrete positions eccentric from the optical axis AX by an amount determined the periodicity of the reticle pattern. A plurality of holding members (not shown) for holding the plurality of fly-eye lenses so as to differentiate eccentric states thereof with respect to the optical axis AX in accordance with the periodicity differences of the reticle patterns are integrally fixed together with the holding member 102 on a movable member 100 (turret plate). When the movable member 100 is driven by a drive system 54 to exchangeably place each of the plurality of holding members in the optical path of the illumination optical system.

The structure of the movable member 100 for holding member exchange will be described with reference to FIG. 12.

Figure 12:
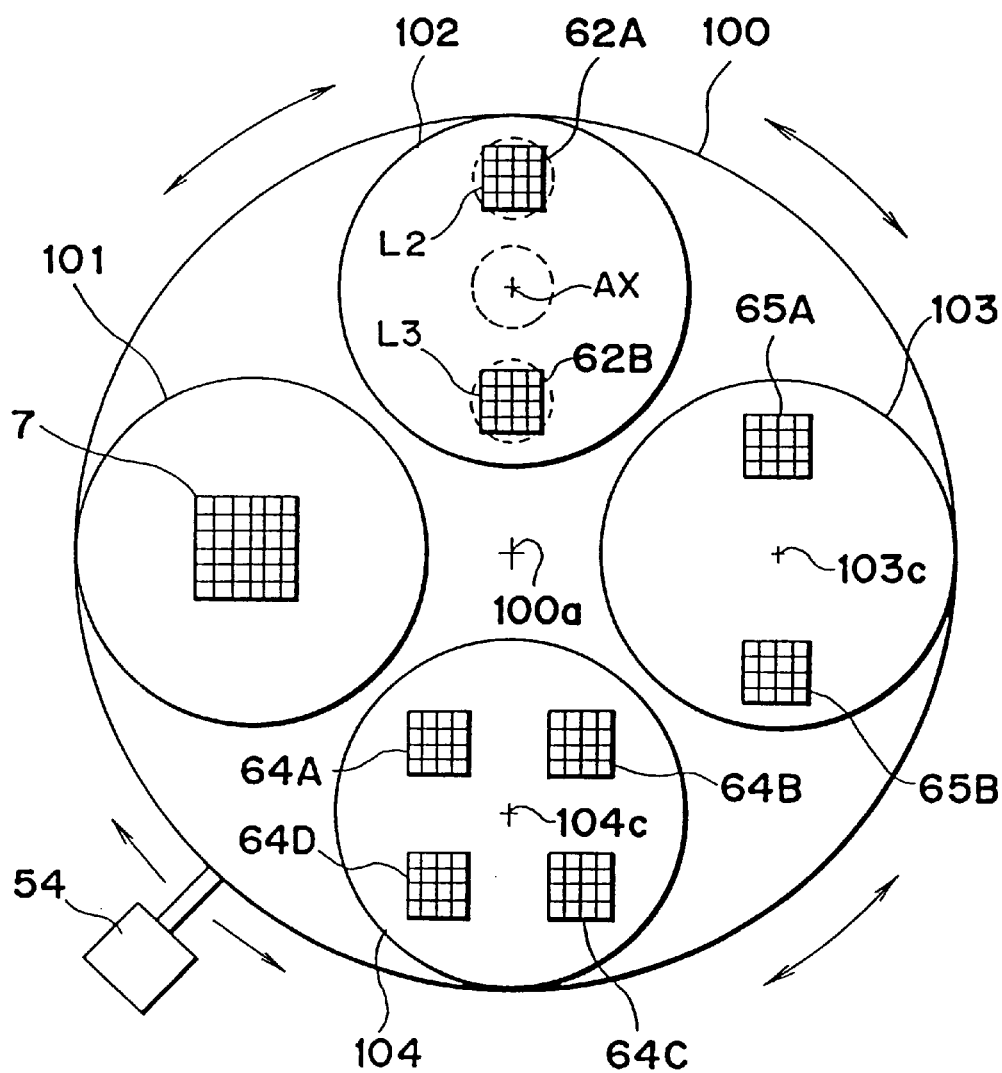
FIG. 12 is a view showing a switching member according to the third embodiment of the present invention.

FIG. 12 is a view showing the detailed structure of the movable member. Four holding members 101 to 104 are arranged on the movable member (turret plate) rotatable about a rotating shaft 100a at equal angular Intervals of about 90°. In FIG. 12, illumination beams L2 and L3 are incident on the fly-eye lenses 62A and 62B, respectively, and the holding member 102 is located in the optical path of the illumination optical system. At this time, the holding member 102 is located in the illumination optical system so that the center of the holding member 102 is almost aligned with the optical axis AX. The two fly-eye lenses 62A and 62B are integrally held by the holding member 102 so that the centers are located at discrete positions eccentric from the optical axis AX of the illumination optical system by an amount determined by the periodicity of the reticle pattern. In this case, the two fly-eye lenses 62A and 62B are located almost symmetrical about the center (the optical axis AX) of the holding member 102.

The four holding members 101 to 104 hold the plurality of fly-eye lenses at different eccentric states (i.e., positions within the plane almost perpendicular to the optical axis AX) with respect to the optical axis AX (the center of the holding member) in accordance with the periodicity differences of the reticle patterns. Each of the holding members 102 and 103 has two fly-eye lenses 62A and 62B (or 65A and 65B). When these fly-eye lenses are located in the illumination optical system, their alignment directions are almost perpendicular to each other. The holding member 104 has four fly-eye lenses 64A, 64B, 64C, and 64D which are arranged and fixed equidistantly from a center 104C (the optical axis AX). The holding member 101 is fixed so that the center of one fly-eye lens 7 is almost aligned with the center of the holding member. This is used in exposure in an illumination state of the second embodiment (FIG. 6). Note that aperture stops may be integrally held together with the fly-eye lenses on the holding members 101 to 104, if required.

When the turret plate 100 is rotated by the drive system 54 including a motor and gears in accordance with information of the reticle bar code BC to selectively exchange the four holding members 101 to 104, so that a desired holding member can be located in the illumination optical system in accordance with the periodicity (e.g., the pitch and aligning direction) of the reticle pattern. In addition, when the distance between the prisms or beam splitting members 60a and 60b is adjusted in accordance with a drive member 67 to change the position of the illumination beam on the Fourier transform plane. Therefore, different illumination beams can be incident depending on the fly-eye lenses having different eccentric states. A fly-eye lens may be held integrally with a beam splitting member, and this integral body may be exchanged.

Exposure (normal illumination) as in the second embodiment or oblique illumination is selected in accordance with the information of the reticle bar code BC. When exposure using normal illumination is to be performed, the holding member 101 may be selected. However, when oblique illumination is to be performed, one of the holding members 102 to 104 may be selected. When exposure is to be performed in accordance with a conventional scheme, the holding member 101 is selected, and the beam splitting members are replaced with a predetermined optical system. If the lens 4 can focus illumination light on the fly-eye lens, the beam splitting members are simply retracted from the optical path.

In the arrangement of FIG. 11, the spatial filter 105 is arranged behind (reticle side) the holding member 102. If a portion except for the fly-eye lens or lenses in each of the holding members serves as a light-shielding portion, the spatial filter need not be arranged. In this case, the turret plate 100 may be a transparent or light-shielding portion. In addition, the number of holding members fixed on the turret plate 100 and the eccentric states (positions) of the plurality of fly-eye lens groups are not limited to those illustrated in FIG. 12, but can be arbitrarily set in accordance with the periodicity of a reticle pattern to be transferred. When the incident angle of an illumination beam incident on a reticle pattern must be strictly set, the plurality of fly-eye lenses may be finely movable in the radial direction with respect to the optical axis AX as the center, and the holding members (fly-eye lenses) may be arranged to be rotatable about the optical axis AX. In this case, when a fiber bundle is used as a beam splitting member, the exit end of the fiber bundle is set movable upon movement of the fly-eye lens. For example, the exit end and the fly-eye lens are integrally fixed. Although a rectangular fly-eye lens is relatively inclined upon rotation of the corresponding holding member, no inclination occurs if the holding member is rotated. It is thus preferable that only the position of each fly-eye lens is moved. Note that although the fly-eye lens has a square shape, four sides of the fly-eye lens are not preferably rotated with respect to the four sides of the reticle.

For example, the diameter (i.e., the exit end area of each fly-eye lens) of each aperture of the spatial filter for the holding member 104 is preferable set in such a manner that a ratio of the reticle-side numerical aperture ($NA_R$) of the projection optical system PL to the numerical aperture corresponding to the reticle R having the aperture through which the illumination beam passes, i.e., the σ value, falls within the range of about 0.1 to 0.3. When the σ value is smaller than 0.1, the pattern image cannot be faithfully transferred. When the σ value is larger than 0.3, the effect for increasing the resolving power and the depth of focus is weakened.

In order to satisfy the range ($0.1 \leq \sigma \leq 0.3$) of the σ value determined by one fly-eye lens, the size (i.e., the size within the plane perpendicular to the optical axis) of the exit end area of each fly-eye lens may be determined in accordance with the size of the illumination beam (exit beam).

A variable aperture stop (equivalent to the spatial filter 105) may be arranged near the reticle-side focal plane of each fly-eye lens, and the numerical aperture of the fly-eye lens may be set variable, thereby changing the σ value. In addition to this, the numerical aperture NA of the projection system may be set variable by a variable aperture stop (NA stop) 32 arranged near the pupil (entrance pupil or exit pupil) Ep within the projection optical system PL. In addition, the σ value may be optimized using the zoom lens system shown in FIGS. 7A and 7B.

In the oblique illumination described above, since the positions and shapes of beams passing through the pupil plane Ep are different depending on the positions of the beams and the number of beams in units of illumination conditions, the focal position is changed. A change in focal position also occurs by switching between oblique illumination and normal illumination shown in the second embodiment. For these reasons, an offset value corresponding to each oblique illumination condition is stored in a main controller 50, and the offset value may be supplied to the gap sensor AF in accordance with switching between the illumination states or focus calibration may be performed every switching between the illumination states.

In the above embodiment, most of the optical members in the illumination optical system are lenses. However, the lenses may be replaced with mirrors (concave and convex mirrors). The projection optical system may be a refraction system, a reflection system, or a reflection/refraction system.

In the above embodiment, the projection optical system having both telecentric surfaces is used. However, a projection optical system having one telecentric surface or no telecentric surface may be used. In addition, a monochromatic means such as an interference filter may be arranged in the illumination optical system to utilize only light having a specific wavelength from the illumination light components emitted from a light source.

The operation of this embodiment will be described below.

Switching from two illumination beams to four illumination beams will be exemplified below. When the number of beams is switched from two to four, a focus offset value is obtained on the basis of switching information (e.g., information of a bar code or from a keyboard). In the same operation as in the second embodiment, an offset value is supplied to the gap sensor AF, or focus calibration is performed every switching between the illumination states.

When the positions of the four (or two) illumination beams are changed, an offset value is supplied to the gap sensor AF or focus calibration is performed every switching between the illumination states in the same operation as in the second embodiment on the basis of the switching information.

When switching is to be performed from conventional illumination (normal illumination) to oblique illumination, an offset value is supplied to the gap sensor AF or focus calibration is performed every switching between the illumination states in the same operation as in the second embodiment on the basis of the switching information. In this case, when the offset amount or value exceeds a drive amount of the plane parallel glass 31a or the electrical offset amount, automatic focus calibration may be performed.

Even if normal illumination is to be switched to oblique illumination using one beam, focus variations can be corrected in the same operations as described above.

Figure 13A:
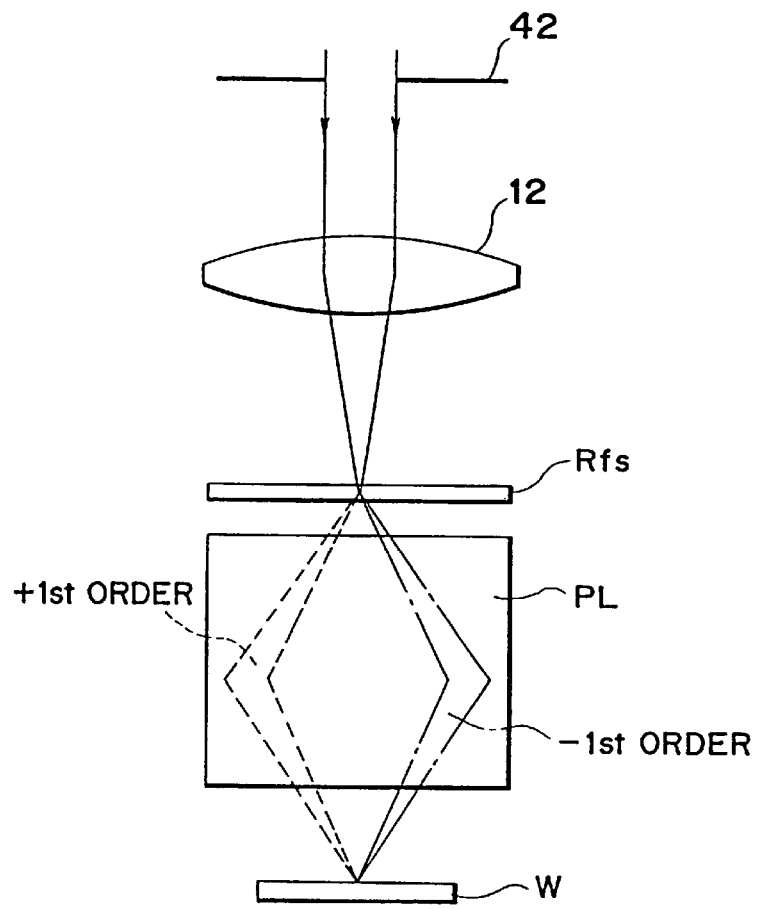
FIG. 13A is a view showing a beam passing through a projection optical system when a phase shifting reticle is used.
Figure 13B:
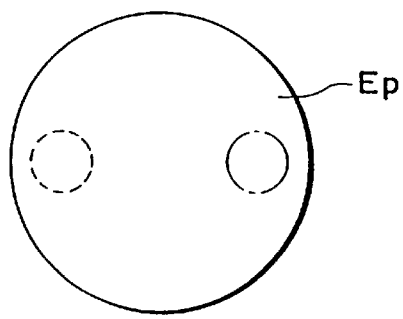
FIG. 13B is a view showing diffracted light components on a pupil plane of the projection optical system in FIG. 13A.

On the other hand, FIG. 13A is a view showing the optical path of diffracted light components from a phase shifting reticle, and FIG. 13B is a view showing states of the diffracted light components on the pupil plane Ep. In FIG. 13A, the alternate long and short dashed line represents a −1st-order diffracted light component, and the dotted line represents a +1st-order diffracted light component. The lenses 9 and 11, and the mirror 13 in FIG. 6 are not illustrated in FIG. 13A. When a phase shifting reticle $K_{FS}$ is used, a plurality of beams (±1st-order diffracted light components) pass positions eccentric from the optical axis on the pupil plane Ep, as in the oblique illumination described with reference to the third embodiment. When the normal reticle is switched to the phase shifting reticle, an offset value must be supplied to the gap sensor AF, or the focus calibration must be performed every exchange as in the third embodiment.

When oblique illumination using the normal reticle is switched to use of the phase shifting reticle, an offset value must be supplied to the gap sensor AF or the focus calibration must be performed every exchange.

The positions and shapes of the beams formed on the pupil plane Ep are different depending on the types of phase shifting reticles. In this case, an offset value must be supplied to the gap sensor AF, or the focus calibration must be performed every exchange.

All cases having different imaging states in the second and third embodiments are as follows:

1 Normal illumination is performed;
2 Annular illumination is performed;
3 Oblique illumination is performed;

4 A phase shifting reticle is used;

5 A variable numerical aperture NA is used; and

6 A variable σ value is used.

A focus offset value is obtained in advance every switching of each of the cases 1 to 4 or every change in condition of each of the cases 3 and 4. When each case is selected, the corresponding offset value stored in the memory is supplied to the gap sensor AF. Therefore, even if the imaging state is changed, exposure can always be performed at the optimal focal position under the condition that the stored offset amount is supplied to the gap sensor AF.

Figure 14:
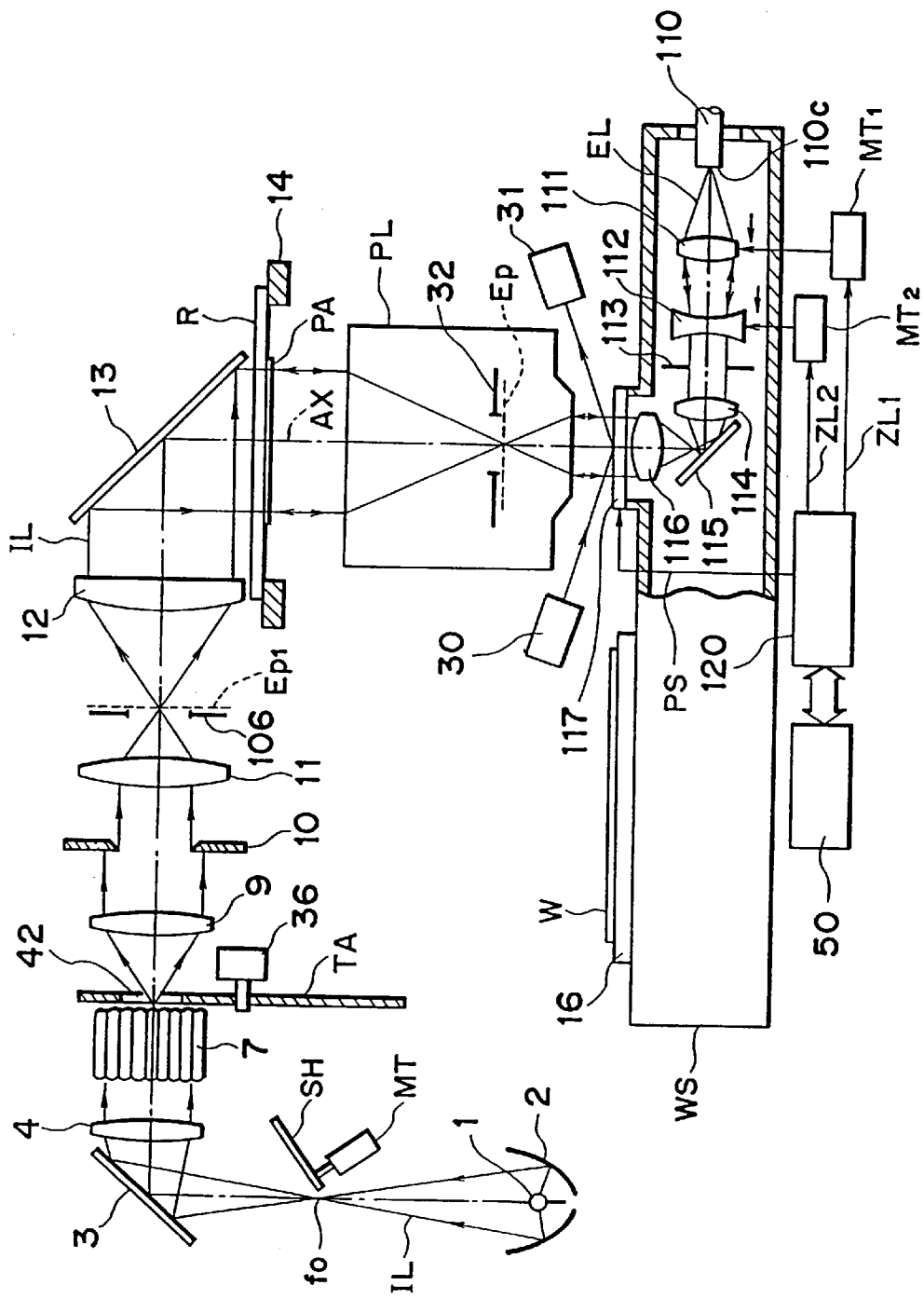
FIG. 14 is a schematic view showing the arrangement of a projection exposure apparatus according to the fourth embodiment of the present invention.

The fourth embodiment of the present invention will be described with reference to FIGS. 14, 15, 16A, and 16B. FIG. 14 is a schematic view showing a projection exposure apparatus according to the fourth embodiment. The same reference numerals as in FIGS. 6 and 30 denote the same parts in FIG. 14, and a detailed description thereof will be omitted. This embodiment (FIG. 14) has a detection system having almost the same arrangement as that of the focal position detection system in FIG. 30. Referring to FIG. 14, illumination light EL is radiated from a merged end 110c of a two-split fiber bundle 110 (branch ends 110a and 110b are not illustrated in FIG. 14) as in FIG. 30 to the interior of a wafer stage WS. A lens system 111 having a positive refracting power and a lens system 112 having a negative refracting power constitute a zoom lens. After the illumination light EL emerging from the emerged end 110c is almost collimated by the zoom lens constituted by the lens systems 111 and 112, the illumination light EL is radiated on a field stop 113. The illumination light EL limited by the field stop 113 is guided to the aperture pattern formation surface of a pattern plate 117 through a relay lens 114, a mirror 115, and a condenser lens 116. The pattern plane 117 is arranged so that the aperture pattern shape can be arbitrarily changed.

The illumination light EL passing through the pattern plate 117 is guided to a pattern area PA of the lower surface of a reticle R through a projection optical system PL. The light reflected by the pattern area PA returns to the inside of the wafer stage WS through the projection optical system PL and the aperture pattern of the pattern plate 117. This return light is incident on the merged end 110c of the fiber bundle 110 through the condenser lens 116, the mirror 115, the relay lens 114, the field stop 113, and the zoom lens constituted by the lens systems 112 and 111. This incident light is incident on a photoelectric sensor PD from the other branch end 110b of the fiber bundle 110 in the same manner as in FIG. 30.

An optical characteristic control circuit 120 supplies a pattern control signal PS to the pattern plate 117 in accordance with designation from a main controller 50 to set the shape and the degree of micropatterning (e.g., the pitch and line width) of the aperture pattern of the pattern plate 117. The optical characteristic control circuit 120 supplies lens dive signals ZL1 and ZL2 to motors $MT_1$ and $MT_2$ in accordance with designation from the main controller 50 to move the lens systems 111 and 112 in the direction of optical axis, thereby changing the numerical aperture NA of the zoom lens constituted by the lens systems 111 and 112 for the merged end 110c of the fiber bundle 110. A $\sigma_{EL}$ value as the σ value of the illumination system for illuminating the pattern plate 117 with the illumination light EL is changed. Although not shown, a holding member (e.g., corresponding to a rotary plate TA in FIG. 14) having aperture stops having different shapes is arranged near the exit surface of the merged end 110c of the fiber bundle 110 or on a plane almost conjugate with the exit surface of the merged end 110c between the relay lens 114 and the condenser lens 116. The optical characteristic control circuit 120 can select a desired one of the plurality of aperture stops of the holding member. Therefore, oblique illumination can be performed even for an aperture pattern.

A variable aperture stop 32 is arranged on a pupil plane Ep of the projection optical system PL or on a plane near the pupil plane Ep. The main controller 50 can also control the state of the variable aperture stop 32. As shown in FIGS. 1 and 6, a bar code representing the kind (or name) of reticle R is recorded on the reticle R. When the bar code is read by a bar code reader (not shown in FIG. 14), the main controller 50 can recognize the type of reticle R and the minimum line width subjected to the exposure target. For example, when the minimum line width of the present reticle R is very small, the main controller 50 adjusts the variable aperture stop 32 to increase the numerical aperture NA of the projection optical system PL. As will be described below, the rotary plate TA may be set through a drive motor 36 to perform oblique illumination for the reticle R.

Figure 15:
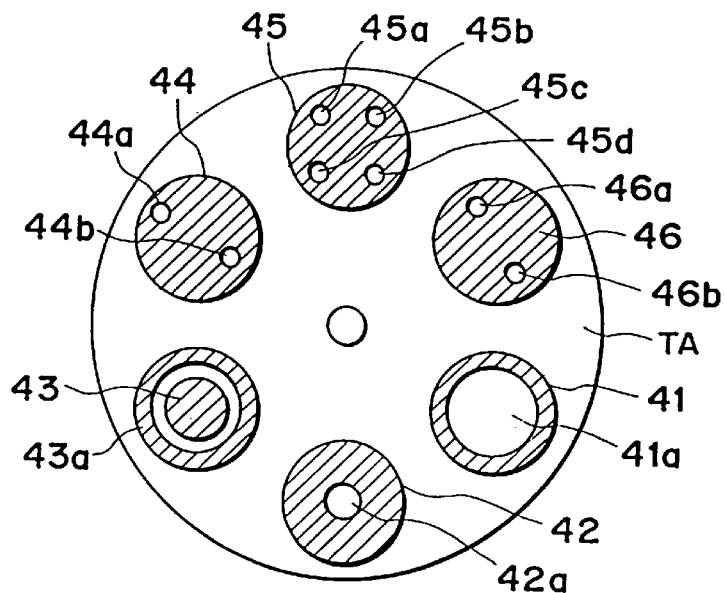
FIG. 15 is a view showing the detailed arrangement of a rotary plate in FIG. 14.

The arrangement of an illumination system for exposure light IL for illuminating the reticle R will be described below. Only differences between FIGS. 14 and 6 will be described below. Referring to FIG. 14, a shutter SH is arranged between an elliptical mirror 2 and a mirror 3 (near a second focal point $f_0$ of the elliptical mirror 2). The shutter SH is rotated by the motor MT to shield the exposure light IL, as needed. The rotary plate TA is arranged near the exit end face of a fly-eye lens 7. The rotary plate TA is also located to a predetermined position by the motor 36. As shown in FIG. 15, the rotary plate TA has, e.g., six different aperture stops 41 to 46 spaced apart from each other at equal angular intervals. Of these aperture stops, each of the aperture stops 41 and 42 has circular apertures 41a and 42a having different diameters. The aperture stop 43 has an annular aperture 43a. The oblique illumination aperture stops 44 and 46 have pairs of apertures 44a and 44b and 46a and 46b, respectively. The oblique illumination aperture stop 45 has four apertures 45a to 45d spaced apart from each other at equal angular intervals with respect to the optical axis as its center.

The variable aperture stop located near the merged end 110c of the fiber bundle 110 also has, e.g., six different apertures similar to those in FIG. 15.

When the aperture stops 44 to 46 of the rotary plate TA are used, illumination beams from the respective apertures have σ values preferably falling within the range of about 0.1 to 0.3. It is also preferable to finely adjust the positions of the apertures in the aperture stops 44 to 46 in accordance with a degree of micropatterning (e.g., pitch) of the reticle pattern. When the aperture stops 42 to 46 are used, illuminance uniformity on the reticle or wafer tends to be degraded, it is preferable to reduce the size of each element (reduce the sectional area) of the fly-eye lens 7. Another integrator (a fly-eye or rod-like integrator) may be added to obtain a two-stage integrator structure. Light amount losses are large in use of the aperture stops 44 to 46. A beam splitter such as a fiber bundle or a polygonal prism may be used to guide exposure light to each aperture of the aperture stop. One selection reference for the aperture stops of the rotary plate TA is exemplified as follows. The aperture stops 44, 45, and 46 (these are selectively used in accordance with the periodicity of the reticle patterns) are particularly used for micropatterns, the aperture stop 41 is used when the line width is large, and the aperture stop 42 (or an aperture stop 106) is used for a phase shifting reticle. For example, the aperture stop 44 is effective for a periodic pattern arranged in the X direction, the aperture stop 46 is effective for a periodic pattern arranged in the Y direction, and the aperture stop 45 is effective for a two-dimensional pattern.

The aperture stop 42 of the rotary plate TA is arranged near the secondary source image formation surface of the fly-eye lens 7 in FIG. 14. The exposure light IL emerging from the aperture stop 42 is almost collimated by a lens 9 and is incident on a variable blind 10. Exposure light IL passing through the variable blind 10 is temporarily focused within a plane $Ep_1$ by a relay lens 111. The plane $Ep_1$ is almost conjugate with the exit surface of the fly-eye lens 7. The variable aperture stop 106 for the exposure light IL is located on this plane $Ep_1$. The aperture stop 106 may be located near the exit surface of the fly-eye lens 7 in the vicinity of the rotary plate TA. The $\sigma_{IL}$ value as the $\sigma$ value of the illumination system for the exposure light IL can be changed in accordance with either a method of selecting the aperture stop 41 or 42 by the rotary plate TA or a method of setting the variable aperture stop 106. For example, $\sigma_{IL}$=0.1 to 0.4 is set for the phase shifting reticle, and $\sigma_{IL}$=about 0.1 to 0.3 is set for each aperture in oblique illumination. The states of the shutter SH, the rotary plate TA, and the variable aperture stop 106 can be arbitrarily set by the main controller 50.

Figure 33:
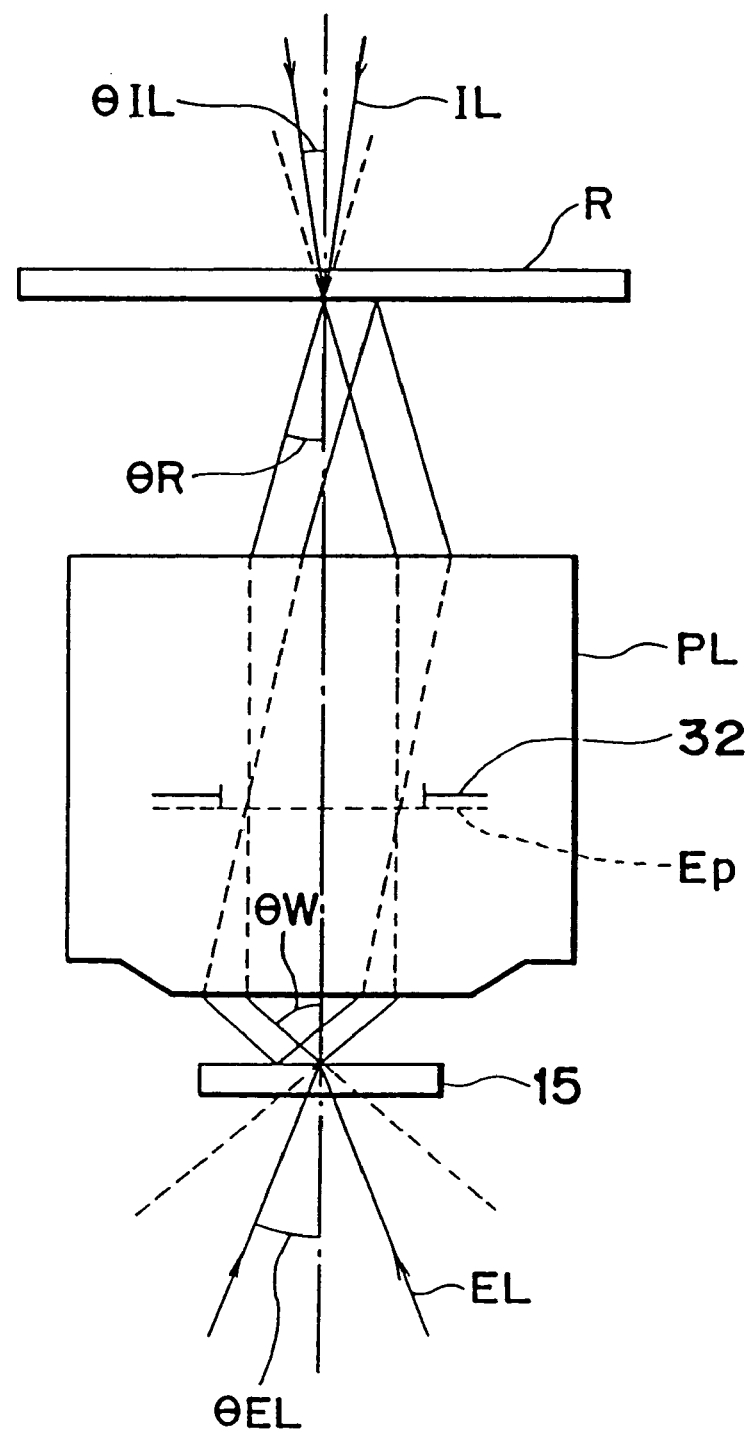
FIG. 33 is a view for explaining the σ value of an illumination system.

If the diameter of the exposure light IL on the plane $Ep_1$ where the variable aperture stop 106 is arranged is defined as $2r_{IL}$ and the focal length of the condenser lens 12 is defined as $f_{IL}$, a maximum incident angle $\theta_{IL}$ for the reticle R (FIG. 33) for the exposure light IL is given as follows. Note that the diameter of the image at the aperture 42a is used when the diameter of the aperture 42a of the aperture stop 42 is smaller than the diameter $2r_{IL}$ (each of the magnifications of the lenses 9 and 11 is set to be 1).

$$\theta_{IL}=\tan^{-1}(r_{IL}/f_{IL}) \quad (8)$$

The rotary plate TA or the variable aperture stop 106 can be adjusted to arbitrarily set the incident angle $\theta_{IL}$ of the exposure light IL in accordance with equation (8). That is, the $\sigma_{IL}$ value as the $\sigma$ value of the illumination system for the exposure light IL can be set to be an arbitrary value.

Similarly, even in the illumination system for the pattern plate 117, if the relay lens 114 and the condenser lens 116 have equal focal lengths, the diameter of the illumination light EL at the emerged end 110c of the fiber bundle 110 is defined as $2r_{EL}$, and the front-side focal length of the zoom lens constituted by the lens systems 111 and 112 is defined as $f_{EL}$, the maximum incident angle $\theta_{EL}$ of the illumination light EL on the pattern plate 117 is defined as follows:

$$\theta_{EL}=\tan^{-1}(r_{EL}/f_{EL}) \quad (9)$$

The front-side focal length of the zoom lens constituted by the lens systems 111 and 112 or a variable aperture stop (not shown) located near the merged end 110c can be adjusted to arbitrarily set the incident angle $\theta_{EL}$ of the illumination light EL in accordance with equation (9). The $\sigma_{EL}$ as the $\sigma$ value of the illumination system for the exposure light IL can be set to be an arbitrary value. In addition, as will be described later, the $\sigma_{EL}$ value may also be adjusted by adjusting the incident angle of the illumination light EL incident on the branch end 110a of the fiber bundle 110 having the merged end 110c. When the merged end 110c is moved along the direction of optical axis of the zoom lens constituted by the lens elements 111 and 112 to adjust the $\sigma_{EL}$ value. Alternatively, a variable aperture stop may be located near the exit surface of the fiber bundle 110 or a plane conjugate therewith.

Figure 16A:
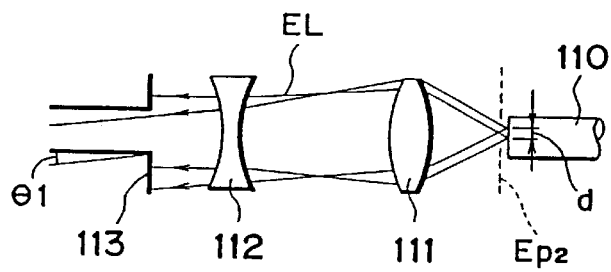
FIGS. 16A and 16B are enlarged views for explaining the operation of a zoom lens for changing a σ value in an illumination system in a focal position detection system.
Figure 16B:
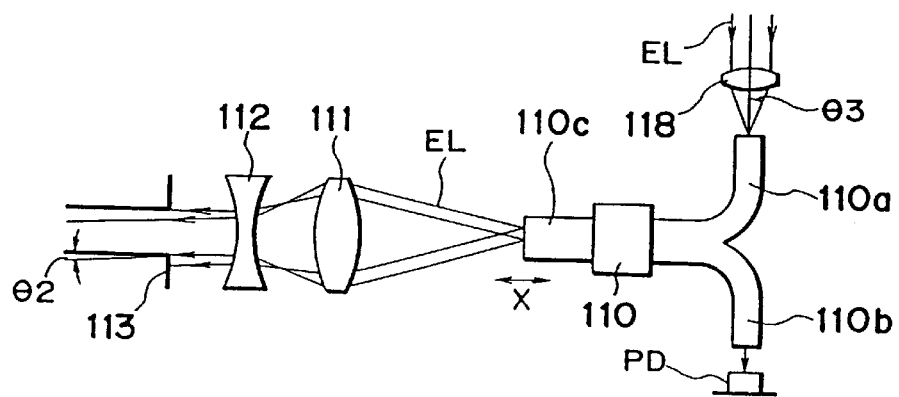

The adjustment mechanism for the $\sigma_{EL}$ value as the $\sigma$ value of the illumination system (110 to 116) of the focal position detection system including the pattern plate 117 will be described in detail below. The illumination light EL emerging from the merged end 110c of the fiber bundle 110 passes through the zoom lens constituted by the lens systems 111 and 112, and the illumination light EL is incident on the field stop 13, so that the $\sigma$ value can be adjusted by this zoom lens. FIGS. 16A and 16B are enlarged views near the zoom lens. FIG. 16A shows the state when the $\sigma$ value is large, while FIG. 16B shows the state when the $\sigma$ value is small. Although a radius d of the illumination light EL at the merged end 110c is common in FIGS. 16A and 16B, the focal length of the zoom lens in FIG. 16A is small, while the focal length of the zoom lens in FIG. 16B is large. A maximum inclination angle $\theta 1$ of the illumination light EL in FIG. 16A is larger than a maximum inclination angle $\theta 2$ of the illumination light EL in FIG. 16B. With this arrangement, the $\sigma$ value can be continuously changed.

The $\sigma$ value adjusting mechanism is not limited to the method using the zoom lens. For example, as shown in FIG. 16B, the merged end 110c of the fiber bundle 110 may be moved in the X direction as the direction of optical axis. Alternatively, the position or focal length with respect to the illumination light EL focused on one branch end 110a of the fiber bundle 110, and incident on a focusing lens 118 is changed to change an incident angle $\theta 3$ of the illumination light EL, thereby obtaining the same effect as described above.

An application of the aperture stop 44 for oblique illumination in the rotary plate TA in FIG. 15 to the illumination system (110 to 116) will be described below. In this case, although not shown in FIG. 14, an aperture stop (121 in FIG. 17) having two apertures similar to the aperture stop 44 is arranged near the merged end 110c of the fiber bundle 110. An optical system obtained by simplifying the optical system in FIG. 14 is shown in FIG. 17.

Figure 17:
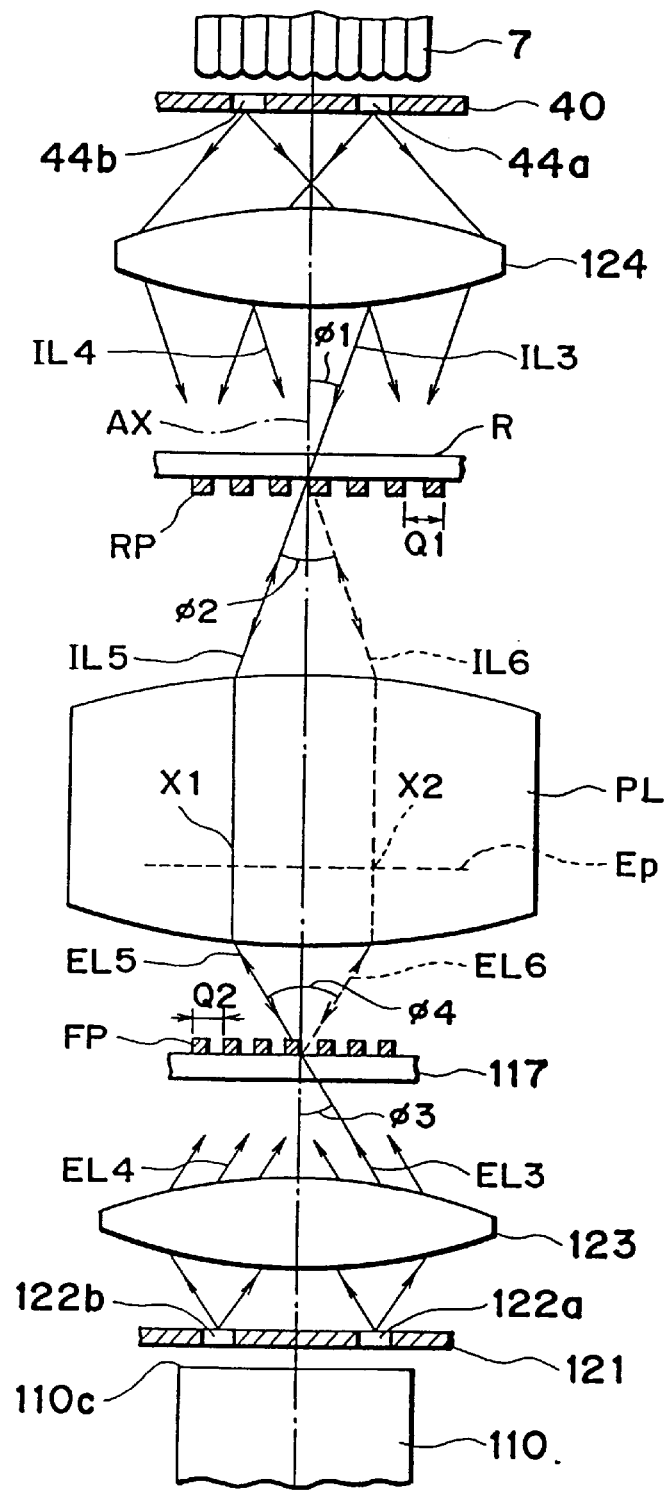
FIG. 17 is a view for explaining oblique illumination performed in the apparatus shown in FIG. 14.

Referring to FIG. 17, the two apertures 44a and 44b in the rotary plate TA which are equidistantly spaced apart from the optical axis AX are formed near the secondary source formation surface of the fly-eye lens 7. The rays of the exposure light IL emerging from apertures 44a and 44b are radiated on the reticle R through an optical system 124 (i.e., a lens unit consisting of the lenses 9, 11, and 12 in FIG. 14). On the other hand, the aperture stop 121 having two apertures 122a and 122b is arranged near the merged end 110c of the fiber bundle 110. Rays of the exposure light IL emerging from the apertures 122a and 122b are radiated on the pattern plate 117 through an optical system 123 (i.e., a lens unit consisting of lenses 111, 112, 114, and 116 in FIG. 14).

Referring to FIG. 17, the reticle R has a line/space pattern RP having transparent and light-shielding portions arranged at a pitch Q1. The pattern plate 117 has a line/space pattern FP consisting of light-shielding and transparent portions arranged at a pitch Q2. In this case, exposure light IL3 emerging from the aperture 44a is inclined by the optical system 124 such that the principal ray thereof is obliquely incident on the reticle at an incident angle $\phi 1$ with respect to the reticle R. A 0-th-order diffracted light component IL5 and a 1st-order diffracted light component IL6 emerge from the reticle R to be symmetrical about the optical axis upon incidence of the exposure light IL3. In order to realize this, $\sin\phi 1=\sin(\phi 2/2)=\lambda/(2\cdot Q1)$ (where $\phi 2$ is the angle formed between the 0-th-order diffracted light component IL5 and the 1st-order diffracted light component IL6, and $\lambda$ is the wavelength of the exposure light IL3) must be established.

The 0-th-order diffracted light component IL5 and the 1st-order diffracted light component IL6 are focused on the single point on the pattern plate 117 through points X1 and X2 equidistantly spaced apart from the optical axis AX on the pupil plane Ep of the projection optical system PL. The pattern images of the reticle R are formed on the pattern plate 117.

Similarly, exposure light IL4 emerging the aperture 44b illuminates the reticle symmetrical with the exposure light IL3 about the optical axis AX by means of the optical system 124. A 0-th-order diffracted light component and a 1st-order diffracted light component from the reticle R upon incidence of the exposure light IL4 are focused on pattern plate 117 through the projection optical system PL.

In this oblique illumination, when the numerical aperture NA of the projection optical system PL is defined as $NA_{PL}$, the limit of the pitch of the pattern to be resolved is $\lambda/(2 \cdot NA_{PL})$. To the contrary, in the normal vertical incidence illumination method, the limit of the pitch of the pattern to be resolved is $\lambda/NA_{PL}$. Even if the numerical aperture NA of the projection optical system PL is kept unchanged, the resolving power can be doubled in the oblique illumination. Each of the 0-th-order diffracted light component IL5 and the 1st-order diffracted light component IL6 is inclined at an angle $\phi 4/2$ on the pattern plate 117 with respect to the optical axis AX. The wavefront aberration of each of the 0-th- and 1st-order diffracted light components as a function of the defocus amount $\Delta F$ is $(½) \times \Delta F \cdot \sin^2(4/2)$. To the contrary, in the vertical illumination scheme, the wavefront aberration of the 1st-order diffracted light component is increased. The aberration amount as a whole is increased. This indicates that the resolving limit can be improved and the depth of focus can be increased in the oblique illumination scheme.

On the other hand, as for the illumination light EL for the pattern plate 117, the illumination light EL3 emerging from the aperture 122a is inclined by the optical system 123 such that the principal ray thereof is obliquely incident on the pattern plate 117 at an incident angle $\phi 3$ with respect to the pattern plate 117. A 0-th-order diffracted light component EL5 and a 1st-order diffracted light component EL6 emerge from the pattern FP to be symmetrical about the optical axis AX upon incidence of the illumination light EL3. In order to realize this, $\sin\phi 3 = \sin(\phi 4/2) = \lambda/(2 \cdot Q2)$ (where $\phi 4$ is the angle formed between the 0-th-order diffracted light component EL5 and the 1st-order diffracted light component EL6, and $\lambda$ is the wavelength of the illumination light EL3) must be established.

The 0-th-order diffracted light component EL5 and the 1st-order diffracted light component EL6 are focused on the single point on the pattern formation surface of the reticle R through points X1 and X2 equidistantly spaced apart from the optical axis AX on the pupil plane Ep of the projection optical system PL. The pattern images of the pattern FP of the pattern plate 117 are formed on the reticle R.

Similarly, illumination light EL4 emerging the aperture 122b illuminates the pattern plate 117 symmetrical with the illumination light EL3 about the optical axis AX by means of the optical system 123. A 0-th-order diffracted light component and a 1st-order diffracted light component from the pattern FP upon incidence of the illumination light EL4 are focused on pattern plate 117 through the projection optical system PL.

According to this embodiment, since the illumination system (110 to 116) for the pattern plate 117 employs oblique illumination as in the illumination system for the reticle R, i.e., since the light amount distribution of the exposure light IL is set equal to that of the illumination light EL on the pupil plane Ep, the imaging plane of the reticle R by the projection optical system PL can be accurately detected as a focal plane. When the aperture stop 45 for oblique illumination or the annular aperture stop 43 shown in FIG. 15 is used, an aperture stop or annular stop having four apertures is arranged at the merged end 110c of the fiber bundle in FIG. 14. Even if the pattern of the reticle R is a crosshatched pattern or a two-dimensional pattern consisting of vertical and horizontal lines, accurate focus detection can be performed.

Figure 18A:
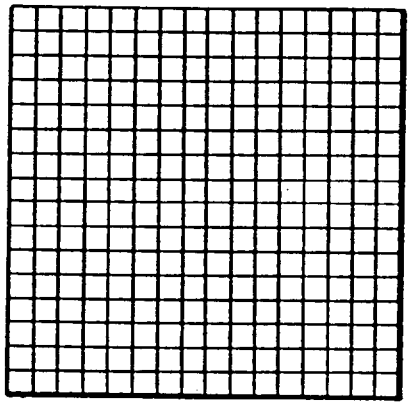
FIGS. 18A, 18B, and 18C are views showing aperture patterns of a pattern plate in FIG. 14.
Figure 18B:
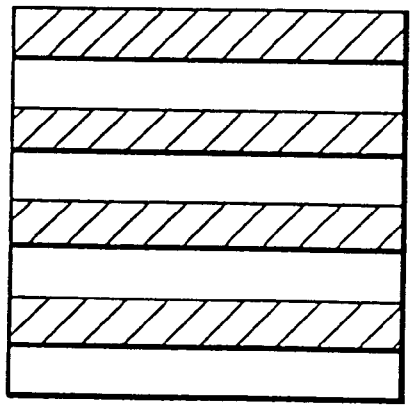
Figure 18C:
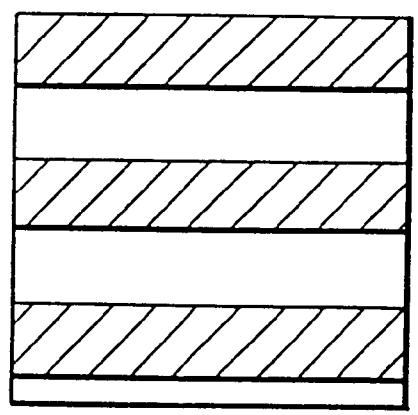

A method of setting the shape of an aperture pattern in the pattern plate 117 in FIG. 14 will be described below. As shown in FIG. 18A, the pattern plate 117 comprises a mesh-like pattern of small squares consisting of liquid crystal elements or electrochromic elements. When a predetermined portion within this pattern is constituted by periodical light-shielding portions, diffraction grating patterns having different pitches can be easily formed, as shown in FIGS. 18B and 18C. In addition, diffraction gratings having different pitch directions (periodic directions) can also be formed. When the aperture pattern is set as any of various microstructure patterns except for that in FIG. 18A, an arbitrary pattern can be set. When the pattern plate 117 is held to be rotatable within the horizontal plane on the wafer stage WS, a variety of patterns formed by the pattern plate 117 can be increased.

In place of the small squares formed by the liquid crystal or electrochromic elements, a plurality of patterns may be prepared to exchange the patterns one another by utilizing a rotary mechanism. Furthermore, a phase grating may be formed in the pattern plate 117.

An actual application will be described below. In an exposure apparatus in which the σ value of the illumination system can be changed, an operator selects an optimal σ value for the exposure illumination system used in test exposure or simulation. For this purpose, the operator inputs the σ value to the main controller 50 with a keyboard or the like to change the σ value of the illumination system. This σ value is also written in the exposure data file. Note that a reticle name may be read by a bar code reader, and the corresponding illumination condition and the σ value may be automatically set in accordance with the read name. The main controller 50 informs the optical characteristic control circuit 120 of the σ value to be used. The optical characteristic control circuit 120 drives the zoom lens consisting of the lens systems 111 and 112 on the basis of the σ value. The σ value of the illumination system of the focal position detection system (110–116 and PD) including the pattern plate 117 is set to coincide with the σ value of the exposure illumination system. The operator inputs a pattern size of the minimum line width of the reticle, which has the most strict limitation to the depth of focus.

The main controller 50 also supplies data to the optical characteristic control circuit 120 in addition to the σ value to be used. The optical characteristic control circuit 120 sets the pattern of the pattern plate 117 to be an aperture pattern closest to the line width obtained by multiplying the minimum line width of the reticle R with the magnification 1/m of the projection optical system PL. In the projection optical system PL, the focal position is changed in accordance with the astigmatism or manufacturing errors, and strict speaking, the periodic direction of the pattern to be exposed. For this reason, when the direction of patterns on the reticle R is almost one direction, the operator also inputs the pattern direction of the reticle R. The optical characteristic control circuit 120 can set the direction of the aperture pattern of the pattern plate 117 to coincide with the direction of the pattern of the reticle R.

If the pattern on the reticle is not constituted by the line/space pattern, but a dot pattern, the aperture pattern in the pattern plate 117 may be changed in correspondence with dots. If the pattern elements on the reticle R to be exposed have two or more directions, orthogonal pattern elements, as shown in FIG. 31A, may be used as pattern elements of the pattern plate in consideration of the above focal position errors.

The focus detection system of this embodiment can detect a focal position as an arbitrary position within the exposure area of the projection optical system PL. The wafer W may be set at an optimal position while the line width and direction are taken into consideration within the entire exposure area. The image plane may be optimized by driving optical elements in the projection optical system PL. The focal positions are measured at a plurality of points within the exposure area in accordance with the minimum line width and the pattern direction of each area on the reticle R. When the wafer W is inclined on an average focal plane, or the image plane may be changed, the focal plane may be changed to coincide with the plane perpendicular to the optical axis of the projection optical system PL.

As described above, after the exposure condition is matched with the condition of the focal position detection system, focus sensors 30 and 31 are calibrated to perform actual exposure. Calibration is appropriately performed to cope with the change in focal position in the exposure light, caused by exposure light absorption of the projection optical system PL, and with a change in atmospheric pressure.

The above embodiment exemplifies a method of causing the operator to input the minimum line width of the reticle R. However, an automatic input method may also be assumed. For example, the reticle R is observed with a microscope to obtain a minimum line switch in accordance with image processing. The aperture pattern of the pattern plate 117 may be formed by photochromic elements, and the exposure target pattern of the reticle R is exposed with the exposure light IL to form the pattern of the reticle R on the photochromic elements. The resultant pattern may be used as an aperture pattern of the pattern plate 117. In this case, the pattern of the reticle R generally has a reversal relationship (i.e., negative image) with the aperture pattern of the pattern plate 117. In this case, the pattern plate 117 is slightly shifted during exposure so as to prevent interference with the pattern of the reticle R (this shifting operation will be described later).

This embodiment of the present invention has been described above, and the following effects are also obtained from the arrangement of this embodiment.

In the above embodiment, a description has been made for the case in which the focal position is changed in accordance with the pattern direction of the reticle R, which is caused by the astigmatism of the projection optical system PL. A difference between the changes in focal position is preferably small, and adjustment must be performed to minimize the difference during adjustment of the projection optical system PL. In this case, when the direction of the aperture pattern is changed and measurements are performed in accordance with the method of this embodiment, the difference in changes in focal position can be detected.

Figure 32A:
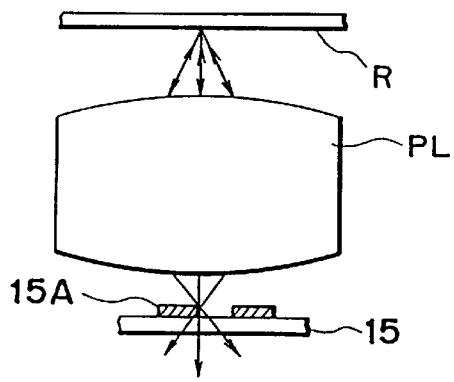
FIGS. 32A and 32B are views for explaining the principle of the focus detection system shown in FIG. 30.
Figure 32B:
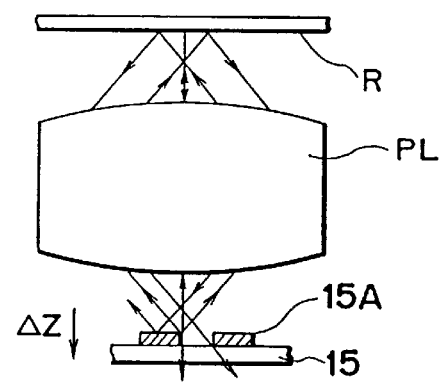
Figure 32C:
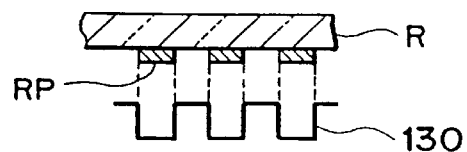
FIG. 32C is a view for explaining interference between a reticle pattern and an aperture pattern image.

One of the conventional drawbacks is the interference between the pattern of the reticle R and the pattern of the pattern plate 117 of the focal position detection system. As shown in FIG. 32C, when an image 130 of an aperture pattern of the pattern plate 117 coincides with a pattern RP of the reticle R, the reflected light amount must be reduced in a defocus state. However, by this defocus state, light is also incident on the pattern PR as the chromium deposition portion having a high reflectance to inversely increase the light amount. In order to prevent this, a method of utilizing the arrangement of the above embodiment to rotate the pattern direction, performing the measurement a plurality of times, and averaging the measurement values, or a method of performing scanning a plurality of times in the Z direction while the pattern is parallelly shifted in the X and Y directions may be used.

Unlike in the above embodiment, the present invention is also applicable to measurement in which light is emitted from the wafer stage WS side. The present invention is further applicable to a technique for measuring the distortion of the projection optical system PL by measuring an emission mark of the reticle R, as disclosed in U.S. Pat. No. 4,780,913. That is, the shape of the pattern of the emission mark and the σ value of the illumination system are set in accordance with the actual reticle patten or reticle illumination system, thereby performing the measurement. A method similar to this method can be applied to a method of measuring a focal position in accordance with the positional shift of the emission mark from the wafer stage.

The illuminance distributions on the pupil planes of the projection optical systems cannot be accurately matched with each other. However, only an accurate illumination condition (selection of the rotary plate TA and the σ value) for the reticle may be matched with the illumination condition for the opening pattern (the pattern shape is also changed in the above embodiment). In particular, it is possible to use a phase shifting method to an aperture pattern, but such an application is difficult in the state-of-the-art technique. The pattern shapes are not matched with each other, but only the illumination conditions, i.e., the σ values are matched with each other. In an extreme case, only the shapes (pitch, periodic direction, and duty) of the aperture patterns may be matched in both the illumination systems. That is, at last one of the illumination condition and the shape of the aperture pattern of one illumination system is matched with that in the other illumination system. The pattern plate 117 is moved within the image field of the projection optical system PL to detect the focal positions of the projection optical system PL at the respective points, thereby measuring the Image plane inclination and the curvature of field as well as the focal position of the projection optical system PL and the astigmatism.

Figure 19:
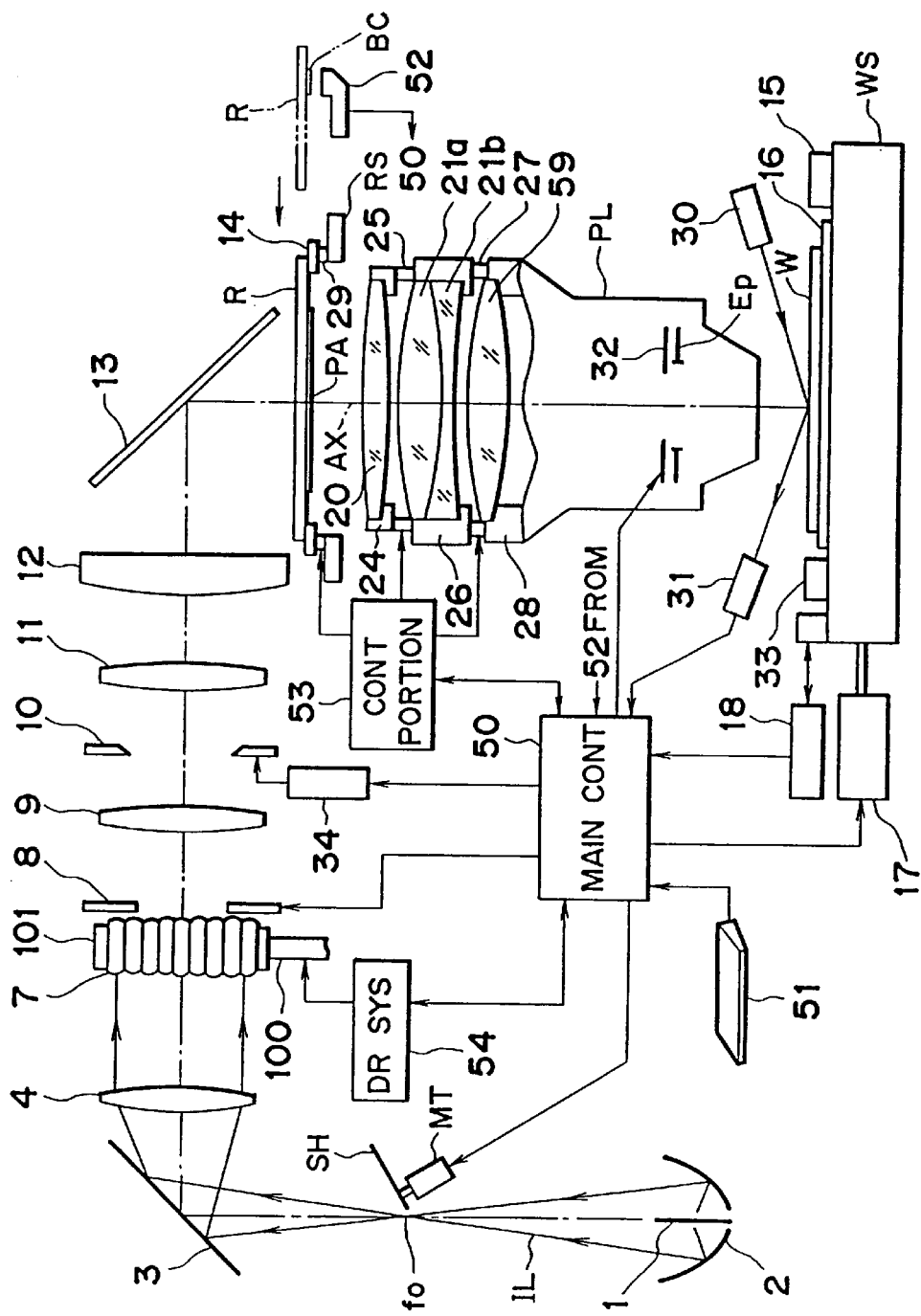
FIG. 19 is a schematic view showing the arrangement of a projection exposure apparatus according to the fifth embodiment of the present invention.

The fifth embodiment of the present invention will be described with reference to FIG. 19. FIG. 19 is a schematic view showing the arrangement of a projection exposure apparatus according to the fifth embodiment. The same reference numerals as in FIG. 1 denote the same parts in FIG. 19. As is apparent from FIG. 19, the projection exposure apparatus of the fifth embodiment has substantially the same arrangement as that of the apparatus of the first embodiment (FIG. 1), except for a fly-eye lens exchange mechanism (100 and 54), arranged in an exposure light illumination optical system, for changing the illumination condition. However, the exchange mechanism employed in this embodiment is the same as the exchange mechanism (FIG. 12) in the third embodiment, and a detailed description thereof will be omitted.

As shown in FIG. 19, an irradiation amount monitor (photoelectric sensor) 33 is arranged together with a pattern plate 15 on a wafer stage WS so that the upper surface of the photoelectric sensor 33 has almost the same level as the upper surface of the wafer W. The photoelectric sensor 33 is constituted by a photodetector having the light-receiving surface almost equal in size to the image field of an projection optical system PL or the projection area of a reticle pattern. The photoelectric sensor 33 outputs irradiation amount information to a main controller 50. This information serves as basic data (to be described later in detail) for obtaining an amount of change (amount of aberration) of the imaging characteristics corresponding to an amount of energy accumulated in the projection optical system PL upon incidence of exposure light IL.

As is apparent from FIG. 12, a lens system 4 having a large diameter enough to cause rays of the exposure light IL to be respectively incident on four types of fly-eye lenses (holding members 101 to 104) flatly in this embodiment is used. With this arrangement, however, the loss of the amount of illumination light radiated on the reticle R is increased. In order to prevent the light amount loss, it is preferable to arrange an optical member (input optical system) to concentrate the light amount distribution of the light-source-side focal plane of the fly-eye lens only on a portion near each fly-eye lens position.

Figure 20:
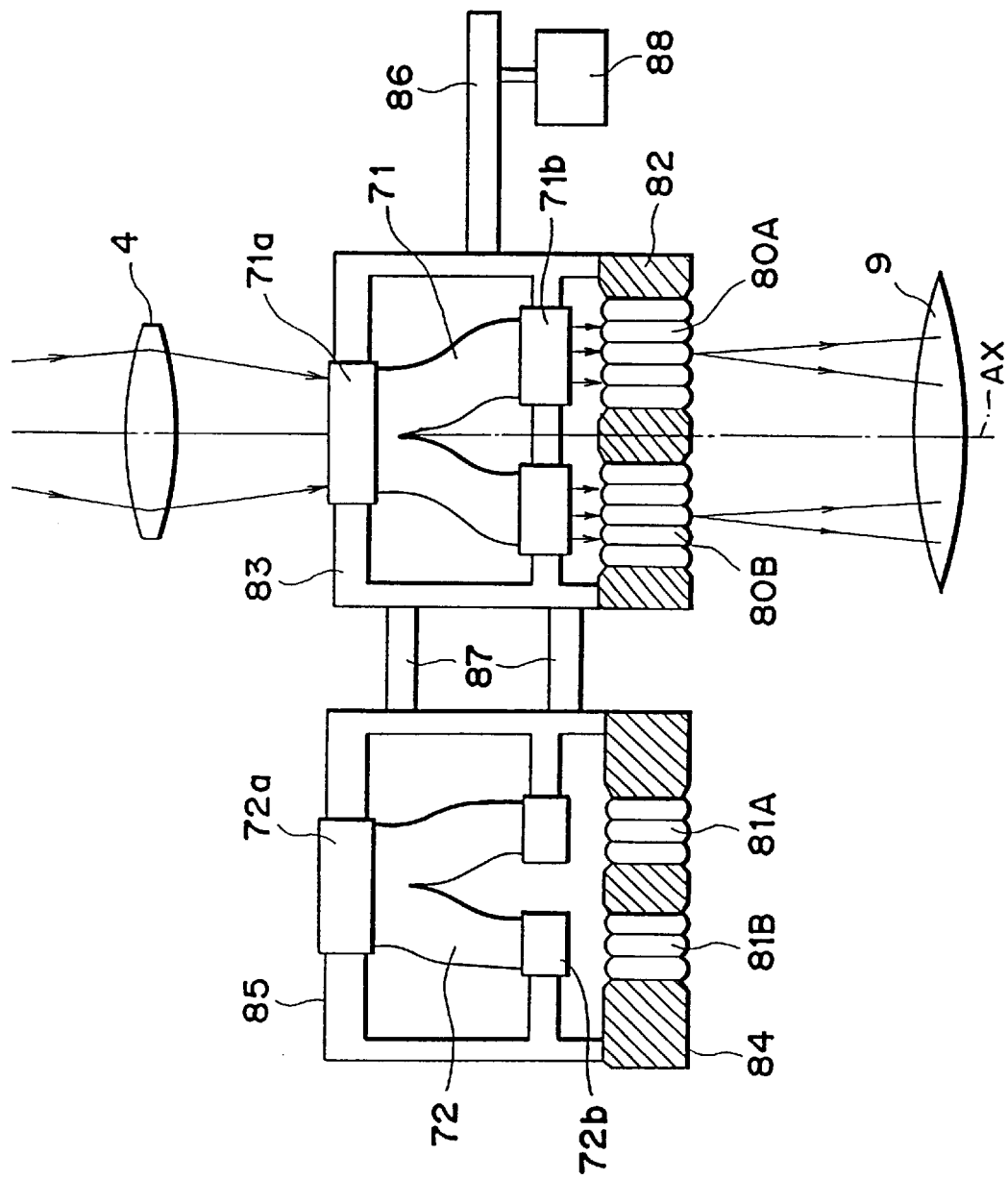
FIG. 20 is a view showing an input optical system for focusing illumination beams on a plurality of fly-eye lens groups.

FIG. 20 is a view showing the modification of the holding member. An input optical system (fiber bundles 71 and 72) and holding members 82 and 84 are integrally fixed on a movable member (a support rod 86). This modification exemplifies use of fiber bundles. The input optical system, however, may be another optical member such as a diffraction grating or polygonal prism.

Referring to FIG. 20, two fly-lens groups 80A and 80B are integrally held by the holding member 82. An incident portion 71a and an exit portion 71b of the fiber bundle 71 are held by a fixing member 83. The holding member 82 is fixed together with the fixing member 83. The interior of the holding member 82 except for the fly-lens groups 80A and 80B serves as light-shielding portions (hatched portions). On the other hand, exchange fly-eye lenses 81A and 81B are held integrally by the holding member 84, and an incident portion 72a and an exit portion 72b of the fiber bundle 72 are held by a fixing member 85. The holding member 84 is fixed together with the fixing member 85. The interior of the holding member 84 except for the fly-lens groups 81A and 81B serves as light-shielding portions in the same manner as described above. The fixing members 83 and 85 are connected and fixed by a connecting member 87. Each holding member can be exchanged together with the corresponding fixing member. Note that the fixing member 83 is present in the illumination optical system, while the fixing member 85 is located outside the illumination optical system. The light source side from the lens 4 and the reticle side from a relay lens 9 have the same arrangements as those in FIG. 19.

Each holding member can be exchanged by pulling and pushing the support rod 86 by a drive element 88. In exchanging the fly-lens group, when the fly-eye lens group and the fiber bundle are integrally exchanged, as shown in FIG. 20, the integral member group (fixing member) is aligned with only the illumination optical system, thereby advantageously eliminating adjustment of positions between the members (e.g., the fly-eye lens groups and fiber bundle groups) in each exchange operation. At this time, the drive element 88 is also used as the positioning member. For this purpose, a position measuring member such as a linear encoder or potentiometer is preferably arranged for the drive element 88.

A change in illumination condition and the light amount distribution near the pupil plane of the projection optical system under each illumination condition will be described below with reference to FIGS. 21A to 21D. The same reference numerals as in FIG. 19 denote the same parts in FIGS. 21A to 21D.

Figure 21A:
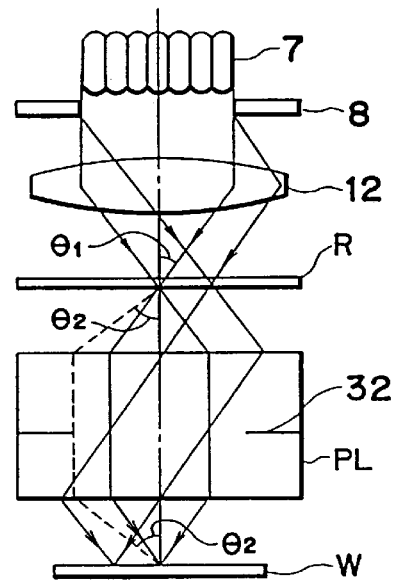
FIGS. 21A and 21C are views showing optical paths from the fly-eye lens groups to the wafer before and after the illumination condition (σ value) is changed.
Figure 21C:
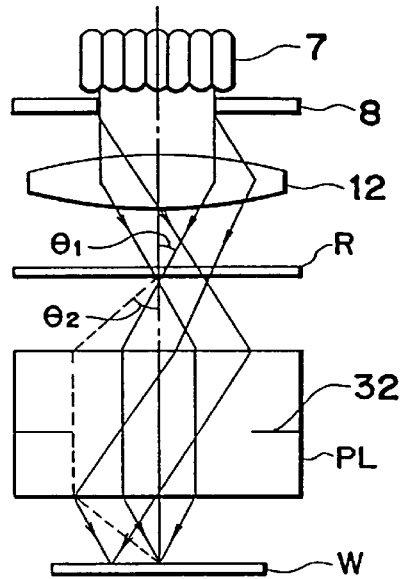
Figure 21B:
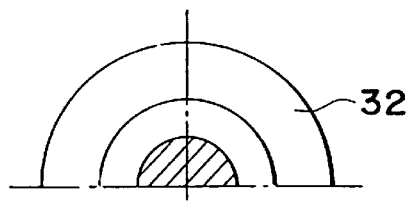
FIGS. 21B and 21D are views showing light amount distributions near the pupil plane of the projection optical system.
Figure 21D:
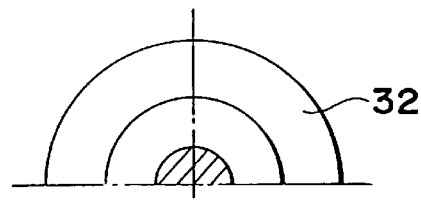

The coherence factor of the illumination optical system, a so-called σ value is represented by a ratio of a numerical aperture $NA_{IL}$ of the illumination optical system to a numerical aperture $NA_R$ (reticle side) of the projection optical system, i.e., $\sigma = NA_{IL}/NA_R = \sin\theta_1/\sin\theta_2$ where $\theta_1$ is the angle of illumination light for illuminating the reticle R and $\theta_2$ is the angle of illumination light passing through a variable aperture stop 32 of a projection optical system PL. FIGS. 21A to 21D show cases in which the numerical aperture $NA_R$ of the projection optical system PL is kept unchanged, while the numerical aperture $NA_{IL}$ of the illumination optical system is changed. FIGS. 21A and 21B show the cases when the σ value is large, while FIGS. 21C and 21D show the cases when the σ value is small. As is apparent from FIGS. 21A to 21D, the σ value can be arbitrarily set by a variable aperture stop 8 arranged near the exit surface (i.e., the pupil plane of the illumination optical system) of a fly-eye lens 7 in this embodiment. Note that the variable aperture stop serves as the means for changing the σ value in this embodiment (FIGS. 19 and 21A to 21D). However, for example, a zoom lens system may be used, as shown in FIGS. 7A and 7B, or the illumination optical system (e.g., the fly-eye lens groups) may be exchangeable to set the σ value variable in the same manner as described above.

As shown in FIGS. 21A and 21C, the 0-th-order diffracted light component of the illumination rays passing through the reticle R is incident on the projection optical system PL at the same angle $\theta_1$ as the incident angle of the illumination light and reaches a wafer W along an optical path indicated by the solid line in FIGS. 21A and 21C. Although not shown, diffracted light components of the first order or more propagate outside the 0-th-order diffracted light component and reach the wafer W. The variable aperture stop 32 is arranged on a pupil plane Ep of the projection optical system PL. A numerical aperture $NA_W$ (wafer side) of the projection optical system PL is represented by $NA_W = \sin\theta_3$. When the light amount distribution on the pupil plane of the projection optical system PL is taken into consideration, the 0-th-order diffracted light component passes almost the center (hatched portion) of the pupil plane within the plane defined by the variable aperture stop 32, and the diffracted light components of the first order or more pass outside the 0-th-order diffracted light component. Since the intensity of the 0-th-order diffracted light component is generally higher than those of the diffracted light components of the first order or more, a lens element near the pupil plane is heated to a higher temperature when the σ value is large (FIG. 21B) than when the σ value is small (FIG. 21D) because the illumination beam is concentrated on the center of the pupil. In practice, when exposure is to be performed, the optimal illumination condition, i.e., the σ value and the numerical aperture $NA_W$ (in addition the fly-eye lens) in correspondence with the type of reticle (e.g., a normal reticle or a phase shifting reticle), the pattern line width, the shape, and the periodicity by driving the variable aperture stops 8 and 32 (turret plate 7).

The operation of the projection exposure apparatus of this embodiment will be described below. A method of calculating the amount of change in the imaging characteristic of the projection optical system PL will be briefly described below. Note that the four imaging characteristics, i.e., the projection magnification, the curvature of field, the distortion, and the focal position are taken into consideration. These imaging characteristics may have different generation mechanisms and different variation characteristics, so that the respective imaging characteristics must be independently calculated. However, since the imaging characteristic calculation method itself is the same, the calculation of the projection magnification will be exemplified. In this embodiment, the σ value of the illumination optical system as the illumination condition is assumed to be changed.

Figure 22:
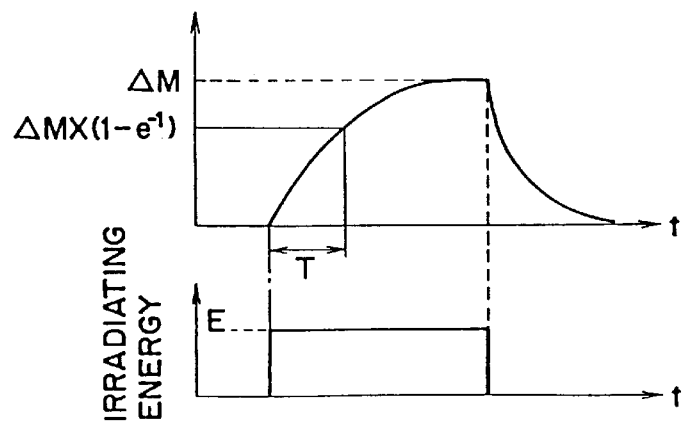
FIG. 22 is a graph for explaining change characteristics of the imaging characteristics (projection magnification) of the projection optical system by illumination light absorption.

In general, the object temperature during absorption of heat to the object is obtained by the balance between heat absorbed by the object and heat dissipated therefrom. This is generally called a primary delay system, and change characteristics of the projection magnification are determined by a behavior similar thereto. The variation characteristics of a primary delay system are shown in FIG. 22. More specifically, FIG. 22 shows change characteristics of the projection magnification when the projection optical system PL is irradiated with illumination light having a predetermined amount for a predetermined period of time. The change characteristics shown in FIG. 22 are determined by two values, i.e., a ratio ΔM/E of a final amount Δ of change in irradiating energy to the irradiating energy and a time constant T representing a change over time. Referring to FIG. 22, the time constant T is represented by a period changed by $\Delta M \times (1-e^{-1})$ with respect to the final amount ΔM of change. That is, when the time constant T is decreased, the rate of change is increased. The ratio ΔM/E and the time constant T are obtained to determine the change characteristics of FIG. 22 by measuring the projection magnification while the projection optical system PL is actually irradiated with the illumination light. In practice, since the structure of the projection optical system PL is complicated, the simple change characteristics shown in FIG. 22 cannot be obtained, and actual change characteristics are often represented as a sum of several primary delay systems. For the sake of descriptive simplicity, the simple change characteristics are exemplified in this embodiment.

Referring to FIG. 19, in exchange of the reticle R, the wafer stage WS is driven to move the photoelectric sensor 33 to the position of optical axis of the projection optical system PL, and an amount of illumination light incident on the projection optical system PL is measured. The main controller 50 sequentially calculates amounts of changes in projection magnification on the basis of the ratio ΔM/E and the time constant T which are calculated in advance, the irradiating energy detected by the photoelectric sensor 33, and the ON/OFF time of a shutter SH.

When the σ value of the illumination optical system is changed, as described above, the light amount distribution, i.e., temperature distribution or profile of the lens element near the pupil plane Ep of the projection optical system PL is changed. For example, when the σ value is small, the irradiating energy is concentrated on the center of the pupil plane to increase the temperature of the central portion (FIGS. 21C and 21D). The lens element is thermally deformed at its portion near the central portion. On the other hand, when the σ value is large (FIGS. 21A and 21B), the overall temperature of the lens element is increased, and large thermal deformation does not particularly occur. For this reason, when the total irradiating energy amount is constant, the change in projection magnification is larger when the σ value is large than when σ value is small. That is, the ratio ΔM/E is large.

On the other hand, when the σ value is small, the temperature of the peripheral portion of the lens element is not so high, the lens temperature is abruptly decreased upon interruption of illumination light irradiation. To the contrary, when the σ value is large, the temperature of the overall lens is increased, and then the temperature is gradually decreased. The change over time is larger when the a value small than when the σ value is large. That is, the time constant T is small. In summary, the ratio ΔM/E and the time constant T are changed by changing the σ value.

Figure 23:
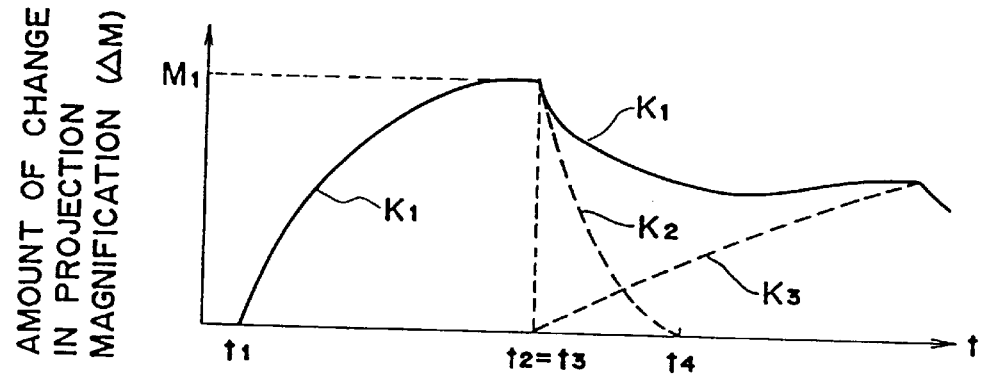
FIG. 23 is a graph showing amounts of changes in projection magnification when continuous exposure is performed while the σ value is changed.

Continuous exposure by changing the σ value will be described below. Note that the amount ΔM of change in projection magnification obtained in the continuous magnification is shown in FIG. 23.

The variable aperture stop 8 is driven to decrease the σ value of the illumination optical system, and exposure is started from time $t_1$. At this time, the amount ΔM of change in projection magnification is changed along a curve $K_1$ represented by a solid curve in FIG. 23. In practice, during movement (stepping) of the wafer stage and during wafer exchange, the illumination light is not incident on the projection optical system PL to decrease the amount ΔM of change, and the curve $K_1$ is a zig-zag curve. However, if the changes are averaged, the smooth curve shown in FIG. 23 is obtained. When the exposure continues, the amount ΔM of change reaches a saturation level $M_1$. When the exposure operation is stopped at time $t_2$, the amount ΔM of change is decreased along a curve $K_2$ represented by a dotted curve.

Assume that the variable aperture stop 8 is driven at time $t_3$ ($\neq t_2$) to increase the σ value and that exposure is restarted under the condition that the same irradiating energy as that for the small σ value is incident on the projection optical system PL. If ΔM=0 at time $t_3$, the amount ΔM of change is changed along a curve $K_3$ represented by a dotted curve in FIG. 23. However, since the history is maintained in the projection optical system PL under the condition (a small σ value) prior to the change in illumination condition, an actual change is assumed to follow the curve $K_1$ (solid curve) and cannot be expressed as the sum of the curves $K_2$ and $K_3$ due to the following reason. During an interval between time $t_3$ and time $t_5$, the temperature distribution (light amount distribution) of the lens element near the pupil of the projection optical system is not set in any one of the states in FIGS. 21B and 21D. In addition, the lens temperature cannot be expressed as a simple sum. Therefore, in order to accurately obtain the curve $K_1$, the temperature distribution in the transient state of the change in illumination condition is calculated, and the corresponding amount ΔM of change must be known. This calculation is theoretically possible. However, the calculation is very complicated, resulting in an impractical application.

Figure 24:
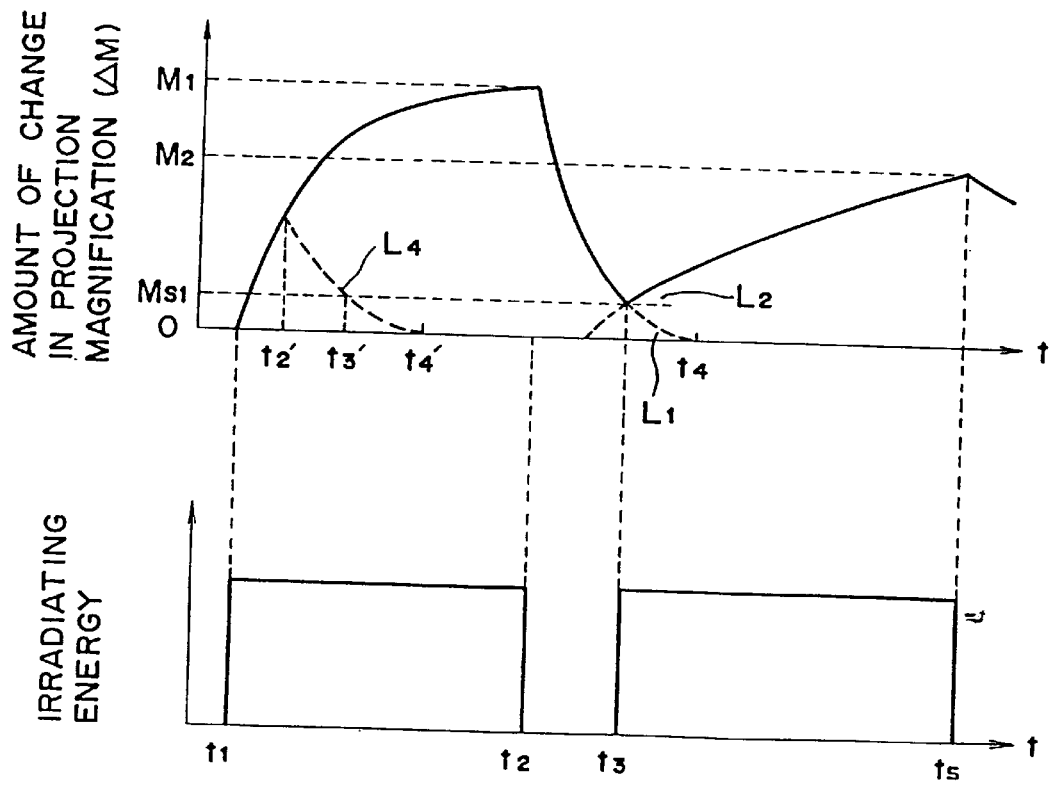
FIG. 24 is a graph for explaining an exposure operation of a projection exposure apparatus according to the fifth embodiment of the present invention.

The exposure operation of this embodiment to solve the above problem will be described with reference to FIG. 24. After the σ value is set small (FIGS. 21C and 21D) by the variable aperture stop 8 in the same manner as in FIG. 23, the shutter SH is opened at time $t_1$ to start exposure in FIG. 24. As shown in FIG. 24, the amount ΔM of change is changed along the curve by a solid line as in the curve $K_1$ (solid line) in FIG. 23 and finally reaches a saturation level $M_1$.

The shutter SH is closed for change the illumination condition to stop the exposure operation at time $t_2$, and the variable aperture stop 8 is driven to set a large σ value (FIGS. 21A and 21B). At this time, after the exposure operation is stopped at time $t_2$, the main controller 50 keeps inhibiting the exposure operation for a predetermined period of time, e.g., until the amount ΔM of change is reduced to a predetermined level $M_{S1}$. When the exposure operation is kept stopped, the amount ΔM of change is decreased along a curve $L_1$ (dotted curve) and becomes zero at time $t_4$. A method of determining the level $M_{S1}$ serving as the determination reference (threshold value) of the start of exposure operation will be described later.

Note that the amount ΔM of change is calculated using calculation parameters (ΔM/E and T) under the condition that the σ value is small until time $t_3$ at which the amount ΔM of change reaches the level $M_{S1}$. In addition, during pattern exposure (time $t_1$ to time $t_2$), the imaging characteristic correction mechanism is driven on the basis of the calculated value, so that the imaging characteristic is always set to be a predetermined value.

When the amount ΔM of change reaches the predetermined level at time $t_3$, the main controller 50 switches (corrects) the calculation parameters ΔM/E and T to the ones set under the condition that the σ value is large. The shutter SH is opened to restart the exposure operation At this time, the amount ΔM of change in projection magnification is calculated using the corrected calculation parameters. Pattern exposure on the wafer W is performed while the projection magnification is corrected by the imaging characteristic correction mechanism. At this time, since the period ($t_3$–$t_2$) has elapsed from the end of exposure operation performed under the condition that the σ value is small, the influence of the history of a small σ value for the amount ΔM of change is sufficiently small. For this reason, even if the amount ΔM of change is changed along a curve $L_2$ represented by a dotted curve in FIG. 24, a calculation error is small, which can be negligible with respect to the control precision of the imaging characteristic required for the projection exposure apparatus.

Note that the amount ΔM of change reaches a saturation level $M_2$ at time $t_5$ and the exposure operation is stopped at time $t_5$ when the exposure operation continues while the σ value is kept large. When the σ value is large, as described above, the temperature of the overall lens element is increased, so that the amount ΔM of change from time $t_5$ is gradually decreased as compared with the amount ΔM of change during the period between time $t_2$ and time $t_3$.

The above description exemplifies the case wherein the illumination condition (σ value) is changed when the amount ΔM of change reaches the saturation level $M_{S1}$. As a matter of course, the σ value may be changed before the amount ΔM of change reaches the saturation level $M_1$. For example, when the exposure operation is to be stopped at time $t_2'$ in FIG. 24 to increase the a value, the exposure operation is kept stopped until time $t_3'$ at which the amount ΔM of change is reduced to the level $M_{S1}$. This state is represented by a curve $L_4$ (dotted curve) in FIG. 24. In this case, a stop period ($t_3'$–$t_2'$) can be shorter than the above stop period ($t_3$–$t_2$).

A method of determining the predetermined level $M_{S1}$ used in determination of the start of exposure will be described below. The level $M_{S1}$ is basically determined such that a difference (calculation error) between the imaging characteristic (amount ΔM of change) calculated using the calculation parameters ΔM/E and T updated upon a change in illumination condition and the actual imaging characteristic (corresponding to the curve $L_2$ in FIG. 24) falls within a predetermined allowable range (this is solely determined in accordance with control precision of the imaging characteristic). At this time, in order not to decrease the throughput of the apparatus, i.e., in order to shorten the period ($t_3$–$t_2$), the level $M_{S1}$ is preferably set to be a maximum value.

For example, when a change in σ value is small or strict control precision of a pattern to be transferred is not required for the projection magnification, the level $M_{S1}$ is set to be a relatively large. Otherwise, the level $M_{S1}$ is set small. The exposure operation must be stopped until the influence of the history on the imaging characteristics under the previous illumination condition is sufficiently reduced. In practice, the above relationship is obtained by an experiment or simulation in advance and is stored in the main controller 50 in the form of a table or an approximation, thereby determining the value of the level $M_{S1}$. Note that the calculation for reducing the amount ΔM of change from time $t_2$ in FIG. 24 need not be performed by a special calculation because the amounts ΔM of changes are conventionally sequentially performed.

A processing sequence inside the main controller 50 will be described with reference to a flow chart in FIG. 25. Although not shown in FIG. 19, the main controller 50 is constituted by a control portion for controlling the overall operation of the apparatus including the variable aperture stops 8 and 32 and a calculation portion for calculating the amounts of changes in imaging characteristics.

Figure 25:
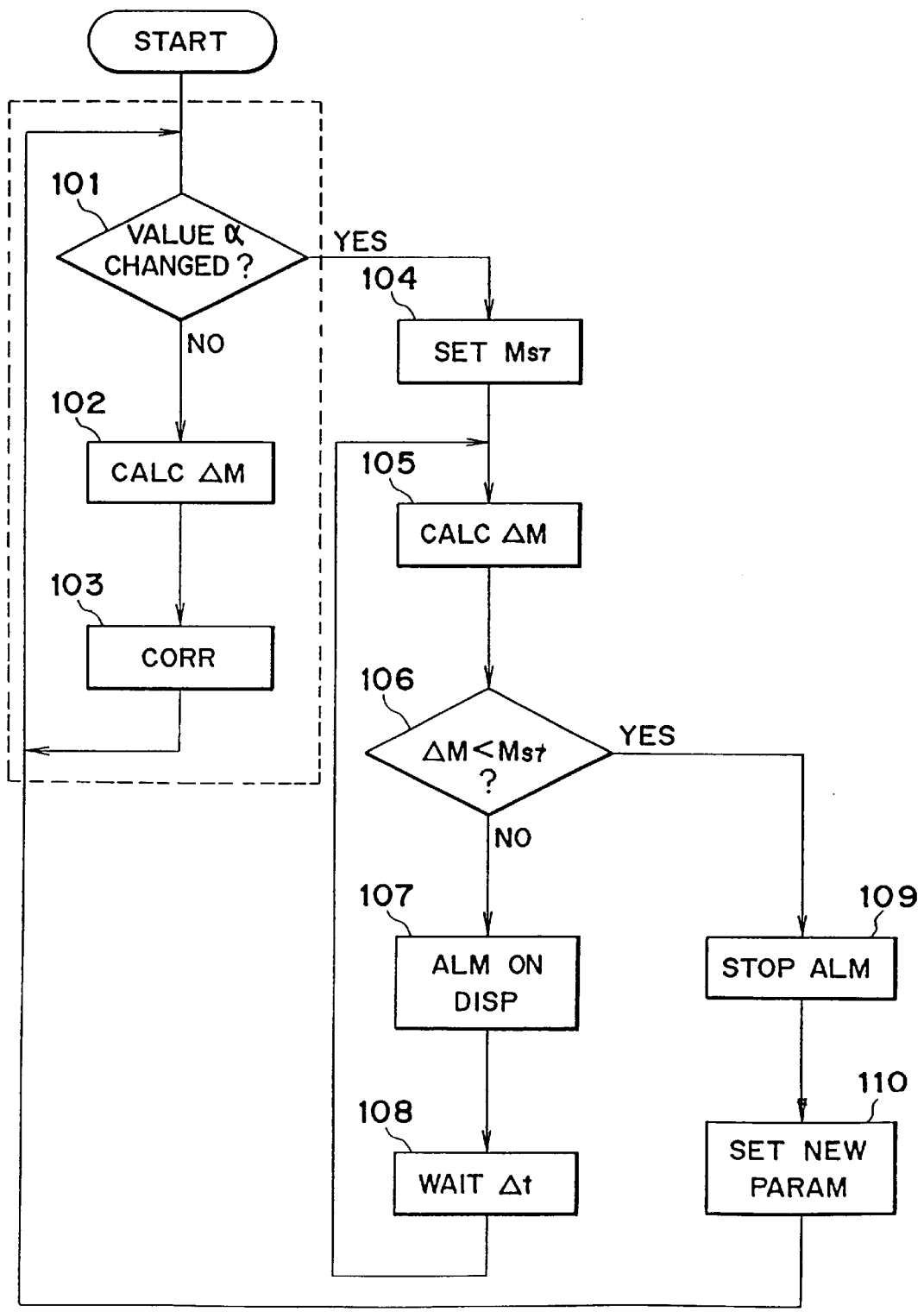
FIG. 25 is a flow chart showing a control operation of the imaging characteristics of the projection optical system.

Referring to FIG. 25, when the σ value is not changed as a normal operation, the calculation portion calculates the amount ΔM of change in projection magnification of the current projection optical system in step 102. In step 103, the control portion outputs a predetermined drive command to the imaging characteristic correction mechanism on the basis of the above calculation result, thereby correcting the amount ΔM of change. Unless the calculation portion receives a signal representing the change in σ value from a keyboard 51, a bar code reader 52, or a program (exposure sequence) input in advance, the control portion repeatedly executes the above operation. That is, the calculation portion continuously outputs an exposure enable signal to the control portion in steps 101 to 103 surrounded by a dotted line in FIG. 25. At this time, the control portion continues the exposure operation on the wafer while causing the imaging characteristic correction mechanism to correct the projection magnification.

On the other hand, if YES in step 101, the calculation portion stops outputting the exposure enable signal to the control portion, and the flow advances to step 104. In step 104, the calculation portion determines the level $M_{S7}$ serving as the determination reference for the start of exposure operation on the basis of the change width of the a value and the allowable control precision (allowable magnification error) of the projection magnification. The determined level $M_{S7}$ is set in the control portion. In step 105, the calculation portion calculates the amount ΔM of change in projection magnification (i.e., σ value calculated by the calculation parameters given before the illumination condition is changed) of the current projection optical system. This calculated value is compared with the level $M_{S7}$. If it is determined that the calculated value ΔM is larger than $M_{S7}$, the calculation portion displays an alarm on, e.g., the screen of a display unit (e.g., a CRT) to inform to the operator that the exposure operation must be stopped. Thereafter, in step 108, the calculation portion stops outputting an exposure operation resume command for a predetermined period Δt (wherein Δt is set shorter than the period ($t_3$–$t_2$) shown in FIG. 24 to the control portion). In step 105, the calculation portion obtains the amount ΔM of change (calculation value) in projection magnification again. In step 106, the operations in steps 105 to 108 are repeated until the calculated value ΔM becomes smaller than that corresponding to the level $M_{S7}$. If YES in step 106, the flow advances to step 109 to erase (cancel) the alarm on the display unit. In step 110, the calculation portion sets calculation parameters (ΔM/E and T) corresponding to a new illumination condition (σ value). The flow returns to step 101 to repeat the normal exposure operation (steps 101 to 103) using the updated calculation parameters. As a result, pattern exposure on the wafer can be performed always using high-precision imaging characteristics.

As described above, this embodiment exemplifies the projection magnification as the imaging characteristic of the projection optical system. Other aberrations can also be calculated and corrected in the same manner as described above, thereby always maintaining the imaging characteristics of the projection optical system with high precision. When a plurality of aberrations are to be calculated and corrected, the exposure operation is restarted when the amounts of changes in aberrations as the correction targets are less than the reference value (corresponding to the level $M_{S7}$) to determine the stop time of the exposure operation.

Figure 26A:
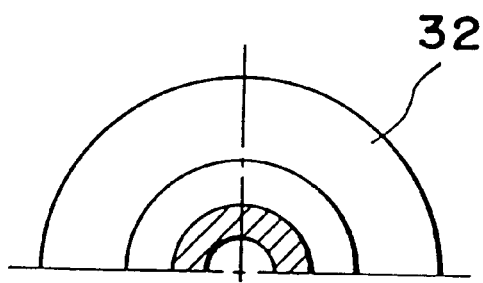
FIGS. 26A, 26B, and 26C are views showing light amount distributions near the pupil plane of the projection optical system when annular illumination and oblique illumination are performed and the numerical aperture of the projection optical system is changed.
Figure 26B:
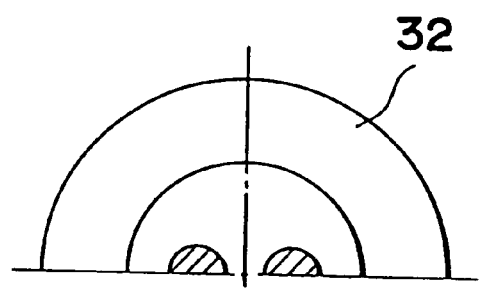
Figure 26C:
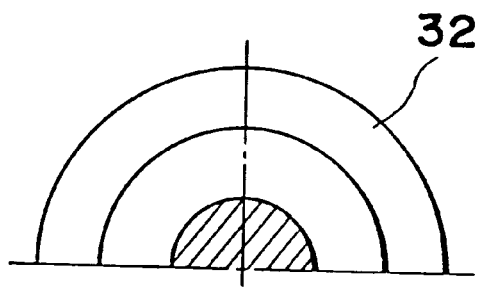

In the above embodiment, the σ value of the projection optical system is changed as the illumination condition. However, other illumination conditions may be changed to obtain the same effect as described above. For example, the present invention is effective in that normal illumination is switched to oblique illumination (or annular illumination) (and vice versa), i.e., the fly-eye lens 7 is exchanged with one of the fly-eye lenses (holding members 102 to 104) (FIG. 12), that the fly-eye lenses (holding members 102 to 104) are exchanged in accordance with the reticle pattern periodicity in oblique illumination, that the illumination field is changed by driving a variable blind 10, that normal illumination is changed to annular illumination (or vice versa), or that the numerical aperture of the projection optical system PL is changed. Note that the σ value is preferably set to fall within the range of about 0.1 to 0.3 together with exchange of the fly-eye lens groups in oblique illumination. FIGS. 26A and 26B show light amount distributions near the pupil plane of the projection optical system in annular illumination and oblique illumination, respectively. FIG. 26C shows the light amount distribution near the pupil plane of the projection optical system when the numerical aperture of the projection optical system is changed. The aperture of the variable aperture stop 32 in FIG. 26C is larger than those in FIGS. 26A and 26B.

When the numerical aperture of the projection optical system is changed by the variable aperture stop 32, the light amount distribution is shown in FIG. 26C. In this case, the distribution of the 0-th-order diffracted light component is not changed. For this reason, the influence of the change on the imaging characteristics is assumed to be small. However, since the distribution of the diffracted light components of the first order or more may be changed to influence the control precision of the imaging characteristics, the present invention is preferably applied to the change in numerical aperture of the projection optical system. In this case, although the illumination condition of the illumination optical system is not changed, the change in illumination condition includes the change in numerical aperture of the projection optical system.

Even if the normal reticle is exchanged to the phase shifting reticle or vice versa, the same effect as described above can be obtained when the present invention is applied. For example, when the present invention is applied to a spatial frequency modulation phase shifting reticle (Japanese Patent Publication No. 62-50811), the light amount distribution shown in FIG. 26B as in oblique illumination is obtained. Note that the σ value as the illumination condition is preferably set to fall within the range of about 0.1 to 0.3 in use of the phase shifting reticle.

FIG. 19 exemplifies the case in which when the reticle is to be loaded in a reticle stage RS, the illumination condition most suitable for the type of reticle (normal reticle or phase shifting reticle) or the degree of micropatterning (periodicity, pitch, direction, or the like) is set for each reticle on the basis of reticle information (name) read by a bar code reader 52. However, the illumination condition may be changed for a single reticle.

In the description with reference to FIG. 23, the curve $K_1$ cannot be expressed as the sum of the curves $K_2$ and $K_3$. However, when the imaging characteristics need not be strictly controlled, and the throughput is taken as the first priority, a method of calculating the amounts of changes in imaging characteristics in accordance with an approximated relation $K_1=K_2+K_3$ may be employed. In this case, the relationships between magnitudes of the calculation errors of the imaging characteristics and the illumination conditions, reticles, or patterns are determined in advance. An actual value is compared with this allowable error value. Only when the error is allowed, the above method can be used.

As shown in FIGS. 19 and 30, the imaging characteristics (e.g., the focal position and the curvature of field) of the projection optical system are measured using the pattern plate 15, e.g., once a day because frequent measurement may cause a decrease in throughput. However, when the exposure operation is kept stopped for the predetermined period of time upon a change in illumination condition, as described above, the measurement may be frequently performed to continue the exposure operation. In this case, although the throughput is decreased by the frequent measurement, a decrease in throughput caused by the stop of the exposure operation can be reduced, thereby reducing the overall decrease in throughput.

The above embodiment may employ a method of radiating the projection optical system under a new illumination condition without performing actual exposure so as to positively cause the projection optical system to follow the new illumination condition. In this case, for example, a shutter must be arranged between the projection optical system PL and the wafer W to prevent the illumination light from reaching the wafer or to retract the wafer stage WS so as to prevent the wafer W from being optically sensed during the above irradiation. When the imaging characteristics are to be measured using the pattern plate 15 during the stop of the exposure operation, a spatial filter for obtaining the same condition as the new condition is preferably arranged near the exit surface of the fiber bundle 62, thereby measuring the imaging characteristics.

The sixth embodiment of the present invention will be described with reference to FIGS. 27 to 29. A projection exposure apparatus of this embodiment is substantially the same as that of the fifth embodiment (FIG. 19), and a detailed description thereof will be omitted.

A method of inhibiting an exposure operation in accordance with a thermal accumulation amount of heat accumulated in a projection optical system PL upon incidence of illumination light will be described below. In the imaging characteristic correction mechanism described above, items to be corrected (e.g., the focal position, the projection magnification, and various aberrations) have been described. It is practically impossible to correct all the imaging characteristics varying in accordance with the thermal accumulation amount. In general, one or two of the imaging characteristics are selected from the ones which greatly affect the imaging pattern (the projection image of the reticle pattern) and are corrected. For this reason, if the exposure operation is not executed if influences (amounts of changes) of items not to be corrected by the above correction mechanism fall within the predetermined allowable values, pattern exposure having a sufficiently high resolving power cannot be performed. It is also practically impossible to nullify the correction errors (amounts of changes). The exposure operation must be performed when these correction errors fall within the allowable range of values. Judging from the above description, a method is proposed wherein the reference value of the thermal accumulation amount is determined so that when the amounts of changes in imaging characteristics corresponding to the thermal accumulation amount of the projection optical system PL, which changes are caused by the exposure light absorption, are set below the reference values, the exposure operation is performed.

The most problematic imaging characteristic upon completion of the correction as described above will be taken into consideration. This imaging characteristic is coma. Coma is not included in the imaging characteristics corrected by the imaging characteristic correction mechanism described above. The change characteristics of coma corresponding to the thermal accumulation amount of the projection optical system PL by the illumination light absorption are expressed as a primary delay system or a sum of primary delay systems as in the projection magnification of the fifth embodiment. If a model representing the change characteristic of coma, which is obtained by an experiment or simulation in advance, is stored in a memory (not shown) in a main controller 50, the thermal accumulation amounts of the projection optical system are sequentially calculated as disclosed in U.S. Pat. No. 4,666,273, thereby obtaining an amount of change in coma by the thermal accumulation value. When the calculated value is compared with the allowable limit value for coma (amount of change) to determine whether the exposure operation is interrupted. In practice, the amount of change in coma need not be obtained. A relationship between the thermal accumulation amount of the projection optical system and the amount of change in coma is obtained in the experiment or simulation in advance, and the reference value of the thermal accumulation amount corresponding to the allowable limit value of coma is stored. The thermal accumulation amount obtained by the above sequential calculation is compared with the reference value. When the thermal accumulation amount reaches the reference value, the exposure operation may be stopped.

Various detailed sequences for preventing degradation of imaging patterns caused by coma may be proposed. In this case, the amount of change (i.e., the amount of aberration) in coma is compared with the allowable limit value (or comparison between the thermal accumulation amount and the reference value), as will be described with reference to FIG. 27. The amount $\Delta G$ of change in coma is plotted along the ordinate, and time t is plotted along the abscissa. In this case, a sufficient time has elapsed from the end of the previous exposure operation, and the projection optical system PL has been cooled. That is, the thermal accumulation amount is almost zero. An exposure operation is started in this state. FIG. 27 shows that the exposure operation is started at time $t_0$. A time interval $T_1$ represents an exposure processing period (including a stepping period) for all shot areas on one wafer. A time interval $T_2$ represents a period in which operations including wafer exchange and wafer alignment except for the exposure operation are performed. In practice, since the exposure operation is performed in accordance with the step-and-repeat scheme, a shutter SH repeats opening/closing of the illumination light path even within the time interval $T_1$. That is, during movement (during stepping) of the wafer stage, the illumination light is not incident on the projection optical system PL, and the amount $\Delta G$ of change is reduced. For this reason, a curve representing the amount $\Delta G$ of change within the time interval $T_1$ is not a smooth curve but a zig-zag curve shown in FIG. 27.

However, the average curve as the smooth curve of the zig-zag curve is assumed in this case. When exposure processing on the wafer continues, as shown in FIG. 27, the amount $\Delta G$ of change is gradually increased. $G_{L1}$ in FIG. 7 indicates the allowable limit value of the amount $\Delta G$ of change. When It is determined using this limit value $G_{L1}$ whether the exposure operation on the wafer is continued, the amount $\Delta G$ of change during the exposure operation on the wafer exceeds the limit value $G_{L1}$ (a curve $G_{V2}$ in FIG. 27), and exposure of the remaining shot areas of the wafer is performed such that imaging patterns are kept degraded. For this reason, in practice, a value slightly smaller than the limit value $G_{L1}$, i.e., a value $G_{L2}$ smaller than the limit value $G_{L1}$ by an increment corresponding to the amount $\Delta G$ of change upon exposure processing on one wafer is set as the limit value. This limit value $G_{L2}$ is used as the reference for determining whether the exposure operation is continued or inhibited.

Figure 27:
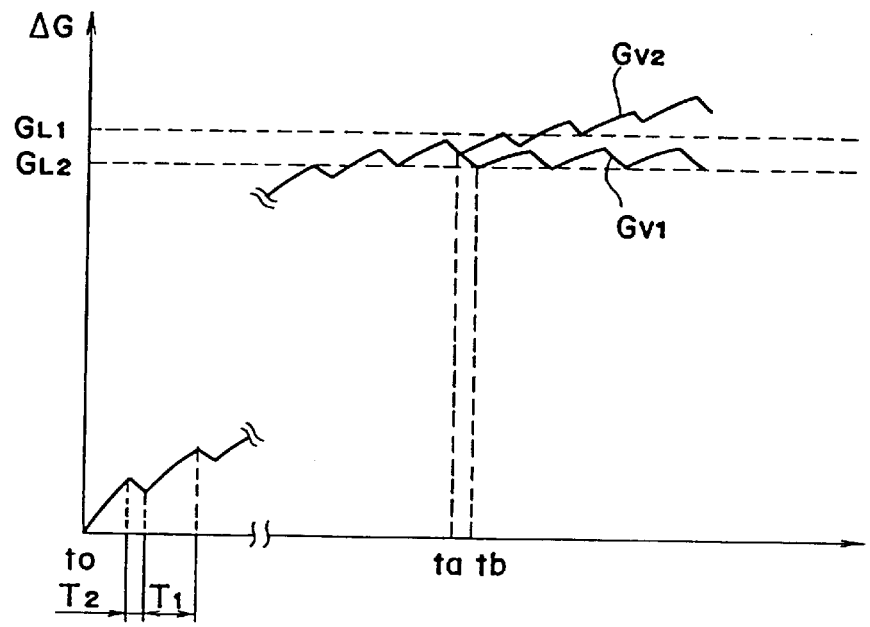
FIG. 27 is a graph for explaining an allowable limit value (LIMIT) to be set for an amount of change in imaging characteristic of the projection optical system caused by illumination light absorption.

As shown in FIG. 27, the amount $\Delta G$ of change in coma at time ta exceeds the limit value $G_{L2}$. When the exposure operation continues, the amount $\Delta G$ of change exceeds the limit value $G_{L1}$, as indicated by the curve $G_{V2}$. Before the exposure operation on the next wafer is performed (i.e., at time ta), the amount $\Delta G$ of change is compared with the limit value $G_{L2}$. The exposure operation is interrupted in accordance with this comparison result and is kept stopped until the amount $\Delta G$ of change is the limit value $G_{L2}$ or less. When the amount $\Delta G$ of change becomes the limit value $G_{L2}$ (time tb), the exposure operation is restarted, so that the amount $\Delta G$ of change is kept below the limit value $G_{L1}$. That is, exposure can be performed while degradation of the imaging pattern, caused by coma, is suppressed within a predetermined allowable range (a curve $G_{V1}$ in FIG. 27).

According to the above method, the number of wafers processed per unit time can be reduced due to the stop time (tb–ta), and the productivity (throughput) of the apparatus is decreased. However, the number of defective products caused by the degradation of the imaging characteristics can be reduced, thereby preventing a decrease in product yield. Coma is exemplified in the above description. The types and number of imaging characteristics to be applied to the above method, the allowable limit values of the amounts of changes in imaging characteristics, and the like may be determined in consideration of magnitudes of influences, the throughput, the product yield, and the like. In the above method, the amount $\Delta G$ of change is compared with the limit value $G_{L2}$ every wafer exchange. However, this comparison may be performed every shot. That is, the comparison may be performed every unit shot, every wafer (or every lot) or every unit time. Alternatively, the amounts of changes in imaging characteristics to be reduced within an exposure stop time (corresponding to the stepping time) between the shots, and a wafer stage WS may be stepped with an exposure stop time required to reduce the amounts of changes by predetermined amounts. This scheme is effective when a so-called die-by-die scheme for performing alignment every shot when second and subsequent reticle patterns are overlapped and exposed. In addition, the stepping speed can be reduced to reduce the vibrations of the apparatus, and the wafer stage WS can be gradually positioned to a target stop position (exposure position) within a relatively long period of time, thereby improving positioning precision.

The operation for suppressing the amount of change in each imaging characteristic of the projection optical system below the allowable limit value (or suppressing the thermal accumulation amount of the projection optical system below the reference value) will be described below. The amount of change in imaging characteristic (particularly aberration) and a change characteristic (time constant) are changed upon a change in illumination condition. The imaging characteristic required to interrupt the exposure operation so as to suppress the amount of change below the allowable limit value, i.e., the "most problematic imaging characteristic in practice" is changed depending on the illumination condition. For example, when the coma and the σ value are small in the oblique illumination method, the amount of change in spherical aberration must be suppressed below the allowable limit value. In the above description (i.e., coma), the "most problematic imaging characteristic in practice" is determined by the magnitude (i.e., the magnitude of influence on the imaging pattern) of the amount of change in imaging characteristic. However, in practice, this determination must also be performed in consideration of the change characteristic, i.e., change speed (rate of change). FIG. 28 shows the relationship between an amount Δ of change in imaging characteristic and time t when a large irradiating energy amount is applied to the projection optical system PL under a predetermined illumination condition. FIG. 28 shows variations in three imaging characteristics a to c. A value obtained by normalizing the amount Δ of change by an allowable limit value $\Delta_L$ is plotted along the ordinate, and time t is plotted along the abscissa. In FIG. 28, the allowable limit value $\Delta_L$ of the imaging characteristic is set to be 1.0, and the exposure operation is started from time $t_0$. Although three curves CVa to CVc in FIG. 28 are zig-zag curves like the curve $G_{V2}$ in FIG. 27, these curves are averaged and smoothed.

Figure 28:
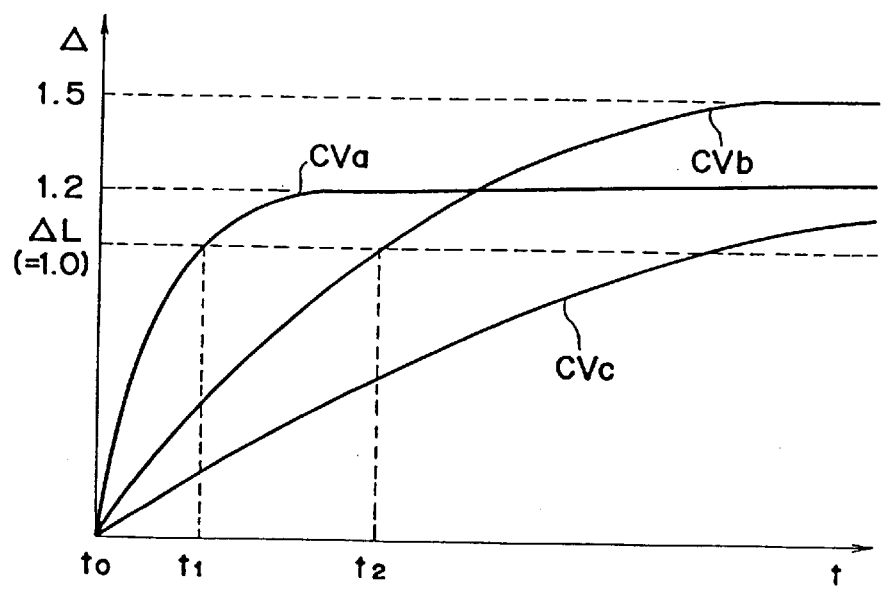
FIG. 28 is a graph for explaining a method of setting the allowable limit value for the amount of change in imaging characteristic.

When the magnitude of the amount of change is taken into consideration in FIG. 28, the "most problematic imaging characteristic in practice" is a characteristic b (curve CVb). When the amount Δ of change reaches the limit value $\Delta_L$ (time t2), the exposure operation is stopped. However, since the amount Δ of change in characteristic a (curve CVa) exceeds the limit value $\Delta_L$ at time $t_1$, the characteristic a has the top priority, and the exposure operation must be stopped at time $t_1$. When exposure is performed while the exposure operation is stopped in consideration of only the characteristic a, the amount of change can be suppressed below the allowable limit value $\Delta_L$ under the condition that the average amount of irradiating energy incident on the projection optical system PL is set to be 1/1.2 as compared with the case wherein the exposure operation is not stopped, as shown in FIG. 28. However, in order to set the amount of change in characteristic b to be less than $\Delta_L$, the average amount of energy must be set to be 1/1.5. That is, when only the characteristic a is taken into consideration, the amount of change in characteristic b exceeds the limit value $\Delta_L$ when the stop time has sufficiently elapsed. In the imaging characteristic shown in FIG. 28, a sequence must be employed such that the amounts of changes in characteristics a and b must be sequentially checked, and the exposure operation must be stopped so as to cause both the amounts of changes to fall below the limit value $\Delta_L$ when at least one of the amounts of changes exceeds the limit value $\Delta_L$.

Upon a change in illumination condition, an imaging characteristic subjected to the sequential calculation of the amount of change is selected as the "most problematic imaging characteristic in practice" under the changed illumination condition. Amounts of changes in only the selected imaging characteristic must be sequentially calculated and compared with the allowable limit value during the exposure operation. In the case of FIG. 28, the amounts of changes in characteristics a and b must be calculated. If both the amounts of changes in characteristics a and b are below the allowable limit value $\Delta_L$, the amount of change in characteristic (curve CVc) must be below the limit value $\Delta_L$. The amount of change in characteristic c need not be calculated. If the change characteristics (time constants) of the imaging characteristics are almost identical in the respective aberrations, an imaging characteristic subjected to calculation must be selected (determined) in consideration of only the amount of change, as a matter of course. When the selected imaging characteristic is subjected to correction of the amount of change by, e.g., the imaging characteristic correction mechanism (FIG. 19), the amount of change need not be calculated by a new calculation. The amount of change calculated for use in the correction mechanism can be directly used in comparison with the limit value $\Delta_L$.

In the above description, the allowable limit value of the amount of change in each imaging characteristic under the predetermined illumination condition is given as a predetermined value. However, the limit value may be practically changed in accordance with a degree of micropatterning (e.g., the line width and pitch) and the shape (i.e., an arrangement within the pattern surface) of the reticle pattern to be exposed, although the illumination condition is kept unchanged. If information associated with the reticle pattern is not input, the allowable limit value must be determined under the most strict condition. The throughput may be excessively decreased depending on types of reticle patterns. For this reason, for example, information associated with a reticle pattern (e.g., a line width) may be formed as a bar code on the reticle, or information associated with the reticle pattern is stored in a memory of the apparatus in correspondence with the name (bar code BC) of the reticle. When a reticle R is placed on a holder 14, the bar code is read by a bar code reader 52 to automatically set the illumination condition, and a (most appropriate) allowable limit value (the reference value for the thermal accumulation amount of the projection optical system) of the amount of change in imaging characteristic can be set so as to be most suitable for the illumination condition and the reticle pattern. Therefore, the decrease in throughput more than necessary can be prevented.

The above description is based on an assumption that a time has sufficiently elapsed upon a change in illumination condition, and the influence of the illumination condition prior to the change in illumination condition is lost (i.e., the thermal accumulation amount left in the projection optical system as the history is almost zero). The exposure operation is started in this state. Assume that an exposure operation is restarted under the updated illumination condition immediately after the illumination condition is changed during the exposure operation of one wafer. Since the history is maintained in the projection optical system PL under the previous illumination condition, the amount of change in each imaging characteristic cannot be expressed as a simple sum of the amounts of changes under these two illumination conditions. When the allowable limit value (or the reference value for the thermal accumulation amount) for the amount of change upon the change in illumination condition is simply changed to a value most suitable for the updated illumination condition, it is difficult to set the amount of change in imaging characteristic to fall within the predetermined range. In addition, in order to sequentially calculate the amounts of changes in imaging characteristic, the temperature distribution of the lens element in a transient state upon the change in illumination condition must be calculated, and the corresponding amount of change must be known. This amount can be theoretically obtained, but it is very difficult and impractical to obtain this amount because the illumination conditions before and after the change overlap each other in practice.

As described with reference to the fifth embodiment, after the shutter is closed to change the illumination condition to stop the exposure operation, the exposure operation is kept stopped for a predetermined period of time until the influence (history) of the previous illumination condition becomes very small, e.g., until the amount Δ of change in imaging characteristic is reduced to the predetermined level (threshold value) Ms. The shutter is opened when the amount Δ of change reaches the predetermined level Ms, and the exposure operation under the updated illumination condition is started. According to this method, the history of the previous illumination condition can be eliminated. When the allowable limit value for the amount of change in imaging characteristic (or the reference value for the thermal accumulation amount) is simply changed to a value most suitable for the updated illumination condition to cause the amount of change in imaging characteristic to fall within the predetermined allowable range. Note that the level Ms may be determined such that a difference (calculation error) between the amount of change in imaging characteristic sequentially calculated under the updated illumination condition (calculation parameters) and the actual amount of change in imaging characteristic is set to be a predetermined allowable value (solely determined in accordance with control precision of the imaging characteristic). At this time, in order not to decrease the throughput of the apparatus, i.e., in order to shorten the exposure stop time, the level Ms must have a value as large as possible. In practice, the level Ms corresponding to a combination of various illumination conditions is preferably obtained by an experiment or simulation in advance.

On the other hand, when the exposure operation is not interrupted during the change in illumination condition, and exposure is immediately started upon the change in illumination condition, the allowable limit value (or the reference value for the thermal accumulation amount) corresponding to the amount of change in imaging characteristic in the transient state upon the change in illumination condition must be strictly calculated by an experiment or simulation in consideration of irradiation amounts (thermal accumulation amounts) to the projection optical system before and after the change in illumination condition, the exposure stop time upon the change in illumination condition, and the like. When variations (types) of irradiating amounts under the respective illumination conditions are taken into consideration, it is complicated and impractical to determine allowable limit values for the amounts of changes under these illumination conditions. In addition to the determination of the allowable limit values, when the exposure operation is immediately started upon the change in illumination condition, it is complicated and difficult to sequentially calculate the amounts of changes in imaging characteristic, which difficulty also must be taken into consideration. However, when the variation in light amount distribution on the pupil plane of the projection optical system upon a change in illumination condition or the amount of change in imaging characteristic and the variation in change characteristic are small, the above calculations can be relatively easily performed. Therefore, the exposure operation may be immediately started upon the change in illumination condition.

When the exposure operation is stopped under the condition that the amount of change in imaging characteristic exceeds the allowable limit value (or the reference value for the thermal accumulation amount of the projection optical system), or when the illumination condition is changed, the amount of change in imaging characteristic (or the thermal accumulation amount) is gradually decreased. As described above, however, since the amounts of changes are sequentially calculated for the imaging characteristic correction mechanism, a decrease in the amount of change need not be separately calculated.

Processing inside the main controller 50 will be described with reference to a flow chart in FIG. 29. In this case, the illumination condition is not changed for the same reticle, and reticle exchange is not performed while each wafer is subjected to exposure. Although not shown in FIG. 19, the main controller 50 comprises a control portion for controlling the overall operation of the apparatus in addition to control of the change in illumination condition and the start and stop of the exposure operation, a calculation portion for determining the illumination condition and the allowable limit value for the amount of change in imaging characteristic in each reticle pattern (or the reference value for the thermal accumulation amount) and calculating the amount of change in imaging characteristic (or the thermal accumulation amount of the projection optical system), and a storage portion (memory) for storing operation parameters corresponding to the names of a plurality of reticles, e.g., calculation parameters for calculating the illumination condition and the thermal accumulation amount (or the corresponding amount of change in imaging characteristic) of the projection optical system.

Figure 29:
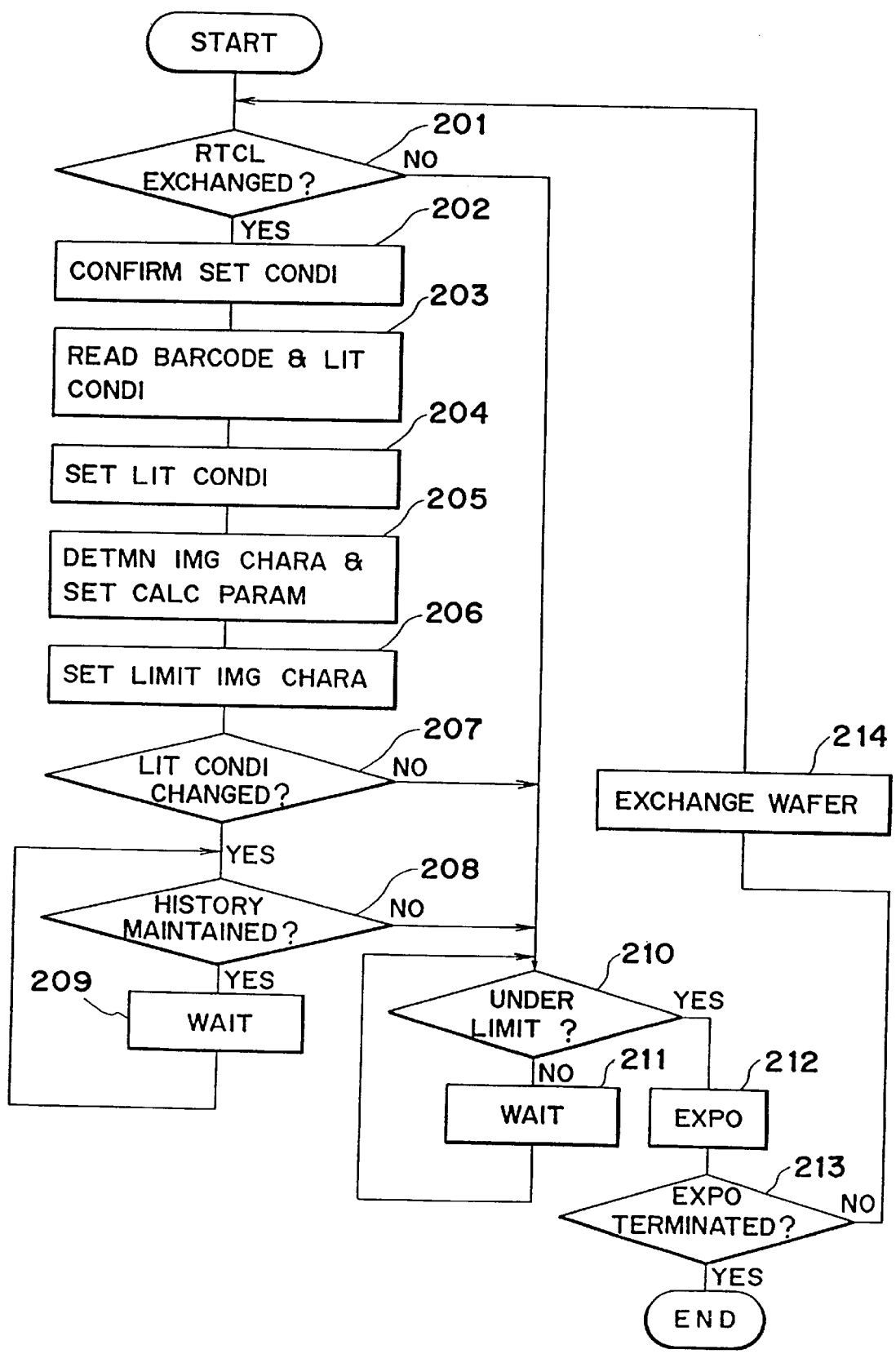
FIG. 29 is a flow chart showing a control operation of the imaging characteristics of the projection optical system.

As shown in FIG. 29, in step 201, the main controller 50 confirms whether a reticle is placed on the holder 15. If any reticle is not placed on the holder 14, a reticle is immediately loaded on the basis of input information from a keyboard 51 by an operator or an installed program (exposure sequence). If YES in step 201, the main controller 50 determines whether a new reticle is loaded in the holder 14 (i.e., whether the reticle is exchanged). In this case, reticle exchange is determined, and the flow advances to step 202. In step 202, the main controller 50 confirms the state of the exposure apparatus (set condition), i.e., whether the illumination condition is set as normal illumination, annular illumination, or oblique illumination, and the σ value of the illumination optical system, the numerical aperture of the projection optical system PL, the aperture shape and position of a variable blind 10, and the like. These confirmation operations are performed by checking the set states of a drive system 54, variable aperture stops 8 and 32, or the variable blind 10. Note that the above operations may be performed by reading out various conditions corresponding to the reticle R (bar code BC) on the reticle holder 14 from the memory.

In step 203, a bar code BC of a reticle R newly loaded on the holder 14 is read. The main controller 50 reads out operation parameter data corresponding to the bar code BC (reticle name). As a result, the main controller 50 recognizes the illumination condition (optimal) most suitable for the type of reticle (normal reticle or phase shifting reticle), the degree of micropatterning and periodicity of the pattern of the reticle, i.e., normal illumination, annular illumination or oblique illumination, conditions such as inner and outer diameter and a ring ratio (i.e, a ratio of the inner diameter to the outer diameter) in the case of annular illumination, the number of fly-eye lens groups and positions thereof in the case of oblique illumination, the σ value of the illumination optical system, the numerical aperture of the projection optical system PL, and the aperture shape and position of the variable blind 10.

The main controller 50 drives a holding member 100, the variable aperture stops 8 and 32, and the variable blind 10 on the basis of the illumination condition (LIT CONDI) read out in step 203, and the reticle R and the illumination condition optimal for the pattern of the reticle R are set (step 204). In step 204, only conditions different from the illumination conditions confirmed in step 202 are changed. If any condition need not be changed, the flow immediately advances to step 205. As an example of a change in illumination condition, if the reticle pattern is a two-dimensional line-and-space pattern, the control portion rotates the holding member 100 to set fly-eye lenses 64A to 64D in the illumination optical path and finely adjusts the positions of the fly-eye lenses 64A to 64D near the pupil plane of the illumination optical system in accordance with the pitch and periodic direction of the pattern. In addition, the variable aperture stops 8 and 32 and the variable blind 10 are readjusted.

When the illumination condition is changed, e.g., from normal illumination (the fly-eye lens 7) to oblique illumination (the fly-eye lenses 64A to 64D), the illumination light passing area is changed in the projection optical system PL before and after the change in illumination condition. For this reason, it is preferable to adjust the imaging characteristics (IMG CHARA) of the projection optical system PL by the imaging characteristic correction mechanism in FIG. 19 such that the projection magnification and various aberrations (e.g., the distortion, curvature of field, astigmatism, coma, and spherical aberration) of the projection optical system PL are set to be optimal values, zero, or allowable ranges under the updated illumination condition. A correction amount (e.g., a drive amount for the reticle or lens element) of the imaging characteristic correction mechanism under each illumination condition that the history (thermal accumulation) is not left in the projection optical system PL or the amount of change in each imaging characteristic under each illumination condition is set to be Ms or less. The imaging characteristic is controlled on the basis of the above correction amount prior to the start of the exposure operation under the updated illumination condition to adjust the imaging characteristics of the projection optical system PL. The aberrations (e.g., coma and spherical aberration) which cannot be corrected by the imaging characteristic correction mechanism are corrected by a given one of the lens elements constituting the projection optical system PL. This given lens can change the aberrations which cannot be corrected by the imaging characteristic correction mechanism and cannot almost change other aberrations, and is arranged to be finely movable.

The main controller 50 determines a reticle and a target imaging characteristic, i.e., the "most problematic imaging characteristic in practice" under the illumination condition using this reticle. In this case, a plurality of imaging characteristics such as the imaging characteristics a and b in FIG. 28 may be determined. When an imaging characteristic (to be referred to as a target imaging characteristic hereinafter) serving as a calculation target in which an allowable limit value for the amount of change is to be designed is determined, an amount of change (or a rate of change) of the target imaging characteristic and a change characteristic (time constant) under the new illumination condition are read out from the memory, and the calculating portion calculates amounts of changes in the target imaging characteristic (step 205). Thereafter, even pattern information (e.g., the line width and the density distribution within the pattern surface) of the reticle R to be exposed is read out from the memory to determine the allowable limit value (LIMIT) (corresponding to $G_{L2}$ in FIG. 27) for the amount of change in the set target imaging characteristic (step 206), thereby completing setting of various conditions in the main controller 50.

The main controller 50 determines whether the illumination condition is changed (step 207). The illumination condition read out from the memory under the new reticle R is determined to be different from the conditions confirmed in step 202, and the flow advances to step 208. Note that the flow immediately advances to step 210 when the illumination condition is determined in step 207 not to be changed.

The main controller 50 determines in step 208 whether the history of the previous illumination condition is maintained in the projection optical system PL, i.e., whether the amount of change in imaging characteristic of the projection optical system PL by the history is the level Ms or less. In this case, the exposure operation is stopped due to the change in illumination condition, and the amount of change is gradually decreased accordingly. The calculation for decreasing the amount of change in imaging characteristic is continuously performed from the stop of exposure operation on the basis of the operation parameters (e.g., the time constant) under the previous illumination condition. Therefore, the main controller 50 compares the calculated value with the level Ms. If the calculated value is the level Ms or less, the main controller 50 determines that the history is not maintained in the projection optical system PL, i.e., that the amounts of changes in imaging characteristic can be sequentially calculated using the operation parameters under the updated illumination condition. The flow then advances to step 210.

On the other hand, if the main controller 50 determines that the history is maintained in the projection optical system PL, the flow advances to step 209 to wait for a predetermined period of time (e.g., a few seconds). The flow returns to step 208 to determine whether the amount of change in imaging characteristic is level Ms or less. If the history is determined to be still maintained, the flow advances to step 209 again. Steps 208 and 209 are repeated, and the flow advances to step 210 when the amount of change in imaging characteristic becomes the level Ms or less. In this case, the determination is performed every predetermined period of time. However, a wait time required for setting the amount of change in imaging characteristic to be the level Ms or less may be calculated in accordance with, e.g., the decrementing calculation using the operation parameters. Every time the wait time has elapsed, the flow may immediately advance to step 210.

The imaging characteristic for determining whether the amount of change is the level Ms or less may be all imaging characteristics as aberrations including the projection magnification, or only the target imaging characteristic determined under the updated illumination condition in step 204. Assume that the target imaging characteristic is changed before and after the change in illumination condition. In this case, when the amount of change in target imaging characteristic becomes the level Ms or less under the previous illumination condition, or when the amount of change in target imaging characteristic under the updated illumination condition is subjected to the decrementing calculation using the operation parameters under the updated illumination condition, and the calculated value is the level Ms or less, the flow advances to step 210.

The main controller 50 determines in step 210 whether the amount of change in target imaging characteristic is the allowable limit value or less. This determination is performed by comparing the sequentially calculated amounts of changes with the allowable limit value in the same manner as in step 208. If the amount of change (calculated value) is the allowable limit value or less, the flow immediately advances to step 212 to start exposure on the wafer. On the other hand, when the amount of change exceeds the allowable limit value, the flow advances to step 211 to wait until a predetermined period of time (e.g., one second) has elapsed. The flow returns to step 210 to determine whether the amount of change is the allowable limit value or less. Steps 210 and 211 are repeated, and the flow advances to step 212 when the amount of change is the allowable limit value or less. A wait time required for setting the amount of change to be the allowable limit value or less may be calculated from the decrementing calculation using the operation parameters as in step 211. When the wait time has elapsed, the flow may immediately advance to step 212.

The pattern of the reticle R is sequentially exposed on the wafer W under the new illumination condition in step 212. When the exposure is terminated, the main controller 50 determines whether exposure for the next wafer is performed (step 213). In this case, since exposure of only the first wafer is terminated, the flow advances to step 214 to execute wafer exchange. The main controller 50 determines whether reticle exchange for the second wafer is performed (step 202). In this case, pattern exposure of the same wafer is to be performed, so that the flow advances to step 210. In step 210, the amount of change in target imaging characteristic is compared with the allowable limit value. If the amount of change is the allowable limit value or less, the flow advances to step 212 to start exposure of the second wafer. The above sequence is repeated until the end of exposure of all wafers to be exposed. As a result, pattern exposure on the wafers can always be performed in accordance with high-precision imaging characteristics. Note that steps 202 to 206 are repeated to perform reticle exchange. When the illumination condition is to be further changed, steps 208 and 209 may be performed. In addition, if the illumination condition is not changed even after reticle exchange, steps 205 and 206 need not be executed.

If an exposure sequence for all the wafers subjected to exposure does not include reticle exchange, step 210 is executed at the end of step 214 in the flow chart shown in FIG. 29. This sequence is based on an assumption that the amount of change in imaging characteristic is compared with the allowable limit value every wafer exchange. FIG. 29 illustrates the sequence in which the illumination condition is not changed for the same reticle. A sequence for changing the illumination condition every unit wafers (or shot areas) or every lot may be employed even if the same reticle is used. In addition, a sequence for exchanging the reticles and changing the illumination condition every unit shot (e.g., every shot) on the same wafer may be employed although reticle exchange is not performed for the same wafer in the above sequence. This embodiment is particularly effective when exposure is performed on the wafer under various illumination conditions by changing the illumination conditions as described above.

When the normal reticle is exchanged to the phase shifting reticle (or vice versa) in step 202, since the flow immediately advances from step 202 to step 210 in FIG. 29, any change in illumination condition (e.g., driving of the holding member 100 and a change in σ value) need not be performed. However, since the light amount distribution is changed on the pupil plane of the projection optical system PL, a sequence in which steps 208 and 209 are performed is employed because the above reticle exchange is regarded to correspond to the change in illumination condition. If a reticle except for a phase shifting reticle is a reticle whose light amount distribution on the pupil plane of the projection optical system PL is changed, e.g., a so-called halftone reticle as a normal reticle in which some light-shielding portions (chromium or the like) constituting the pattern of the reticle have a transmittance, steps 208 and 209 are preferably executed because the change in illumination condition is regarded to occur. In addition, when exposure is performed wile the illumination condition is being changed for the same reticle, this embodiment is directly applicable to this to obtain the same effect as described above.

In the above embodiment, the amounts of changes in imaging characteristic are sequentially calculated and are compared with the level Ms or the allowable limit value in steps 208 and 210. However, the relationship between the thermal accumulation amount of the projection optical system PL by the illumination light absorption and the amount of change in corresponding imaging characteristic is obtained, and the thermal accumulation amount corresponding to the allowable limit value (or the level Ms) for the amount of change in imaging characteristic is stored as the reference value. In steps 208 and 210, only the thermal accumulation amounts of the projection optical system PL may be calculated, and the calculated thermal accumulation amounts (calculated values) may be compared with the reference value to determine whether the exposure operation is started.

In this embodiment, the main controller 50 controls even the start and stop of the exposure operation as described above. However, an exposure operation control unit may be arranged independently of the main controller 50. The exposure operation control unit may input illumination conditions to control the exposure operation. In this case, the main controller 50 may simply supply various conditions and calculation results to the unit. Although not shown in FIG. 19, a display unit (e.g., a cathode-ray tube) for displaying a calculation result and an operating state of the exposure apparatus in the main controller 50 to the operator may be arranged to inform the operator of the lapse of the exposure stop time while the exposure operation is kept stopped in steps 209 and 211. At this time, the exposure stop time can be easily obtained from the decrementing calculation of the amount of change in imaging characteristic.

In the above embodiment, the allowable limit values are set for the amounts of changes in target imaging characteristics (e.g., the coma and spherical aberration). When the amounts of changes exceed the limit values, the exposure operation is stopped. The amounts of changes in other imaging characteristics (e.g., the projection magnification, distortion, curvature of field, and astigmatism) are sequentially corrected to always fall within the allowable ranges by means for the imaging characteristic correction mechanism. However, any combination of the imaging characteristics selected as the target imaging characteristics and the imaging characteristics corrected by the correction mechanism may be selected. For example, coma and curvature of field may be selected as the target imaging characteristics. The projection magnification and the distortion may be sequentially corrected by the correction mechanism, and only coma may be selected as the target imaging characteristic, depending on the types of reticles and their patterns, and the illumination conditions.

In the above embodiment, each imaging characteristic to be selected as the target imaging characteristic is clearly distinguished from each imaging characteristic corrected by the correction mechanism. However, even an imaging characteristic whose amount of change is sequentially corrected by the correction mechanism may be selected as a target imaging characteristic, i.e., as an imaging characteristic whose change amount has an allowable limit value, and the amounts of changes sequentially calculated are compared with the allowable limit value to determine whether the exposure operation is started in substantially the same manner as described above due to the following reason. Even in the imaging characteristic whose amount of change is corrected by the correction mechanism, correction of the amount of change (aberration amount) by the correction mechanism has a limit depending on the types of aberrations (e.g., curvature of field), and the amount of change cannot be perfectly corrected. The amount is gradually increased, and the total amount (total of residual correction errors) of changes finally exceeds the allowable limit value.

In step 210, when the amount of change in target imaging characteristic exceeds the allowable limit value, the exposure operation is kept stopped until the amount of change is decreased below the limit value. When the throughput is considered as the top priority, for example, the imaging characteristic correction mechanism is used or a lens element effective to correct the amount of change in target imaging characteristic is driven to positively suppress the amount of change below the allowable limit value. At this time, since the relationship between the thermal accumulation amount of the projection optical system PL and the amount of change in corresponding imaging characteristic is changed, the relationship is updated on the basis of the above correction amount (drive amount). It is preferable that the amount of change in imaging characteristic is calculated on the basis of the updated relationship, and that the calculated value is compared with the allowable limit value.

In the above embodiment, the light amount (illuminance) distribution near the pupil plane of the projection optical system PL, which corresponds to the type of reticle or pattern and the illumination condition, is taken into consideration. However, the imaging characteristics may vary depending on the variations in illuminance distribution of the lens element of the projection optical system PL near the reticle, which illuminance distribution varies with a change in density distribution of the reticle or its pattern. In this case, the amount of change in imaging characteristic can be suppressed below the allowable limit value as in the above embodiment. When the illumination light is nonuniformly radiated on the lens element near the reticle due to a change in illumination field by the variable blind 10 or a change in density distribution of the reticle pattern, the imaging characteristic is changed as compared with the case in which the illumination light is almost uniformly radiated on the lens element although the irradiating amount is kept unchanged. In this case, both the illuminance distributions near the pupil plane of the projection optical system PL and the lens element near the reticle are taken into consideration. The illuminance distribution of the lens element is also regarded as one of the changes in illumination conditions, and the amounts of changes in illuminance distribution are sequentially calculated to manage the strict imaging characteristics.

In the above embodiment, the changes in imaging characteristics, which are caused by the thermal accumulation amount of the projection optical system due to illumination light absorption, have been taken into consideration. However, the amounts of changes in imaging characteristics may be calculated also in consideration of changes in environments (e.g., the atmospheric pressure and temperature) of the projection optical system PL, although the changes in environments are smaller than the illumination light absorption.

There is recently proposed focal position detection in which a reference pattern formed on the same level as that of the wafer surface is irradiated with exposure light transmitted inside the wafer stage WS through a fiber bundle or the like, and light (of the pattern image) reflected by the lower surface (pattern surface) of the reticle R is photoelectrically detected through the reference pattern, while the wafer stage WS is kept moved along the direction of optical axis of the projection optical system PL, thereby detecting a focal position of an arbitrary point within the exposure field of the projection optical system PL. For example, a plurality of spatial filters are exchangeably arranged near the exit end face of, e.g., a fiber bundle, and the illuminance distribution formed on the pupil plane of the projection optical system PL is set to be kept almost identical under all illumination conditions (including the phase shifting reticle) of the illumination optical system. Even if a focal position is detected by the apparatus having the above arrangement, the projection optical system PL absorbs the exposure light, and its imaging characteristic is changed. It is therefore preferable to calculate the amount of change in imaging characteristic in consideration of the thermal accumulation amount of the projection optical system by exposure light absorption.

The above embodiment exemplifies the change in illumination condition from normal illumination to oblique illumination. However, for example, when only the σ value of the illumination optical system is to be changed, and normal illumination is to be changed to annular illumination (or vice versa), fly-eye lenses 62A and 62B, 65A and 65B, and 64A to 64D are exchanged to each other in accordance with the periodicity of the reticle pattern in oblique illumination. Alternatively, the present invention is also effective when the individual fly-eye lens groups are finely moved even in the same fly-eye lenses described above and the illumination field is changed by the variable blind 10, or when the numerical aperture of the projection optical system PL is changed.

According to the above embodiment, although the imaging characteristics of the projection optical system PL can always be maintained with high precision, the productivity (throughput) may be degraded by the interruption of the exposure operation. In order to eliminate the above drawbacks, the wait times in steps 209 and 210 in FIG. 29 may be preferably efficiently utilized in self calibration of the exposure apparatus which includes checks (measurements) of the focal position, the projection magnification, and the various aberrations of the projection optical system PL and the base line check of an alignment sensor. Although the projection optical system PL in FIG. 19 is constituted by only refractive elements, the projection optical system PL may be constituted by reflective elements or a combination of reflective and refractive elements.

The seventh embodiment of the present invention will be described with reference to FIGS. 34A to 34C, 35, and 36. A projection exposure apparatus of this embodiment is substantially the same as that of the fifth embodiment (FIG. 19), and a detailed description thereof will be omitted. The projection exposure apparatus (FIG. 19) of this embodiment has a focal position detection system (FIG. 14) described with reference to the fourth embodiment. The focal position detection system can detect a focal position at an arbitrary position within an image field of a projection optical system PL. In this embodiment, in addition to the focal position detection system in FIG. 14, a reference member FM (FIG. 34B) described with reference to the second embodiment (FIG. 6) and a photoelectric detector 39 are arranged on a wafer stage WS. As disclosed in U.S. Pat. No. 4,629,313, in this embodiment, the reference member FM and the photoelectric detector 39 are used to allow measurements of imaging characteristics and particularly, a projection magnification and a distortion of the projection optical system PL.

The imaging characteristics of the projection optical system PL are also changed in accordance with types of reticles as in the above-described changes in illumination conditions (e.g., a σ value, annular illumination, and a modified light source). In particular, in use of a phase shifting reticle, even if the illumination conditions remain the same, the light amount distribution of illumination light on a pupil plane Ep of the projection optical system PL greatly changes with respect to the normal reticle. Change characteristics (e.g., ΔM/E and T) of the imaging characteristics of both the reticles greatly differ from each other. In the projection exposure apparatus (main controller 50), the illumination conditions can be easily recognized. It is, however, difficult to accurately recognize the characteristics (e.g., a pitch, a line width, a duty, and a periodic direction) of each reticle. As disclosed in Ser. No. 464,621 (1990.1.3), it is very difficult to correct changes in imaging characteristics of the projection optical system PL on the basis of prestored operation parameters. This embodiment is also effective in this correction. In the changes in illumination conditions or in use of a reticle except for the phase shifting reticle, this embodiment provides a satisfactory effect although this effect is not inferior to that in use of the phase shifting reticle.

A method of measuring a projection magnification (distortion) of the projection optical system PL used in this embodiment will be described below. The measurement method used in this embodiment is disclosed in U.S. Pat. No. 4,629,313 and will be briefly described with reference to FIGS. 34A to 34C.

Figure 34A:
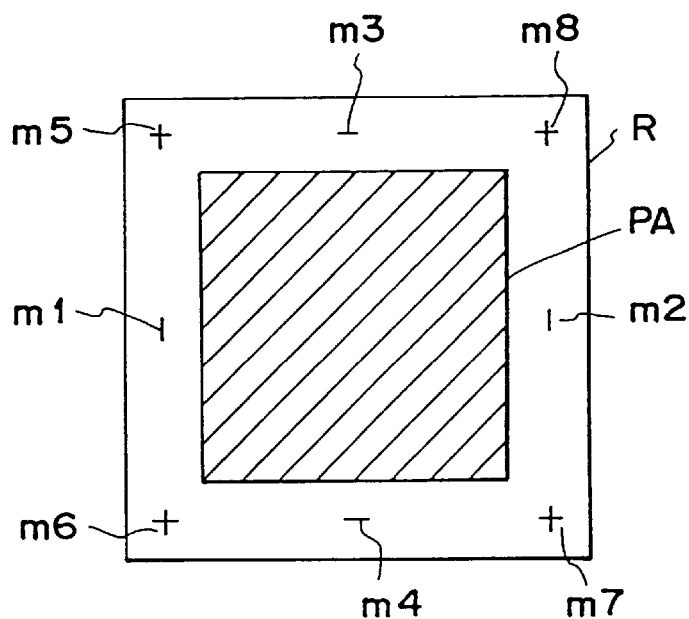
FIGS. 34A, 34B, and 34C are views for explaining the detection operation of a magnification (distortion) in a projection exposure apparatus according to the seventh embodiment of the present invention.

FIG. 34A is a plan view of a reticle R in which magnification or distortion measurement marks m1 to m8 are formed around a pattern area PA. Referring to FIG. 34A, the measurement marks m1 to m8 are accurately drawn at predetermined intervals. The measurement marks m1 to m8 need not be magnification or distortion measurement marks but may be positioning marks of the reticle R. Although not shown on the wafer stage WS in FIG. 19, the reference member FM is arranged on the wafer stage WS so as to have the same level as that of the surface of a wafer W in the Z direction as in a pattern plate 15.

Figure 34B:
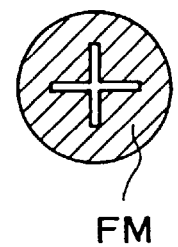

As shown in FIG. 34B, a cross-shaped opening (transparent portion) is formed on the upper surface of the reference member FM within a light-shielding portion (hatched portion). A photoelectric sensor (i.e., the photoelectric detector 39 in FIG. 6) is located below the opening. The width of the cross-shaped opening is almost equal to the width of a projected image of each of the measurement marks m1 to m8 on the reticle R upon projection of each mark on the wafer stage WS. The wafer stage WS is driven in accordance with the measurement values of the X- and Y-coordinates by an interferometer 18 to move the reference member FM to a position MP' at which each of the measurement marks m1 to m8 is to be projected. The wafer stage WS is scanned centered on the position MP' in the X or Y direction. For example, at the projection position of each of the measurement marks m1 and m2, scanning is performed in the X direction to obtain a corresponding magnification error. At the projection position of each of the measurement marks m3 and m4, scanning is performed in the Y direction to obtain a corresponding magnification error.

Figure 34C:
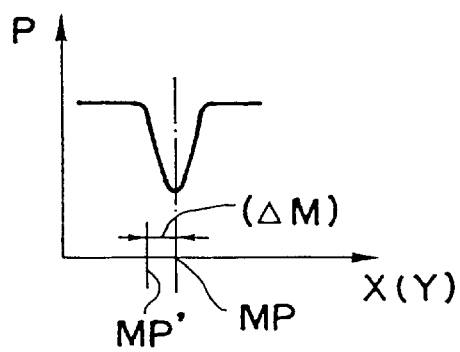

When the wafer stage WS is scanned in an open state of a shutter SH in FIG. 19, an output signal P from the photoelectric sensor 39 immediately under the reference member FM is obtained, as shown in FIG. 34C. The output signal P becomes minimum at the position MP where the projection image of each of the reticle marks m1 to m8 overlaps the center of the reference member FM. A magnification error ΔM of the projection optical system PL is obtained in accordance with a difference between the measured position MP and a design position MP' of the projection image of each of the reticle marks m1 to m8. A distortion error component ΔD of the projection optical system PL is obtained by a difference of magnification errors of a set of the measurement marks m1 to m4 (FIG. 34) and a set of the measurement marks m5 to m8 (FIG. 34), which sets have different image heights. In the above arrangement, the photoelectric sensor or detector is located below the reference member FM. However, the shutter SH in FIG. 19 may be closed, and light may be illuminated upward from the lower surface of the reference member FM and may be received on a photoelectric sensor above the reticle R through a beam splitter located in the illumination optical system, thereby obtaining the same waveform as in FIG. 34C.

A sequence of correcting a correction error and operation parameters as the characteristic feature of this embodiment will be described below. For the sake of descriptive simplicity, the imaging characteristics are exemplified by only a magnification (ΔM). A similar technique can be used to correct other imaging characteristics (curvature, focal position, and distortion). Variation characteristics are also exemplified by a linear delay system. However, the same principle as described above can be applied for a combination of a plurality of linear delay systems although the calculations are complicated.

The exposure operation of a new reticle whose magnification change characteristic is unknown is taken into consideration. For the sake of simplicity, assume that a sufficiently long period of time has elapsed from the last use of the projection optical system PL so that the projection optical system PL is thermally stable. When an exposure operation is started from time t=0, a change amount ΔM of the projection magnification changes, as shown in FIG. 22. This change amount is newly plotted in FIG. 35. In this case, since the magnification change characteristic parameters (e.g., a ratio Δ/E and a time constant T) of the new reticle are unknown, a correction calculation is performed using prepared normal parameters. A set of normal parameters may be prepared, or a plurality of sets of normal parameters for the respective conditions of the illumination optical system may be obtained and may be selectively used for each condition of the illumination optical system. The latter case allows more accurate correction.

Figure 35:
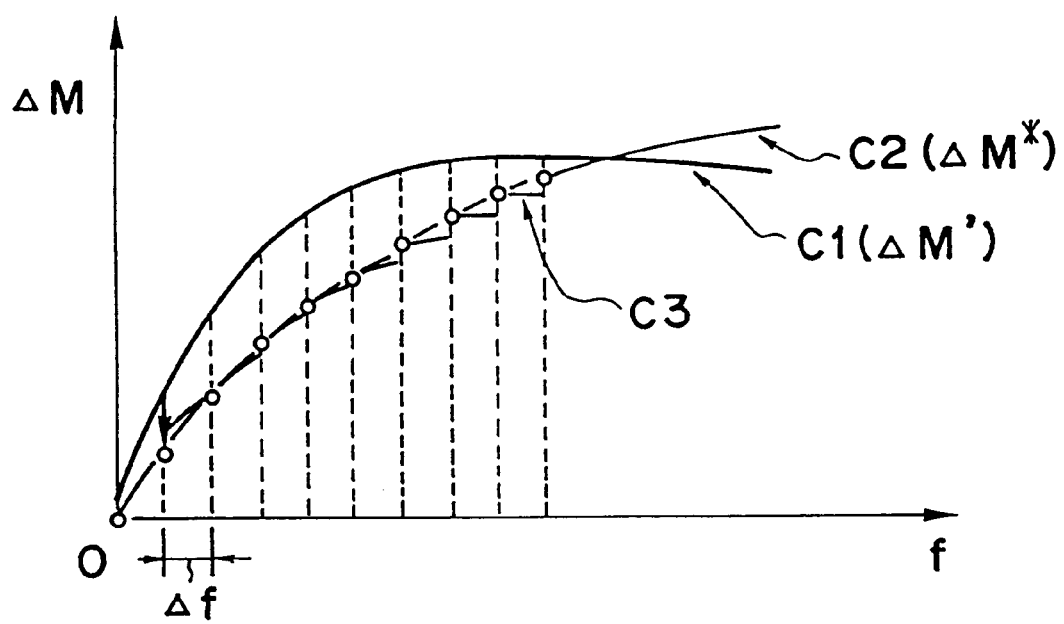
FIG. 35 is a graph showing the state of correction of an imaging characteristic (projection magnification) of a projection optical system according to the seventh embodiment.

Referring to FIG. 35, a curve C1 represents a magnification change amount ΔM' by calculation, and a curve C2 represents a change in an accurate magnification change amount ΔM* by actual measurement. FIG. 35 shows a case in which the change in the magnification change amount ΔM' by calculation is shifted from the change in the magnification change amount ΔM* by actual measurement. In this case, as indicated by a thick line in FIG. 35, a magnification correction mechanism performs correction on an assumption that the magnification of the projection optical system PL is changed by the magnification change amount ΔM' by calculation. In this embodiment, if the imaging characteristic is checked every predetermined time interval Δt, and the imaging characteristic is calibrated, a magnification measurement is performed after a predetermined period of time, thereby restoring an accurate magnification, as shown in FIG. 35. This calibration interval is corrected by the magnification ΔM by calculation. In correspondence with FIG. 35, the curve C2 representing the magnification change amount ΔM* is corrected to be translated along a curve C3 every calibration. The magnification change amount ΔM' by calculation is continuously calculated independently of the calibration. A difference is corrected for every calibration cycle independently of this calculation.

According to this method, a magnification correction error caused by a difference between the magnification change amount ΔM' by calculation and the accurate magnification change amount ΔM* can be set zero or minimized. At the same time, as indicated by hollow circles in FIG. 35, time change characteristics of the accurate magnification change amount ΔM* can also be known, thereby obtaining accurate change characteristic parameters (ΔM/E and T). Once the accurate parameters are obtained, the calibration need not be periodically performed. Correction is performed on the basis of calculation values based on the accurate parameters. The time loss caused by unnecessary calibrations can be eliminated, and productivity (throughput) can be improved. Since these parameters are obtained by a large number of measurement results, measurement errors can be averaged to reduce errors as compared with the calibration based on one measurement result. More accurate correction can be performed.

Correction is plotted so as to follow changes in magnification in FIG. 35. However, in practice, correction is performed in the reverse direction so as to cancel the changes in magnification.

A method of obtaining accurate parameters will be briefly described below. In FIG. 35, for the sake of simplicity, the same energy is applied. However, in practice, the applied energy is not uniform due to wafer change and alignment operations. To strictly calculate this energy, the energy history per unit time must be stored in the main controller 50 in FIG. 19. Parameters for optimally matching the energy history with the magnification measurement values are calculated. For example, this parameter calculation is performed in accordance with, e.g., the method of least squares. Since the relationship between the energy history and the magnification measurement value is not linear, the calculation cannot be analytically performed, but a technique for sequentially optimizing parameters is employed. For this reason, it takes a long calculation time. It is therefore practical to calculate optimal parameters during a lot change or the like.

There is also proposed another method of simply calculating parameters on an assumption that illumination light having an average energy is uniformly radiated during a wafer change or alignment time. This method, however, degrades the calculation precision. To eliminate this degradation, parameters may be temporarily calculated using an average energy and may be strictly calculated during lot change. Alternatively, the time constant T of the time parameters requires a complicated calculation using the energy history and the like, and only a ratio ΔM/E may be calculated under the condition that the time constant T is kept constant. In practice, higher correction precision can be obtained by more accurately calculating the ratio ΔM/E than the time constant T. A marginal precision can be obtained even by this method.

A larger number of data points used in the calculation makes it possible to obtain a higher precision, but has a disadvantage in a long calculation time. It is preferable to select the number of data points in consideration of the above two contradictory factors. For example, when the method of least squares is employed, the number of data points is increased until a square error per data point becomes a predetermined value or less. In addition to the above embodiment, if no time is available to calculate optimal parameters, or if a decrease in throughput is negligible in favor of a sufficiently short measurement time, parameter optimization is not performed, but correction by a correction calculation may always be combined with correction after measurement to perform correction. In addition to the above embodiment, the time interval Δt may be set short, and correction may be performed not by a correction operation but by only a measurement result. In this case, a method of performing correction stepwise while maintaining the corrected characteristics or an interpolation method such as linear interpolation or quadratic interpolation may be employed.

When new parameters are obtained in this embodiment, and if conditions such as illumination conditions, the type of reticle, and a light-shielding blind remain the same, the parameters can be reused. If the conditions may be stored together with the corresponding parameters, and these conditions are specified to access and use the corresponding parameters, thereby eliminating the calculation of the parameters again. Exposure operations may be performed under various conditions. If the number of parameters obtained upon these exposure operations is sufficiently large, designation of conditions makes it possible to allow an interpolation under a similar condition, thereby estimating optimal parameters.

In the above embodiment, the measurement interval Δt in FIG. 35 is kept constant. However, as can be apparent from FIG. 35, a change is large in the initial period upon the start of exposure and is reduced with a lapse of time. For this reason, it is effective that the measurement interval Δt is set short in the initial period upon the start of exposure and is then increased to minimize the errors. In this case, parameter calculation precision can also be improved. To realize this, a method of performing measurement every time a correction-calculated change amount exceeds a predetermined value, or a method of determining a next measurement time in accordance with a previous measurement value difference may be employed.

The above embodiment is based on an assumption that a sufficiently long period of time has elapsed after reticle change or an illumination system modification, and that the influence of illumination under the previous condition is eliminated. In practice, however, an exposure operation is started under the next condition when the sufficiently long period of time has not yet elapsed. In this case, the magnification change characteristics of the two conditions overlap each other, and it is very difficult to accurately obtain the parameters in accordance with correction calculations. Even in this case, correction in combination with actual measurements is performed to eliminate the above influence. In practice, the previous condition overlaps the new condition, and the calculation value is deviated from the actual measurement value. A difference caused by the actual measurement can be sequentially corrected, and large errors are not caused.

The measurement value obtained in this overlap state cannot be used in calculation of new parameters. A measurement value assumed to be free from the influence of the previous condition is used to calculate new parameters. Since a magnification change amount obtained immediately upon the start of an exposure operation after the illumination system is completely cooled is large, data obtained upon complete cooling of the illumination system is preferably used in view of the calculation of parameters. For this reason, in practice, when a condition is changed, it is most preferable to wait until the influence of the previous condition is perfectly eliminated.

The exposure method of the seventh embodiment, and its various modifications have been described above. A typical sequence in practical applications will be described with reference to FIG. 36.

Figure 36:
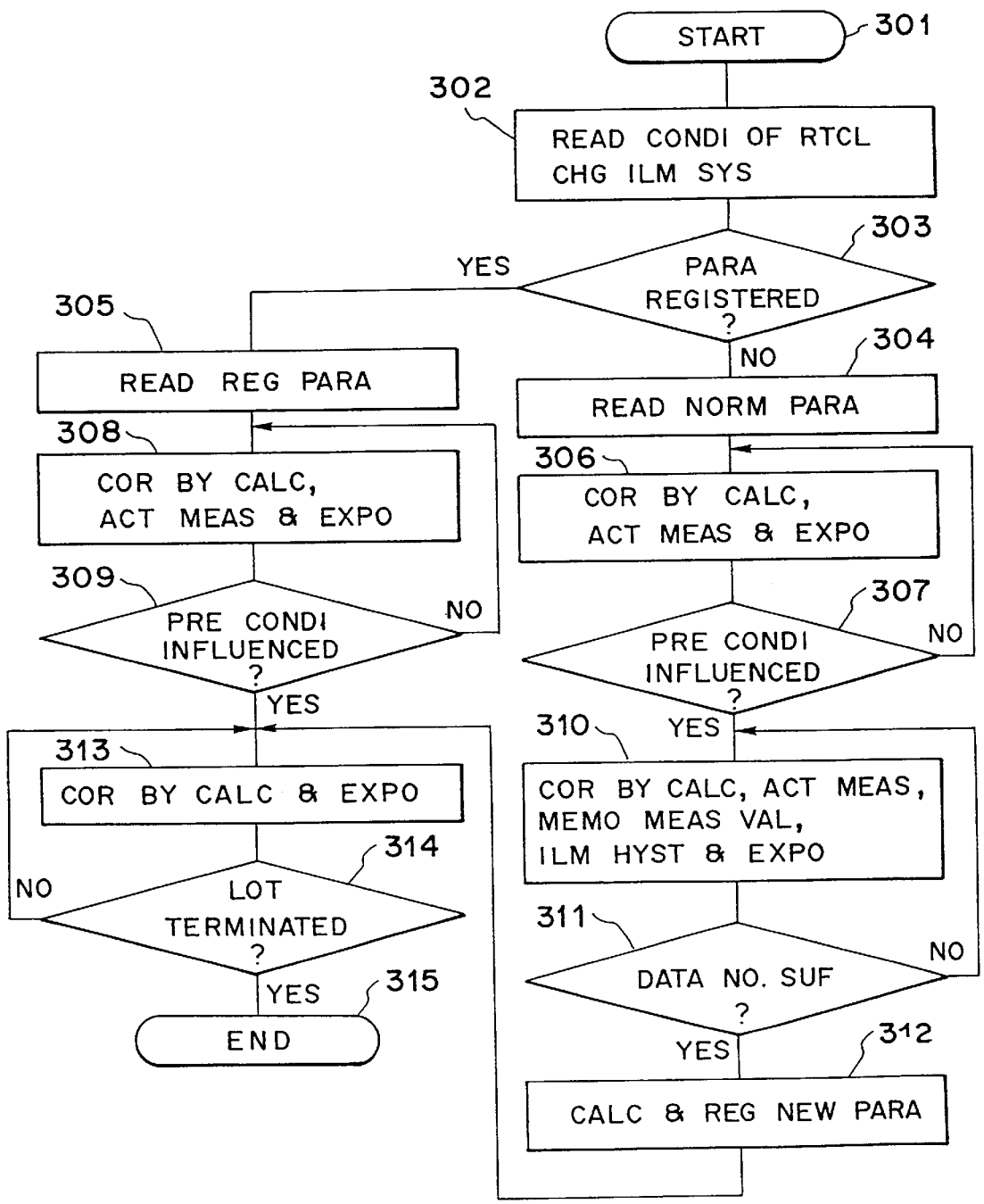
FIG. 36 is a flow chart showing an exposure sequence of the seventh embodiment.

In step 301 of FIG. 36, an exposure sequence is started. A reticle is changed, and the illumination condition of the illumination optical system is set in step 302. In this case, the main controller 50 in FIG. 19 reads the type of reticle through a bar code reader 52 and reads the illumination condition of the illumination optical system in accordance with signals from the respective components. In step 303, it is determined whether optimal parameters to be used in a correction calculation have already been used in exposure and registered in a memory. If NO in step 303, the flow advances to step 304 to read normal correction calculation parameters corresponding to the read illumination condition and reticle. However, if YES in step 303, the flow advances to step 305 to read registered optimal parameters.

When the parameters are read in step 304, the flow advances to step 306 to perform an exposure operation in accordance with a method of actually measuring an imaging characteristic to perform correction while the correction calculation is being performed. Similarly, when the parameters are read in step 305, the flow advances to step 308 to perform an exposure operation in accordance with the method of actually measuring the imaging characteristic to perform correction while the correction calculation is being performed. The flow then advances from step 308 to step 309. If the influence of the previous illumination is not left, the flow returns to step 308. However, if YES in step 307, the flow advances to step 313.

In step 313, correction by only the correction calculation using the optimal parameters is performed to perform an exposure operation. Every time exposure of one wafer is completed, the flow advances to step 314 to determine whether exposure of all wafers of this lot is terminated. If NO in step 314, the flow returns to step 313 to perform exposure. However, if YES in step 314, the flow advances to step 315 to perform another processing.

The flow advances from step 306 to step 307. If NO in step 307, the flow returns to step 306. However, if YES in stp 307, the flow advances to step 310. In step 310, exposure is performed while correction is performed by a combination of correction by the correction calculation and correction by the actual measurement value. A measurement result and a radiation history are stored in the memory.

It is determined in step 311 whether the number of data points (DATA NO.) of the measurement result is sufficient. If NO in step 311, the flow returns to step 310. However, if YES in step 311, the flow advances to step 312 to calculate new optimal parameters using these data. The calculated parameters are registered in the memory. Since the condition is the same as in the case wherein the parameters are registered, the flow advances to step 313 to perform an exposure operation by the correction by the correction operation using the optimal parameters.

Although not shown in the flow chart of FIG. 36 in detail, a sequence of measuring imaging characteristics to determine whether newly calculated parameters accurately exhibit the variations in imaging characteristics to check the parameters may be executed.

In the above embodiment, the reference member FM and the optical sensor or detector 39 are used to measure the imaging characteristic (projection magnification) of the projection optical system PL. However, a means for measuring a magnification or distortion applicable to this embodiment may be any conventionally proposed scheme. For example, as disclosed in U.S. Pat. No. 4,853,745, the following detection system may be used. A reference member FM may be radiated upward with exposure light from the lower surface thereof. Light passing through a slit mark on the reference member FM, a projection optical system PL, and a reticle R may be received by a photoelectric detector through a beam splitter located in the illumination optical system. The focal position detection system shown in FIG. 14 may be used to detect a measurement mark on the reticle in FIG. 34A to obtain its position.

In this embodiment, the illumination conditions (e.g., a σ value) for the reticle R to measure a projection magnification using the reference member FM and the photoelectric sensor 39 are preferably identical to those for actually exposing the pattern of the reticle R on the wafer W. To measure the projection magnification of the projection optical system PL, when the detection system disclosed in U.S. Pat. No. 4,854,745 or the focal position detection system in FIG. 14 may be used to detect a measurement mark on the reticle R, the illumination conditions for the reference member FM are preferably identical to those for the reticle R as in the fourth embodiment.

According to this embodiment, in addition to the conventional correction by the correction calculation, correction of a correction error based on the actual measurement result of the imaging characteristic is performed. An error caused by correction calculation due to a change in illumination condition of the illumination optical system or an influence of a phase shifter in use of a phase shifting reticle can be minimized. Exposure on a photosensitive substrate can always be advantageously performed on the basis of high-precision imaging characteristics. In addition, since operation parameters are calculated by the accurate correction calculation using the operation parameters, and prediction control is then performed using these operation parameters. Therefore, the time loss caused by sequential actual measurements can be eliminated.

If a change in illumination conditions by the illumination condition changing means is a change in state of an illumination distribution of illumination light on the pupil plane of the projection optical system or within a plane near the pupil plane, even switching between a modified light source and a normal illumination light source as the illumination optical system makes it possible to always allow exposure on a photosensitive substrate on the basis of high-precision imaging characteristics.

The change in illumination condition by the illumination condition changing means is a change in arrangement of the mask pattern, even switching between a phase shifting reticle and a normal reticle as a mask makes it possible to always allow exposure on a photosensitive substrate on the basis of high-precision imaging characteristics.

The eighth embodiment of the present invention will be described with reference to FIG. 37. This embodiment is the same as in the fourth embodiment except that the illuminance distribution on the pupil plane of a projection optical system PL is measured to determine illumination conditions of a focal position detection system and the type of a pattern plate 117.

Figure 37:
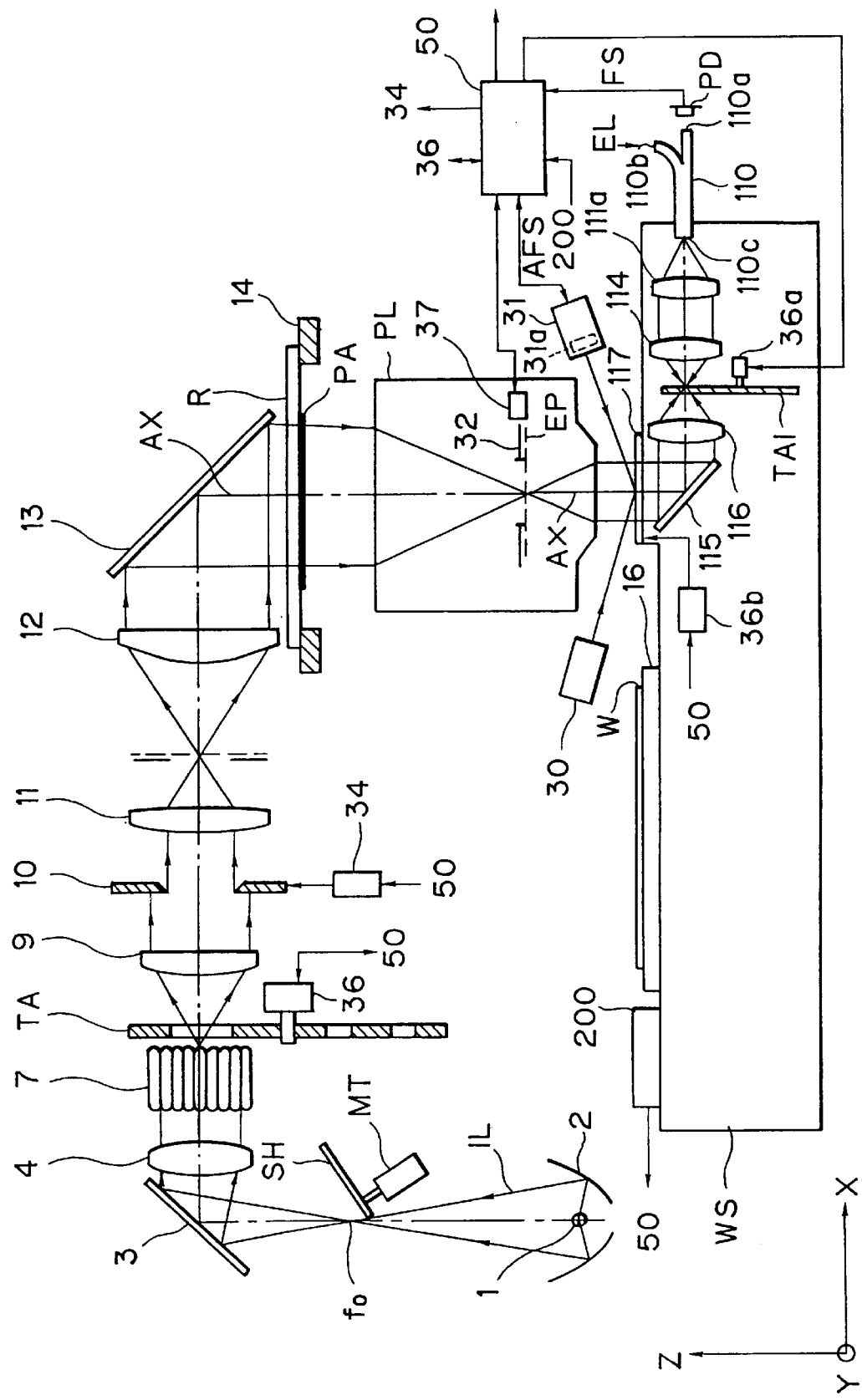
FIG. 37 is a schematic view showing the arrangement of a projection exposure apparatus according to the eighth embodiment of the present invention.

FIG. 37 is a schematic view showing the arrangement of a projection exposure apparatus according to this embodiment. The same reference numerals as in FIGS. 1, 6, and 14 denote the same parts having the same functions and operations in FIG. 37, and a detailed description thereof will be omitted. The embodiment is explained below on the basis of differences between FIGS. 37 and 14 with overlapping the previous description.

Referring to FIG. 37, a photoelectric sensor 200 as an irradiation amount monitor is disposed on a wafer stage WS. The light-receiving surface of the photoelectric sensor 200 has almost the same level as the surface of a wafer W. The photoelectric sensor 200 comprises a light-receiving surface having an area almost equal to, e.g., the image field of the projection optical system PL, or the projection region of a reticle pattern. A signal output from the photoelectric sensor 200 is supplied to a main controller 50. The photoelectric sensor 200 measures the energy amount of light incident on the projection optical system PL. The energy amount measured by the photoelectric sensor 200 is used for a correction calculation for a change in imaging characteristics generated by, e.g., temperature rise with absorption of illumination light of the projection optical system PL. Since the light-receiving surface of the photoelectric sensor 200 is almost conjugate to the reticle pattern, as a matter of course, information about the illuminance distribution near the pupil plane of the projection optical system PL (a Fourier transform plane with respect to the reticle pattern in the projection optical system PL) cannot be generally obtained. However, while a stop 32 (NA stop) in the vicinity of a pupil plane Ep of the projection optical system is adjusted by a drive unit 37, the position of the stop (i.e., the position of the stop obtained by drive information of the drive unit 37) and the output of the photoelectric sensor 200 are detected at the same time, thereby obtaining the illuminance distribution on the pupil plane Ep.

A focal position detection system according to this embodiment of the present invention will be briefly described, and the same reference numerals as in FIG. 14 denote the same parts in FIG. 37.

In an illumination optical system of the focal position detection system according to this embodiment, illumination light EL having the same as or close to the wavelength band of illumination light IL is incident from a branch end 110b which is one end of a two-split fiber bundle 110. The part of the illumination light IL is split by, e.g., a beam splitter, and the resultant light is used for the illumination light EL. The illumination light EL is incident on relay lenses 111a and 114 through a merged end 110c of the fiber bundle 110. Fibers respectively extending from branch ends 110a and 110b are arranged in the merged end 110c of the fiber bundle 110 at random. The illumination light emerging from the relay lens 114 is incident on a rotary plate TA1 disposed on the Fourier transform plane of a pattern plate 117, i.e., a plane conjugate to the pupil plane Ep of the projection optical system PL.

The rotary plate TA1 corresponds to a rotary plate TA in FIG. 14, as described in the fourth embodiment. The rotary plate TA1 has a plurality of stops identical to those of the rotary plate TA shown in FIG. 15. A stop having an arbitrary shape can be selected by rotating the rotary plate TA1 by a drive motor 36a.

The pattern plate 117 is illuminated upward with the illumination light EL passing through the rotary late TA1 through a condenser lens 116 and a mirror 115. The light passing through the pattern plate 117 reaches the lower surface of a reticle R through the projection optical system PL, and the light reflected by the reticle R returns to the inside of the wafer stage WS through the projection optical system PL and the aperture pattern of the pattern plate 117. As in FIG. 14, this return light is incident on a photoelectric sensor PD through the mirror 115, the condenser lens 116, the rotary plate TA1, the relay lenses 111a and 114, and the fiber bundle 110. The principle of detecting a focal position on the basis of a signal output from the photoelectric sensor PD is the same as that described in FIG. 30.

As described with reference to FIGS. 3, 8A, 8B, 9A, 9B, 10A, 10B, 13A, 13B, 26A, 26B, and 26C, an optical path (i.e., the illuminance distribution of illumination light on the pupil plane Ep) inside the projection optical system PL is greatly changed by changing illumination conditions. The illuminance distribution of the illumination light on the pupil plane Ep of the projection optical system PL becomes complex because various types of patterns of a phase shifting reticle are mixed or partially used, and a test technique is not established. It is, therefore, difficult to obtain the accurate illuminance distribution by calculation or the like. In addition, as described in the seventh embodiment, the optical path (illuminance distribution) inside the projection optical system PL is slightly changed by, e.g., the shape and pitch of the reticle pattern even under the same illumination condition. For example, even if the same stop is used in normal illumination, an optical path (illuminance distribution) inside the projection optical system PL of a periodic pattern differs from that of a contact hole pattern. For this reason, a focal position, a distortion, and the like are changed by a slight change in aberration condition of the projection optical system PL as described above. In addition, when the aberration condition is changed by temperature rise caused by absorption of illumination light, a light passing position is also changed, so that differences in imaging characteristics of, e.g., a focal position and a distortion become large. This embodiment copes with this problem by actually measuring the illuminance distribution of illumination light on the pupil plane Ep of the projection optical system PL.

Figure 38A:
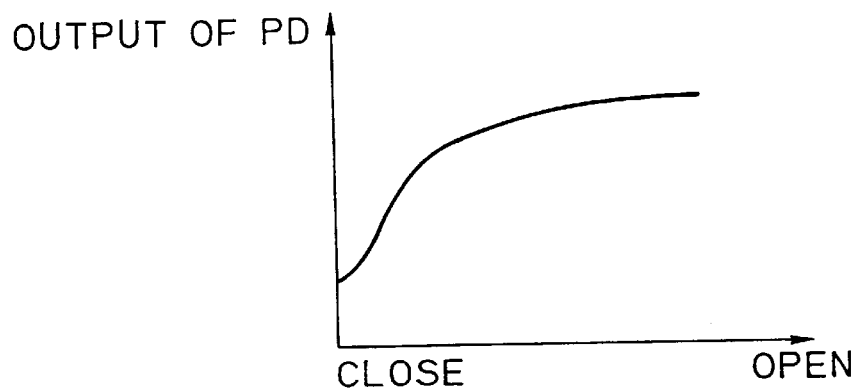
FIGS. 38A and 38B are graphs for explaining the method of measuring the intensity distribution of illumination light on the pupil plane of a projection optical system using a variable stop.
Figure 38B:
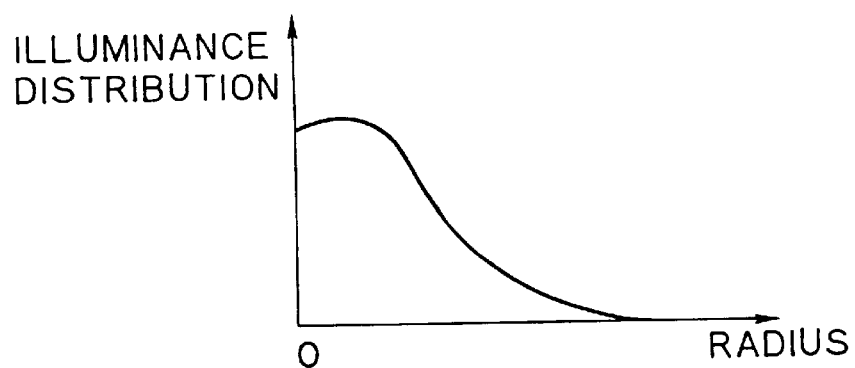

The measurement method of the illuminance distribution of illumination light on the pupil plane Ep of the projection optical system PL will be described below. First, the wafer stage WS is driven to position the photoelectric sensor 200 for checking an illumination amount immediately under the projection optical system PL, and a shutter SH is set in an open state. The stop 32 (NA stop) in the vicinity of the pupil plane Ep of the projection optical system is gradually opened from the most stopped-down state. While opening the stop, the output of the photoelectric sensor 200 is monitored at the same time, so that the illuminance distribution on the pupil plane Ep can be obtained. That is, the main controller 50 can obtain the illuminance distribution of illumination light on the concentric circles of the pupil plane Ep on the basis of the drive signal to a motor 37 for driving the stop 32 and the output from the photoelectric sensor 200. This state is shown in FIGS. 38A and 38B. FIG. 38A is a graph showing the relationship between the opening degree of the stop 32 and the output from the photoelectric sensor 200, and FIG. 38B is a graph obtained by differentiating the output from the photoelectric sensor 200 in the radial direction. The ordinate of FIG. 38A shows the output of the photoelectric sensor 200, and the abscissa shows the opening degree of the stop. The ordinate of FIG. 38B shows an illuminance distribution, and the abscissa shows a radius. The relationship between the opening degree of the stop 32 and the output from the photoelectric sensor 200 indicates that the value becomes larger as the opening degree of the stop increases, and the value becomes smaller as the opening degree of the stop decreases. Since the output from the photoelectric sensor 200 is obtained by integrating an amount of light along the radius direction, the value, shown in FIG. 38A, obtained by differentiating the relationship between the opening degree of the stop 32 and the output from the photoelectric sensor 200 indicates the illuminance distribution of the radius (opening degree). As is apparent from FIG. 38B, since the stop 32 must be fully stopped down to obtain the illuminance distribution at the central portion, a stop with specifications for making it possible to stop down the stop more than the range used for limiting the numerical aperture (NA) of the conventional projection optical system must be needed.

Moreover, if the stop 32 can arbitrary move within the pupil plane Ep, the two-dimensional illuminance distribution can be obtained by fully stopping down the stop 32 and performing scanning within the pupil plane. In addition, the illuminance distribution can be obtained by scanning the light-shielding portion as opposited to use of the aperture of the stop 32. Still further, the illuminance distribution can also be obtained by inserting/retracting a two-dimensionally divided photoelectric sensor in/from a transparent portion of the pupil plane Ep, or by splitting light through a half-mirror to receive light. Therefore, the illuminance distribution of illumination light on the pupil plane Ep of the projection optical system PL can be measured.

According to this embodiment, the illuminance distribution of exposure illumination light (illuminance distribution on the pupil plane Ep of the projection optical system PL) is caused to almost match with the illuminance distribution (illuminance distribution on the pupil plane Ep of the projection optical system PL) of detection light of the focal position detection system. The illuminance distribution of the detection light on the pupil plane Ep of the projection optical system PL is determined by the shape of the stop of the rotary plate TA1 and the pattern of the pattern plate 117. Stops almost corresponding to stops disposed on the rotary plate TA (stops 41 to 46 shown in FIG. 15) are disposed on the rotary plate TA1. The shapes of the stops can be switched by rotating the rotary plate TA1. As described in the fourth embodiment, a variety of pattern rules (pitch, line width, shape, and the like) are prepared for the patterns of the pattern plate 117, and these pattern rules can be selectively used. A plurality of the patterns formed on the pattern plate 117 can be switched to a desirable pattern (desirable geometric shape pattern) by, e.g., a motor. A motor 36b like a drive motor 36 or 36a may be provided. The switching between the plurality of the patterns of the pattern plate 117 is performed by controlling the motor 36b to rotate the pattern plate 117 on the basis of an instruction from the main controller 50. The pattern of the pattern plate 117 preferably uses the same pattern rule as that of the reticle. In practice, the reticle has a lot of pattern rules, and various pattern rules are mixed in one reticle. Therefore, in this embodiment, some representative pattern rules of the reticle are provided to the pattern plate 117, and these pattern rules can be switched. Some representative pattern rules of the phase shifting reticle are provided to the pattern plate 117 in phase-shift patterns to correspond to the phase shifting reticle. Combinations of the patterns of the pattern plate 117 and the stops of the rotary plate TA1 capable of forming the illuminance distribution of the detection light closest to the measured exposure illuminance distribution of the illumination light may be selectively used. When the pattern information of the reticle and an illumination condition are known. the selection of these combinations may be estimated. However, to select the optimal condition (optimal combination of the pattern of the pattern plate 117 and the stop of the rotary plate TA1) for obtaining the illuminance distribution of the detection light which matches with the illuminance distribution of the illumination light as much as possible, the illuminance distribution of the detection light on the pupil plane Ep by a combination of the pattern of the pattern plate 117 and the stop of the rotary plate TA1 is obtained in advance, and a combination in which the illuminance distribution of the detection light almost matches with the illuminance distribution of the illumination light must be selected. For this reason, the illuminance distributions of the detection light in correspondence with the patterns of the pattern plate 117 and the stops of the rotary plate TA1 are stored in the main controller 50. The illuminance distribution of the detection light may be obtained by calculation at this time (this calculation may be performed using information of the patterns of the pattern plate 117 and information of the stops of the rotary plate TA1). The illuminance distribution of the detection light on the pupil plane Ep may be measured for each combination of the pattern of the pattern plate 117 and the stop of the rotary plate TA1. Since the direction of the detection light is opposite to that of the illumination light, the illuminance distribution of the detection light can be obtained by arranging the same sensor as the photoelectric sensor 200 on the reticle using the same measurement method. In the method using the stop 32, however, light may not be received above the reticle (lamp side) because the light is shielded by the pattern of the reticle. Therefore, the method using a two-dimensional photoelectric sensor is employed. That is, photoelectric sensors are disposed on the two sides of the two-dimensional photoelectric sensor retractable from the pupil plane Ep to detect both the illuminance distribution of the illumination light and the illuminance distribution of the detection light.

As described above, the illuminance distribution of the detection light on the pupil plane Ep for each combination between the stop of the detection system (stop of the rotary plate TA1) and the pattern of the pattern plate 117 is stored in the main controller 50 in advance, and the stop of the rotary plate TA1 and the pattern of the pattern plate 117, both of which represent an illuminance distribution closest to the illuminance distribution on the pupil plane Ep of the illumination light, may be selected.

The representative pattern rules are prepared for the pattern of the pattern plate 117. In addition, the number of shapes of the patterns of the pattern plate 117 may be increased to correspond to various reticle patterns and the types of reticles. Some representative illuminance distributions of the illumination light on the pupil plane Ep determined by illumination conditions and reticle patterns, or illuminance distributions of the illumination light on the pupil plane Ep determined by phase shifting reticles are measured, and the pattern plate 117 and the stop of the rotary plate TA1, both of which represent the illuminance distribution of the detection light almost the same as this determined illuminance distribution, may be prepared.

A stop for forming the illuminance distribution of the detection light closer to the measured value of the illuminance distribution of the illumination light may be formed on the basis of the measured value of the illuminance distribution of the illumination light on the pupil plane Ep, and this stop may be provided to the rotary plate TA1. As described in the fourth embodiment, a liquid crystal element array may be partially shielded to form a stop having an arbitrary shape. When the main controller 50 controls a liquid crystal control circuit instead of the drive motor 36a, a stop having an arbitrary shape for forming the illuminance distribution of the detection light closer to the measured value of the illuminance distribution of the illumination light can be formed. Similarly, a pattern of the pattern plate 117 for forming the illuminance distribution of the detection light closer to the measured value of the illuminance distribution of the illumination light may be formed on the basis of the measured value of the illuminance distribution of the illumination light on the pupil plane Ep, and this pattern may be provided to the pattern plate 117. At this time, the liquid crystal element array is partially shielded by, e.g., a liquid crystal to form a pattern plate 117 having an arbitrary pattern (arbitrary geometric shape pattern) of pitch, line width, and shape. When the main controller 50 controls the liquid crystal control circuit instead of the drive motor 36$b$, a pattern having an arbitrary shape for forming the illuminance distribution of the detection light closer to the measured value of the illuminance distribution of the illumination light can be formed.

As has been described above, when the stop and the pattern of the pattern plate 117, both of which change the illuminance distribution of the detection light, are optimized, the illuminance distribution of the detection light is adjusted by adjusting either the stop of the rotary plate TA1 or the pattern of the pattern plate 117, and the illuminance distribution of the illumination light may be caused to almost match with that of the detection light.

The exposure operation sequence will be described below.

When the stop of the illumination optical system (rotary plate TA1) or the reticle R is changed, or an exposure area is changed by a variable blind 10 even use of the same reticle, the illuminance distribution of the illumination light on the pupil plane Ep is measured by the above method.

Then, on the basis of the above measurement result, the main controller 50 rotates the pattern plate 117 and the rotary plate TA1 and selects the stop of the detection system of the rotary plate TA1 and the pattern of the pattern plate 117 so as to almost match the illuminance distribution of the detection light of the focal position detection system on the pupil plane Ep with the illuminance distribution of the illumination light. When the degree of coincidence between the illuminance distribution of the detection light on the pupil plane Ep of the focal position detection system and the illuminance distribution of the illumination light does not satisfy a reference value, an alarm or the like is used to notify this to an operator. A method of displaying the illuminance distribution of the illumination light at this time and then forming a stop corresponding to this distribution may be employed.

As has been described above, since the illuminance distribution of the detection light of the focal detection system (the illuminance distribution on the pupil plane of the projection optical system) almost matches with the illuminance distribution of the exposure illumination light, a focal position deflection, a distortion, and the like, generated by difference between the illumination conditions can be corrected with higher accuracy.

At this time, when patterns on the basis of a plurality of the pattern rules exist in an area to be exposed, i.e., patterns having differences in line width, shape, or presence/absence of the phase shifter, are to be exposed at the same time, the variable blind 10 is driven by the motor 36 to set its shape variable, and a pattern to be focused with highest precision is selected. The illuminance distribution of the illumination light with which this selected pattern is illuminated is measured, and the stop of the rotary plate TA1 and the pattern of the pattern plate 117 are selected to almost match the illuminance distribution of the measured illumination light with the illuminance distribution of the detection light of the focal position detection system. As a result, since the focal position can be detected to focus a pattern which is to be focused with the highest precision, more accurate focusing can be realized. When the focal depth varies depending on the patterns, e.g., when a pattern with a phase shifter and a pattern without it are mixed, and only the focal depth of the pattern with a phase shifter increases, a wafer region corresponding to the pattern without a phase shifter is weighted for focusing to balance the focal depths of a plurality of patterns.

As has been described in the seventh embodiment, when calculation parameters of imaging characteristic correction mechanism (for example, a correction mechanism disclosed in U.S. Pat. No. 4,666,273) is to be corrected in accordance with a change in illumination condition and type of reticle, the illumination condition in the imaging characteristic measurement is caused to match with the illumination condition for actually exposing the pattern of the reticle R. For example, an aperture pattern 117 and the stop of the rotary plate TA1 may be selected to obtain the illuminance distribution of the detection light which almost matches with the illuminance distribution of the illumination light obtained by actual measurement similar to this embodiment. A measurement timing is determined by a balance between precision and productivity, and may be determined e.g., at every 10 minutes, or every time the focal position changes by 0.1 $\mu$m in estimation calculation.

This embodiment is not limited to the arrangement shown in FIG. 37, and other methods of the focal position detection system can be employed. In addition, the measurement of the imaging characteristics of the projection optical system PL is not limited to the focal position detection. When the focal position detection is performed at several points in an exposure area, the measurement of the focal position, the measurement of curvature of field, the measurement of spherical aberration by changing a line width, and the measurement of astigmatism by a measured pattern direction can be performed.

The present invention is also effective even if the detection light of the focal position detection system differs from the illumination light. For example, the present invention can also be applied to a focal position detection system disclosed in, e.g., U.S. Pat. No. 4,952,815. As has been described above, according to this embodiment, the illuminance distribution of the detection light on the pupil plane of the focal position detection means almost matches with the illuminance distribution of the exposure illumination light on the pupil plane of the projection optical system because the illuminance distribution of the exposure illumination light on the pupil plane of the projection optical system is measured. As a result, imaging characteristics can be properly detected.

The ninth embodiment of the present invention will be described below. The basic arrangement of the ninth embodiment is almost same as that of the eighth embodiment, and a description of the arrangement will be omitted. In the ninth embodiment, a difference between the illuminance distribution of illumination light and the illuminance distribution of detection light is obtained by calculation. The detection result of a focal position detection system is corrected on the basis of this difference. The arrangement of an apparatus for this purpose has neither a rotary plate TA1 nor a drive motor 36$a$, and needs only one pattern of a pattern plate 117. Therefore, the arrangement of the apparatus is simpler than that of the eighth embodiment, and can be applied to an apparatus already manufactured.

Figure 39:
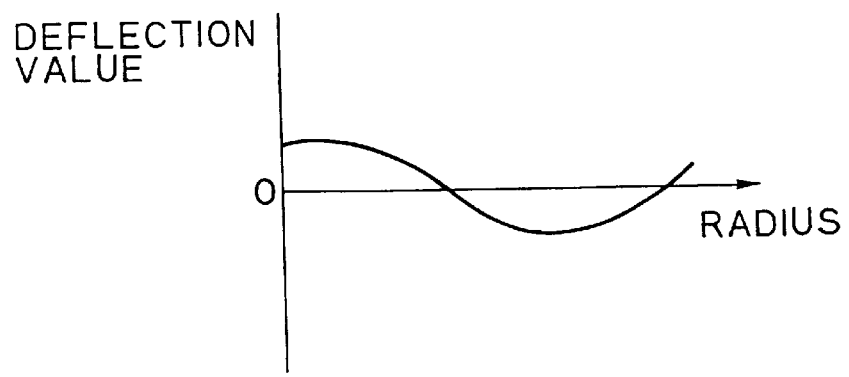
FIG. 39 is a graph for explaining the method of correcting a detection error of a focal position detection system by calculation.

In this manner, according to this embodiment, the difference between a value measured by the focal position detection system and an actual exposure focal position must be obtained with respect to the illuminance distribution of the illumination light on a pupil plane Ep. A method of calculating this will be represented. When an aberration condition of a projection optical system PL can be represented by point symmetry about the center of an image, i.e., by a function of the radius of the pupil plane Ep, FIG. 39 shows a deflection degree of a focal position of a ray passing through a given radius with respect to the predetermined focal position (predetermined illumination condition, and a measured value of the focal position detection system at a pattern of a pattern plate 117). The ordinate of FIG. 39 shows a deflection value, and the abscissa shows a radius using an optical axis AX on the pupil plane Ep as the center. Data shown in FIG. 39 can be obtained by an experiment or simulation. The data shown in FIG. 39 are stored in a main controller 50.

Using the same method as described in the eighth embodiment, the illuminance distribution of the illumination light on the pupil plane Ep in the radial direction is measured. If the measured illuminance distribution of the illumination light in the radial direction is multiplied with the deflection value on the pupil plane Ep with respect to the position in the radial direction, the deflection value of the focal position on the measured illuminance distribution of the illumination light can be obtained. That is, the deflection value (graph shown in FIG. 39) of the pupil plane Ep with respect to the position in the radial direction is weighted, the resultant value is integrated in the radial direction, and the average deflection value becomes a deflection value between the focal position on the measured illuminance distribution of the illumination light and the measurement result of the focal position detection system. In this embodiment, since the conditions (illumination conditions, and pattern of the pattern plate 117) of the focal position detection system are fixed, if this deflection value is added as an offset value to the detection value of the focal position detection system, a change in imaging characteristics by noncoincidence between the illuminance distribution of the illumination light and the illuminance distribution of the detection light can be corrected.

When the above integration is not accurate, or it is difficult to obtain the graph shown in FIG. 39, a difference between the detection result of the focal position detection system and the focal position of the actual exposure is stored with respect to several illuminance distributions on the arcuated pupil plane. Of all the stored illuminance distributions, an illuminance distribution which most matches with the illuminance distribution of the measured exposure illumination light is selected, or is interpolated using similar distributions. In this case, coincidence is represented quantitatively, an alarm is used when the degree of coincidence does not match with any of the stored pupil illuminance distributions.

In the above description according to this embodiment, the projection optical system PL does not absorb the illumination light. In practice, the focal position is changed by absorption, so that an operation becomes complex. That is, the difference described above gradually changes with radiation conditions and time. Therefore, the change in difference need be instantaneously calculated by the radiation amount and the timing of opening/closing a shutter similar to the estimation calculation of the focal position change in the conventional technique. As has been described above, the difference between the detection result of the focal position detection system and the focal position of the actual exposure with respect to an incident energy is obtained with respect to each pupil illuminance distribution in advance, and the changes in difference between the detection result of the focal position detection system and the focal position of the actual exposure with respect to the incident energy using a calculation parameter corresponding to the illuminance distributions on the pupil plane are sequentially calculated.

The method of storing the change characteristics of the differences with respect to the coincidence distributions in advance and calculating a change in difference between the detection result and the focal position of the actual exposure, as described above, is employed. In this method, when radiation influences are left under the above conditions, error occurs in calculation as described above. In addition, calculation for matching the pupil plane distribution of only some of the patterns in the exposure area with that of the detection light cannot be performed. However, the change represented by the curve shown in FIG. 39 by the radiation can be obtained by calculation and the like, thereby solving the above problem.

Furthermore, according to this embodiment, the illuminance distribution of the exposure beam on the pupil plane of the projection optical system is measured, and the detection error of imaging characteristics generated by the difference between the resultant value and the illuminance distribution of the detection light on the pupil plane of the focal position detection means is corrected by calculation, thereby properly detecting imaging characteristics. That is, since noncoincidence between the optical paths is corrected, no detection error of imaging characteristics is generated by a difference between optical paths.

What is claimed is:

1. A projection exposure apparatus comprising:
an illumination optical system for radiating illumination light having a predetermined wavelength on a mask;
a projection optical system for imaging and projecting an image of a pattern of said mask on a photosensitive substrate; and
an exposure control system for interrupting an exposure operation for said photosensitive substrate for a predetermined period of time when an intensity distribution of the illumination light passing through said mask on a Fourier transform plane for the pattern of said mask in said projection optical system or a plane near the Fourier transform plane is changed.

2. A projection exposure apparatus comprising:
a first illumination optical system for radiating first illumination light on a mask;
a projection optical system for imaging and projecting an image of a pattern of said mask in a photosensitive substrate;
a detecting system for receiving second illumination light having a wavelength almost equal to that of the first illumination light passing through said projection optical system and detecting an imaging characteristic of said projection optical system; and
an adjusting system for adjusting an intensity distribution of the second illumination light in said projection optical system so that the intensity distribution of the second illumination light is set substantially equal to an intensity distribution of the first illumination light passing through said mask in said projection optical system.

3. A projection exposure apparatus comprising:
an illumination optical system for radiating illumination light having a predetermined wavelength on a mask;
a projection optical system for imaging and projecting an image of a pattern of said mask on a photosensitive substrate;
a light amount distribution changing member for changing a light amount distribution on a Fourier transform plane for the pattern of said mask in said illumination optical system or a plane near the Fourier transform plane; and
an exposure control system for interrupting an exposure operation for said photosensitive substrate for a predetermined period of time when said light amount distribution is chanted.

4. A projection exposure apparatus comprising:

an illumination optical system for radiating illumination light having a predetermined wavelength on a mask;

a projection optical system for imaging and projecting an image of a pattern of said mask on a photosensitive substrate;

a detecting system for detecting information corresponding to a thermal accumulation amount of said projection optical system in correspondence with incidence of the illumination light;

an exposure control system for controlling start and stop of an exposure operation for said photosensitive substrate based on information from said detection system and a predetermined reference value; and a setting member for, when an intensity distribution of the illumination light passing through said mask on a Fourier transform plane for the pattern of said mask in said projection optical system is changed, setting the reference value to a value corresponding to the changed intensity distribution.

5. A projection exposure apparatus comprising;

an illumination optical system for radiating illumination light having a predetermined wavelength on a mask;

a projection optical system for imaging and projecting an image of a pattern of said mask on a photosensitive substrate;

a detecting system for detecting information corresponding to a thermal accumulation amount of said projection optical system in correspondence with incidence of the illumination light;

an exposure control system for controlling start and stop of an exposure operation for said photosensitive substrate based on information from said detecting system and a predetermined reference value;

a light amount distribution changing member for changing a light amount distribution on a Fourier transform plane for the pattern of said mask in said illumination optical system or a plane near the Fourier transform plane; and a setting member for setting the reference value to a value corresponding to the changed light amount distribution when said light amount distribution is changed in accordance with the pattern of said mask.

6. A projection exposure apparatus comprising:

a first illumination optical system for radiating first illumination light on a mask;

a projection optical system for imaging and projecting an image of a pattern of said mask on a photosensitive substrate;

a focal position detecting system for receiving second illumination light having a wavelength almost equal to that of the first illumination light passing through said projection optical system and detecting a focal position of said projection optical system;

a measuring system for measuring an intensity distribution of the first illumination light passing through said mask in said projection optical system; and a correction member for correcting a detection result of said focal position detection system based on the measured intensity distribution of the first illumination light.

7. An apparatus according to claim 6, wherein said correction member stores information associated with a deflection value between a beam passing through a predetermined position in a radiating direction using an optical axis of said projection optical system as a center and the detection result of said focal position detecting system.

8. A projection exposure apparatus comprising:

an illumination optical system having an optical integrator, disposed between a light source and a mask to illuminate the mask with light from a secondary light source which the optical integrator forms with light from the light source;

a projection optical system having a plurality of optical elements disposed between the mask and a substrate along an optical axis to project an image of the illuminated mask on the substrate;

an optical device disposed within the illumination optical system, that changes an intensity distribution of the secondary light source in accordance with a pattern of the mask; and an adjusting system having an actuator provided with the projection optical system to move at least two of the plurality of optical elements, that adjusts magnification and an aberration of the projection optical system in accordance with the changed intensity distribution of the secondary light source.

9. An apparatus according to claim 8, wherein said adjusting system includes a second actuator for moving said mask to adjust a distortion of said projection optical system, and makes the first-mentioned actuator move said at least two optical elements to adjust a magnification and an aberration other than the distortion of said projection optical system.

10. An apparatus according to claim 9, wherein said adjusting system makes the first-mentioned actuator move said at least two optical elements of said projection optical system in the vicinity of said mask to adjust a magnification and at least one of a curvature of the field and an astigmatism of said projection optical system.

11. An apparatus according to claim 10, wherein said adjusting system makes the first-mentioned actuator move an optical element of said projection optical system in the vicinity of said substrate to adjust a spherical aberration of said projection optical system.

12. An apparatus according to claim 8, wherein said adjusting system makes said actuator move said at least two optical elements of said projection optical system in the vicinity of said mask to adjust a magnification and an aberration other than a spherical aberration of said projection optical system.

13. An apparatus according to claim 12, wherein said aberration other than the spherical aberration includes at least one of a curvature of the field, a distortion and an astigmatism.

14. An apparatus according to claim 12, wherein said adjusting system makes said actuator move an optical element in the vicinity of a pupil plane of said projection optical system to adjust a spherical aberration of said projection optical system.

15. An apparatus according to claim 12, wherein said adjusting system includes a stage for moving said substrate relative to an image plane of said projection optical system along said optical axis to compensate a movement of the image plane of said projection optical system caused by a change in the intensity distribution of said secondary light source.

16. An apparatus according to claim 8, further comprising:

a controller for calculating an amount of movement of said at least two optical elements of said projection optical system based on a parameter, which is determined in accordance with the changed intensity distribution of said secondary light source, for compensating a change in an aberration and a magnification of said projection optical system, wherein said adjusting system drives said actuator in accordance with the calculated amount of movement.

17. An apparatus according to claim 8, wherein said optical device includes a stop disposed between said optical integrator and said mask for defining said secondary light source, and an optical member disposed between said light source and said optical integrator for changing an intensity distribution of light from said light source on an incident surface of said optical integrator.

18. An apparatus according to claim 8, wherein said illumination optical system includes a plurality of optical integrators for forming secondary light sources different from each other in at least one of size and shape, and said optical device includes a mechanism for placing one of said plurality of optical integrators determined in accordance with said pattern of said mask into an optical path of said illumination optical system.

19. An apparatus according to claim 18, wherein said optical device includes a plurality of optical members for making an intensity distribution of light from said light source different from each other on an incident surface of one of said optical integrators, and places one of said plurality of optical members determined in accordance with said pattern of said mask between said light source and said one optical integrator.

20. An apparatus according to claim 19, wherein said optical device includes a stop disposed between said one optical integrator and said mask, and changes an intensity distribution of said secondary light source by said stop, said plurality of optical integrators and said plurality of optical members.

21. An apparatus according to claim 8, wherein said optical device includes a plurality of stops different from each other in at least one of size and shape, and places one of said plurality of stops determined in accordance with said pattern of said mask between said optical integrator and said mask to change an intensity distribution of said secondary light source.

22. An apparatus according to claim 8, wherein said optical device has at least two of: a first device for defining said secondary light source within an area containing an optical axis of said illumination optical system; a second device for defining said secondary light source within a substantially annular area with its center at an optical axis of said illumination optical system; and a third device for defining said secondary light source within at least two areas of the optical axis of said illumination optical system.

23. A projection exposure apparatus comprising:
an illumination optical system having an optical integrator, disposed between a light source and a mask to illuminate the mask with light from a secondary light source which the optical integrator forms with light from the light source;
a projection optical system having a plurality of optical elements disposed between the mask and a substrate along an optical axis to project an image of the illuminated mask on the substrate;
an optical device that changes an intensity distribution of light from the illuminated mask on a pupil plane of the projection optical system, the optical device including a first device provided in the illumination optical system to change a shape of the secondary light source and a second device provided in the projection optical system to change a numerical aperture of the projection optical system, wherein the intensity distribution is changed by at least one of the first and second devices; and
an adjusting system having an actuator provided with the projection optical system to move at least two of the plurality of optical elements, that adjusts magnification and an aberration of the projection optical system in accordance with the changed intensity distribution.

24. An apparatus according to claim 23, wherein said adjusting system moves at least two of said optical elements of said projection optical system in the vicinity of said mask to adjust a magnification and an aberration other than a spherical aberration of said projection optical system, and moves an optical element in the vicinity of said pupil plane of said projection optical system to adjust the spherical aberration of said projection optical system.

25. An apparatus according to claim 23, wherein said optical device includes a third device to change a pattern to be transferred onto said substrate.

26. An apparatus according to claim 23, wherein said first device includes a first stop having an off-axis aperture and a second stop having an on-axis aperture, and places one of said first and second stops determined in accordance with a pattern of said mask into said illumination optical system so that the intensity distribution on said pupil plane of said projection optical system is changed.

27. A projection exposure apparatus comprising:
an illumination optical system disposed between a light source and a mask, that forms a secondary light source with light from the light source to illuminate the mask with light from the secondary light source, the illumination optical system including a first optical device that changes a shape of the secondary light source in accordance with a pattern of the mask, and a second optical device disposed between the light source and the first optical device to change an intensity distribution of light incident on the first optical device from the light source in response to the changed shape of the secondary light source;
a projection optical system having a plurality of optical elements disposed between the mask and a substrate along an optical axis to project an image of the illuminated mask on the substrate; and
an adjusting system having an actuator provided with the projection optical system to move at least one of the plurality of optical elements, that adjust an aberration of the projection optical system in accordance with the changed shape of the secondary light source.

28. An apparatus according to claim 27, wherein said adjusting system makes said actuator move at least two of said optical elements of said projection optical system to adjust a magnification and an aberration other than a spherical aberration of said projection optical system.

29. A projection exposure apparatus comprising:
an illumination optical system disposed between a light source and a mask, said illumination optical system changing a shape of a secondary light source in accordance with a pattern of the mask so that said mask is illuminated with light form the secondary light source of which shape is changed, said illumination optical system including an optical device having a plurality of first stops different from each other in shape for defining said secondary light source, one of said plurality of first stops being selected in accordance with said pattern;

a projection optical system having a plurality of optical elements disposed between the mask and a substrate along an optical axis to project an image of the illuminated mask on the substrate, said projection optical system including a second stop for changing a numerical aperture thereof; and a detection system for detecting a changing amount of an image plane of said projection optical system along said optical axis caused by a change in at least one of the shape of said secondary light source, the numerical aperture of said projection optical system and the pattern of said mask.

30. An apparatus according to claim 29, further comprising:

a compensation system for moving said image plane and said substrate relatively along said optical axis based on the detected changing amount.

31. An apparatus according to claim 29, wherein said detection system includes a photodetector for receiving a light beam generated from a reference pattern through said projection optical system, and obtains a focal point of said projection optical system based on an output from said photodetector.

32. A projection exposure apparatus comprising:

a first illumination optical system for radiating first illumination light on a mask;

a projection optical system for imaging and projecting an image of a pattern of said mask on a photosensitive substrate;

a stage for holding said photosensitive substrate to be movable along a direction of an optical axis of said projection optical system;

a reference pattern formed on part of said stage;

a second illumination optical system for radiating second illumination light having a wavelength almost equal to that of the first illumination light on said reference pattern;

a photoelectric detector for receiving light generated by said reference pattern and passing through said projection optical system;

a focal position detection system for detecting a focal position of said projection optical system based on a detection signal from said photoelectric detector; and a light intensity distribution changing member capable of changing an intensity distribution of the second illumination light generated by said reference pattern in said projection optical system.

33. An apparatus according to claim 32, wherein said light intensity distribution changing member includes an optical member, arranged in said second illumination optical system, for changing an illumination condition of the second illumination light for said reference pattern, so that an intensity distribution of the first illumination light passing through said mask is set almost equal to the intensity distribution of the second illumination light generated by said reference pattern.

34. An apparatus according to claim 32, wherein said light intensity distribution changing member includes an optical member capable of changing a formation condition of said reference pattern, so that an intensity distribution of the first illumination light passing through said mask is set almost equal to an intensity distribution of the second illumination light generated by said reference pattern.

35. A projection exposure apparatus comprising:

an illumination optical system for radiating illumination light having a predetermined wavelength on a mask;

a projection optical system for projecting an image of a pattern of said mask on a photosensitive substrate;

a first correcting member for correcting an imaging characteristic of said projection optical system in accordance with a change amount of the imaging characteristic which is calculated in accordance with a predetermined operation parameter so as to maintain the imaging characteristic of said projection optical system to a predetermined value during exposure of said photosensitive substrate;

a measuring system for radiating, on a reference mark, light having the same wavelength as that of the illumination light or light having a wavelength range near that of the illumination light, receiving light emerging from said reference mark and passing through said projection optical system, and measuring the imaging characteristic of said projection optical system, said measuring system measuring the imaging characteristic per unit time after the exposure of said photosensitive substrate is started; and a second correcting member for correcting the operation parameter based on at least one imaging characteristic measured by said measuring system within the predetermined period of time after exposing said photosensitive substrate for a predetermined period of time, and before correcting the operation parameter, correcting a correction operation of the imaging characteristics of said first correcting member in accordance with a measured imaging characteristic every time the imaging characteristic is measured by said measuring system, so as to obtain an almost zero correction error of the imaging characteristic from said first correction member.

36. An apparatus according to claim 35, further comprising:

a changing member for changing a light amount distribution of the illumination light within a Fourier transform plane or a plane near the Fourier transform plane for the pattern of said mask in said projection optical system; and wherein after the light amount distribution is changed by said changing member, said second correcting member corrects the operation parameter when an influence of the light amount distribution of a noncorrected imaging characteristic of said projection optical system is eliminated.

37. A projection exposure apparatus comprising:

a first illumination optical system for radiating first illumination light on a mask;

a projection optical system for imaging and projecting an image of a pattern of said mask on a photosensitive substrate;

a stage for holding said photosensitive substrate to be movable along a direction of an optical axis of said projection optical system;

a reference pattern formed on part of said stage;

a second illumination optical system for radiating second illumination light having a wavelength almost equal to that of the first illumination light on said reference pattern;

a photoelectric detector for receiving light generated by said reference pattern and passing through said projection optical system;

a focal position detecting system for detecting a focal position of said projection optical system based on a detection signal from said photoelectric detector;

a light intensity distribution changing member capable of changing an intensity distribution of the second illumination light generated by said reference pattern in said projection optical system;

a measuring system for measuring an intensity distribution of the first illumination light passing through said mask in said projection optical system; and a controller for controlling said intensity distribution changing member to match the intensity distribution of the second illumination light generated from said reference pattern in said projection optical system with the measured intensity distribution of the first illumination light.

38. An apparatus according to claim 37, wherein said intensity distribution changing member comprises a member for changing an illumination condition of the second illumination light and a pattern changing member for changing a geometric shape of the reference pattern, and said controller controls at least one of said member for changing the illumination condition of the second illumination light and said pattern changing member.

39. A method of measuring an imaging characteristic of a projection optical system projecting a pattern image of a mask illuminated with a first illumination light onto a photo-sensitive substrate, comprising:

adjusting, substantially at a pupil plane of said projection optical system, a light intensity distribution of a second illumination light generated from a reference pattern, having a wavelength which is substantially the same as that of the first illumination light, in accordance with a change of a light intensity distribution of the first illumination light passing through said mask, substantially on the pupil plane of said projection optical system; and receiving the second illumination light of which the light intensity distribution is adjusted and which passes through said projection optical system, whereby the imaging characteristic of said projection optical system is detected.

40. A method according to claim 39, further comprising measuring the changed light intensity distribution of the first illumination light, prior to the adjustment of the light intensity distribution of the second illumination light.

41. A method according to claim 39, further comprising changing at least one of a shape and a size of a secondary light source of an optical system for illuminating the reference pattern in order to adjust the light intensity distribution of the second illumination light.

42. A method of measuring an imaging characteristic of a projection optical system projecting a pattern image of a mask illuminated with a first illumination light onto a photo-sensitive substrate, comprising:

measuring a light intensity distribution of the first illumination light passing through said mask, substantially on a pupil plane of said projection optical system;

illuminating a reference pattern with a second illumination light having a wavelength which is substantially the same as that of the first illumination light, and receiving the light generated from said reference pattern and passing through said projection optical system, thereby to detect the imaging characteristic of said projection optical system; and correcting the detection result on the basis of the measured light intensity distribution.

43. A method according to claim 42, wherein the light intensity distribution of said first illumination light is measured at every change of a light intensity distribution of a secondary light source for illuminating said mask.

44. A method of measuring an imaging characteristic of a projection optical system projecting a pattern image of a mask onto a photo-sensitive substrate, comprising:

adjusting a shape of a secondary light source of a second optical system for illuminating a reference pattern, in accordance with a change of shape of a secondary light source of a first optical system for illuminating said mask; and illuminating said reference pattern with light from the adjusted secondary light source, and receiving light generated from said reference pattern and passing through said projection optical system, thereby to detect the imaging characteristic of said projection optical system.

45. A method of exposing a photo-sensitive substrate with a pattern image of a mask projected by a projection optical system comprising:

correcting an allowable value of a heat accumulation amount of said projection optical system or a change amount of an imaging characteristic of said projection optical system in accordance with a change of a light intensity distribution of an illumination light passing through said mask substantially on a pupil plane of said projection optical system; and controlling a start and a stop of an exposure operation to said substrate based on the corrected allowable value.

46. A method according to claim 45, further comprising changing a light intensity distribution of a secondary light source of an illumination optical system for illuminating said mask.

47. A method according to claim 45, further comprising:

moving at least two optical elements of said projection optical system to adjust a magnification and at least one of a curvature of the field, a distortion, and an astigmatism of said projection optical system based on the heat accumulation amount of said projection optical system or the change amount of the imaging characteristic.

48. A method according to claim 47, wherein the allowable value of said change amount with respect to an aberration of said projection optical system other than at least one of the curvature of the field, the distortion and the astigmatism is corrected to control the exposure operation of said photo-sensitive substrate.

49. A method of exposing a photo-sensitive substrate with a pattern image of a mask projected by a projection optical system comprising:

changing a light intensity distribution of an illumination light passing through said mask, substantially on a pupil plane of said projection optical system; and measuring an imaging characteristic of said projection optical system within a predetermined time after a change, to adjust the imaging characteristic in accordance with the measurement result, and correcting a parameter for calculating a change amount of the imaging characteristic based on the measurement result after a predetermined time lapse, to adjust the imaging characteristic in accordance with the corrected parameter.

50. A method according to claim 49, wherein the light intensity illumination of said illumination light is changed by changing a light intensity distribution of a secondary light source of an illumination optical system for illuminating said mask.

51. A method of exposing a substrate with a pattern of a mask through a projection optical system, comprising the steps of:

changing a shape of a secondary light source in accordance with the pattern of the mask to illuminate the mask with light from the secondary light source of which the shape is changed;

moving at least two of a plurality of optical elements of the projection optical system in accordance with the changed shape of the secondary light source to adjust magnification and an aberration of the projection optical system; and projecting light from the illuminated mask on the substrate through the projection optical system of which magnification and the aberration are adjusted.

52. A method according to claim 51, wherein at least two optical elements of said projection optical system in the vicinity of said mask are moved to adjust a magnification and an aberration other than a spherical aberration of said projection optical system.

53. A method of exposing a substrate with a pattern of a mask through a projection optical system, comprising the steps of:

placing one of a plurality of stops different from each other in shape between an optical integrator and said mask to change a shape of a secondary light source in accordance with a pattern of said mask so that said mask is illuminated with light from said secondary light source of which shape is changed;

moving an image plane of said projection optical system and said substrate relatively along an optical axis to compensate a changing amount of said image plane of said projection optical system along said optical axis caused by a change in shape of said secondary light source; and exposing said substrate with light generated from the illuminated mask through said projection optical system.

54. A method according to claim 53, wherein said plurality of stops includes a first stop having an off-axis aperture and a second stop having an on-axis aperture, and one of said first and second stops is selected in accordance with information concerning said pattern formed on said mask.

55. A method of exposing a substrate, through a projection optical system, with illumination light irradiated on a mask by an illumination optical system, comprising:

changing an intensity distribution of said illumination light on a Fourier transform plane with respect to a pattern surface of said mask in said illumination optical system by change of a stop to define the intensity distribution and movement of an optical element of the illumination optical system to define a distribution of said illumination light on the stop;

moving at least two optical elements of said projection optical system based on the changed intensity distribution in order to adjust a specific aberration and a magnification of said projection optical system; and projecting said illumination light onto said substrate through said projection optical system of which said at least two optical elements are moved.

56. A method according to claim 55, wherein said specific aberration includes at least one of curvature of field, distortion, and astigmatism of said projection optical system.

* * * * *